(12) United States Patent
Amos et al.

(10) Patent No.: US 11,653,472 B2
(45) Date of Patent: *May 16, 2023

(54) HEAT SINK, HEAT SINK ARRANGEMENT AND MODULE FOR LIQUID IMMERSION COOLING

(71) Applicant: ICEOTOPE GROUP LIMITED, South Yorkshire (GB)

(72) Inventors: David Amos, South Yorkshire (GB); Neil Edmunds, South Yorkshire (GB); Andrew Young, South Yorkshire (GB); Jasper Kidger, South Yorkshire (GB); Nathan Longhurst, South Yorkshire (GB)

(73) Assignee: ICEOTOPE GROUP LIMITED, South Yorkshire (GB)

( * ) Notice: Subject to any disclaimer, the term of this patent is extended or adjusted under 35 U.S.C. 154(b) by 0 days.

This patent is subject to a terminal disclaimer.

(21) Appl. No.: 17/678,387

(22) Filed: Feb. 23, 2022

(65) Prior Publication Data

US 2022/0256734 A1   Aug. 11, 2022

Related U.S. Application Data

(63) Continuation of application No. 17/354,769, filed on Jun. 22, 2021, now Pat. No. 11,369,040, which is a
(Continued)

(30) Foreign Application Priority Data

Sep. 6, 2017 (GB) ...................... 1714304
Sep. 6, 2017 (GB) ...................... 1714308
(Continued)

(51) Int. Cl.
*H05K 7/20*      (2006.01)
*H01L 23/367*    (2006.01)
*H01L 23/473*    (2006.01)

(52) U.S. Cl.
CPC ..... *H05K 7/20236* (2013.01); *H01L 23/3677* (2013.01); *H01L 23/473* (2013.01);
(Continued)

(58) Field of Classification Search
CPC .......... H05K 7/20236; H05K 7/20254; H05K 7/20272; H05K 7/20772; H01L 23/367;
(Continued)

(56) References Cited

U.S. PATENT DOCUMENTS 3,406,244 A * 10/1968 Oktay ................... H05K 7/203
                                                    174/15.1
5,168,348 A    12/1992 Chu
(Continued)

FOREIGN PATENT DOCUMENTS

CN   104779227 B   7/2015
GB   1517650 A    7/1978
(Continued)

OTHER PUBLICATIONS

Copending U.S. Appl. No. 17/354,769.*
(Continued)

*Primary Examiner* — Zachary Pape
(74) *Attorney, Agent, or Firm* — Butzel Long

(57) ABSTRACT

Heat sink and heat sink arrangements are provided for an electronic device immersed in a liquid coolant. A heat sink may comprise: a base for mounting on top of a heat-transmitting surface of the electronic device and transferring heat from the heat-transmitting surface; and a retaining wall extending from the base and defining a volume. A heat sink may have a wall arrangement to define a volume, in which
(Continued)

the electronic device is mounted. A heat sink may be for an electronic device to be mounted on a surface in a container, in an orientation that is substantially perpendicular to a floor of the container. Heat is transferred from the electronic device to liquid coolant held in the heat sink volume. A cooling module comprising a heat sink is also provided. A nozzle arrangement may direct liquid coolant to a base of the heat sink.

4 Claims, 44 Drawing Sheets

Related U.S. Application Data continuation of application No. 16/645,166, filed as application No. PCT/GB2018/052526 on Sep. 6, 2018, now Pat. No. 11,096,313.

(30) Foreign Application Priority Data

Sep. 6, 2017 (GB) ...................................... 1714313
Jun. 13, 2018 (GB) ...................................... 1809681

(52) U.S. Cl.
CPC ..... *H05K 7/20772* (2013.01); *H05K 7/20254* (2013.01); *H05K 7/20272* (2013.01)

(58) Field of Classification Search
CPC ... H01L 23/3677; H01L 23/44; H01L 23/473; H01L 23/4735
See application file for complete search history.

(56) References Cited

U.S. PATENT DOCUMENTS

| | | | |
|---|---|---|---|
| 5,270,572 A | 12/1993 | Nakajima |
| 5,491,363 A | 2/1996 | Yoshikawa |
| 6,205,799 B1 | 3/2001 | Patel |
| 7,477,513 B1 | 1/2009 | Cader |
| 7,866,173 B2 | 1/2011 | Brunschwiler |
| 7,916,483 B2 | 3/2011 | Campbell |
| 8,944,151 B2 | 2/2015 | Flotta |
| 9,313,931 B2 | 4/2016 | Goth |
| 10,390,458 B2 | 8/2019 | Tufty |
| 10,609,839 B1 | 3/2020 | Archer |
| 10,888,032 B2 | 1/2021 | Wakino |
| 2002/0186538 A1 | 12/2002 | Kase |
| 2004/0182544 A1 | 9/2004 | Lee |
| 2006/0007656 A1 | 1/2006 | Symons |
| 2010/0103614 A1 | 4/2010 | Campbell |
| 2010/0103620 A1 | 4/2010 | Campbell |
| 2011/0149517 A1 | 6/2011 | Uluc |
| 2012/0170222 A1 | 7/2012 | Dede |
| 2014/0146468 A1 | 5/2014 | Campbell |
| 2015/0109728 A1 | 4/2015 | Campbell |
| 2017/0177041 A1 | 6/2017 | Shelnutt |
| 2017/0348706 A1 | 12/2017 | Valiyambath Krishnan |
| 2018/0027695 A1 | 1/2018 | Wakino |

FOREIGN PATENT DOCUMENTS

| | | |
|---|---|---|
| JP | H0273657 A | 3/1990 |
| JP | H04196155 A | 7/1992 |
| JP | H05251600 A | 9/1993 |
| JP | H05275587 A | 10/1993 |
| JP | 2014183260 A | 9/2014 |
| WO | 2016076882 A1 | 5/2016 |

OTHER PUBLICATIONS

Search Report for Application No. GB1714304.1, dated Mar. 6, 2018, 5 pages.
Search Report for Application No. GB1714308.2, dated Mar. 6, 2018, 5 pages.
Search Report for Application No. GB1714313.2, dated Mar. 6, 2018, 4 pages.
Search Report for Application No. GB1809681.8, dated Nov. 23, 2018, 4 pages.
International Search Report and Written Opinion for Application No. PCT/GB2018/052526, dated Dec. 12, 2018, 16 pages.
Taiwanese Search Report issued in App. No. TW107131329, dated Apr. 22, 2022, 7 pages.

* cited by examiner

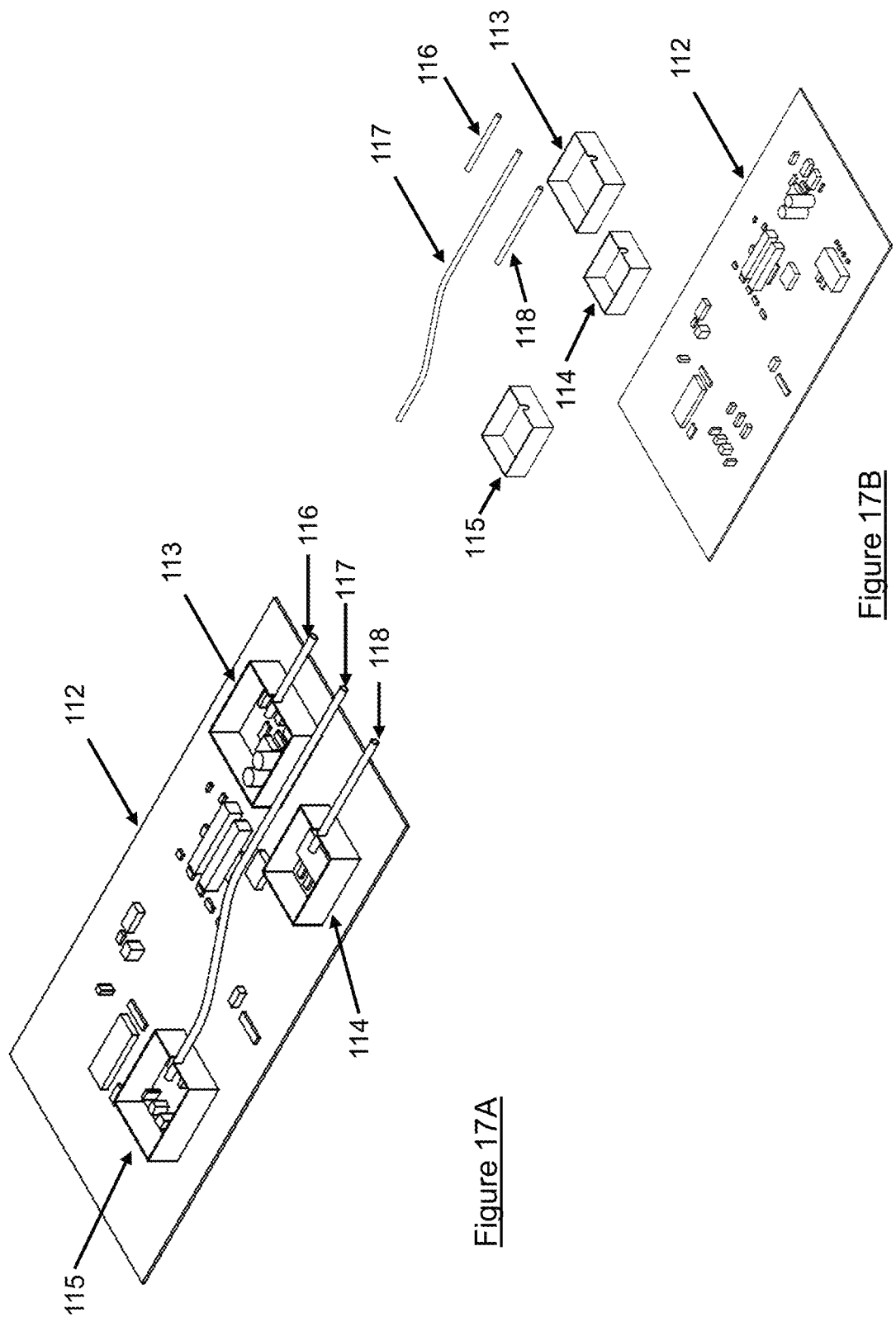

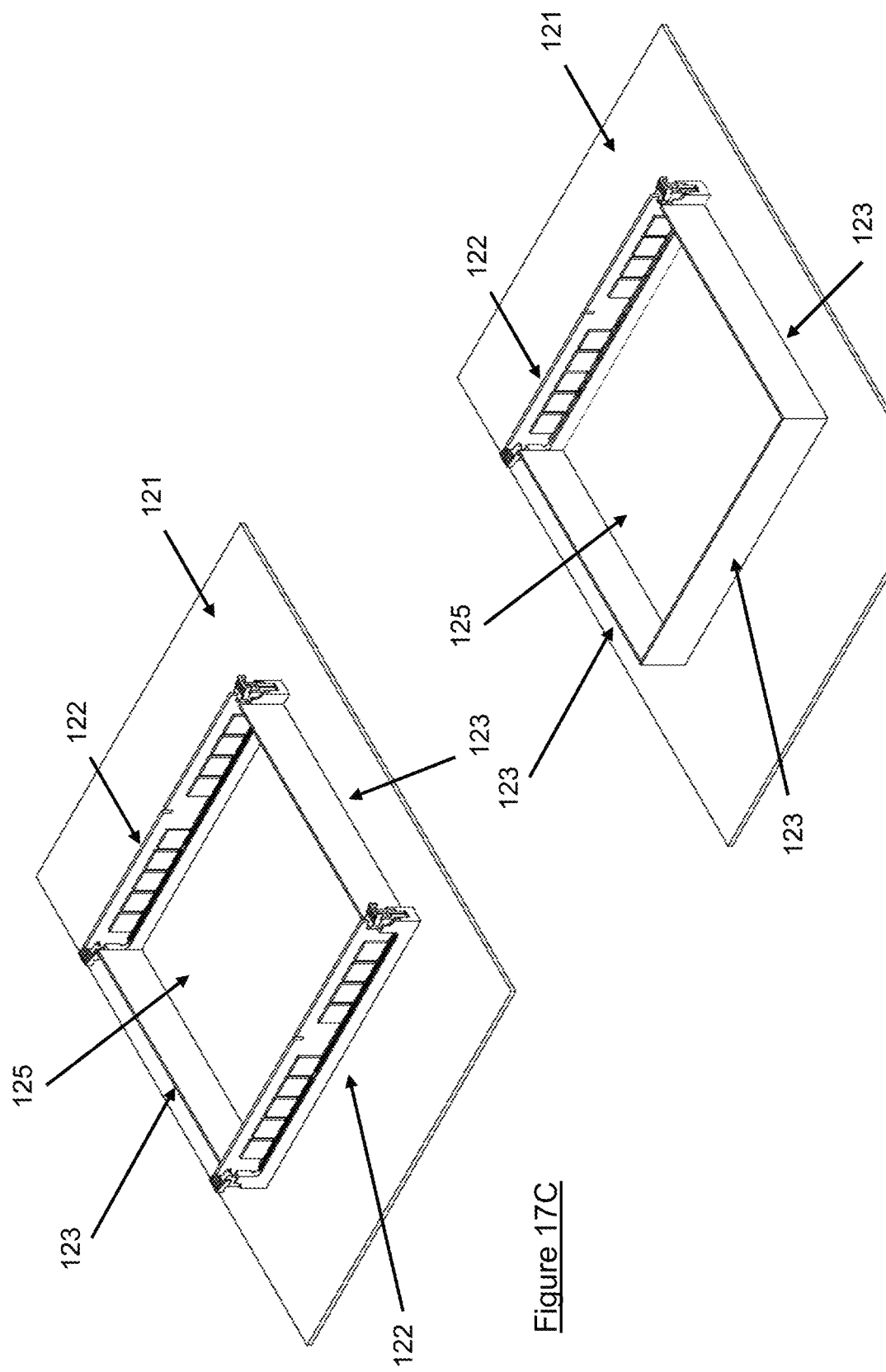

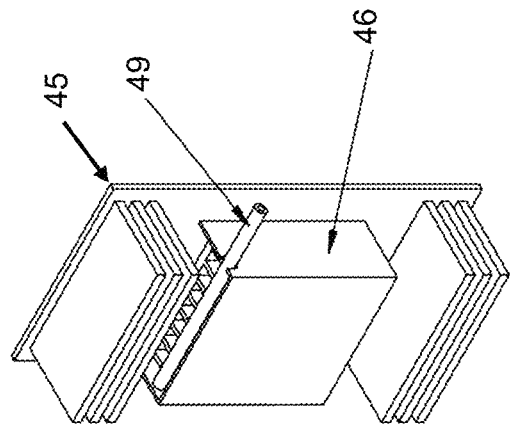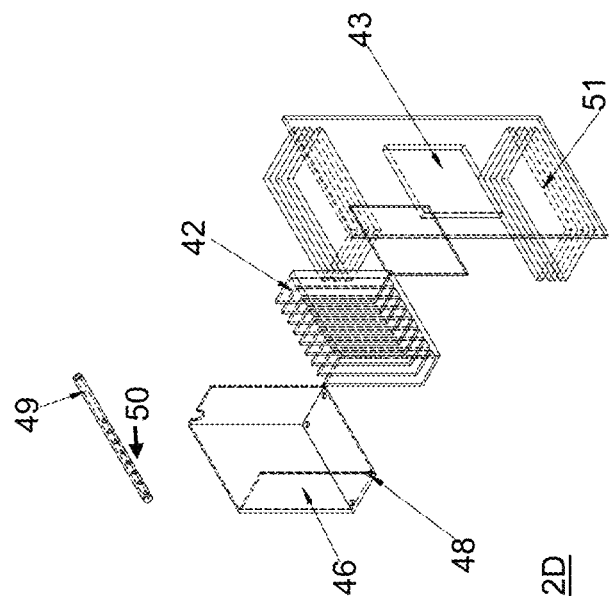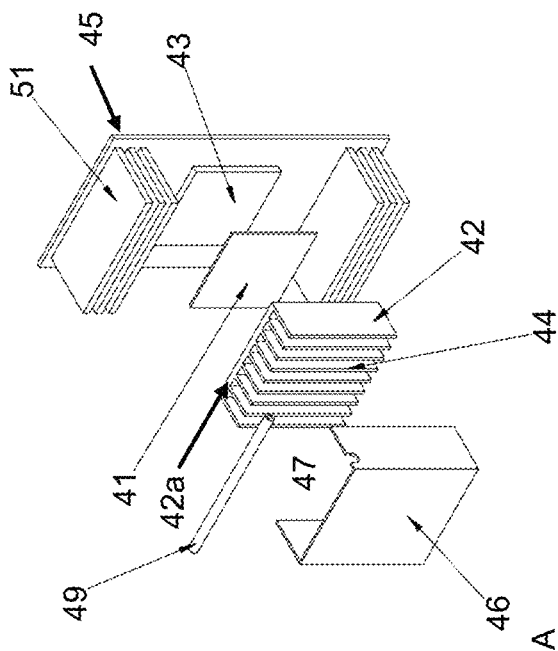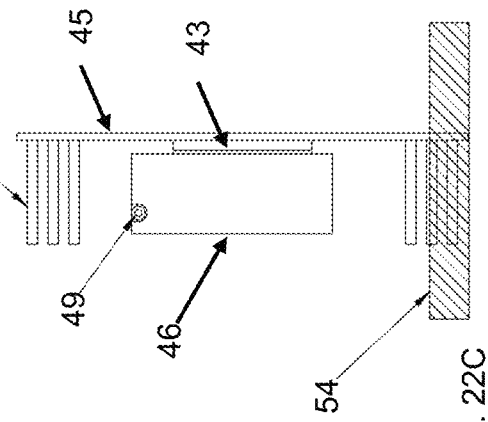
Fig. 22A
Fig. 22B
Fig. 22C
Fig. 22D

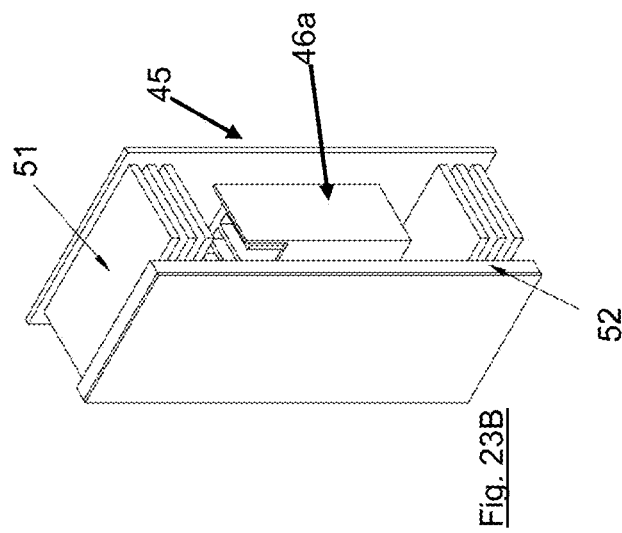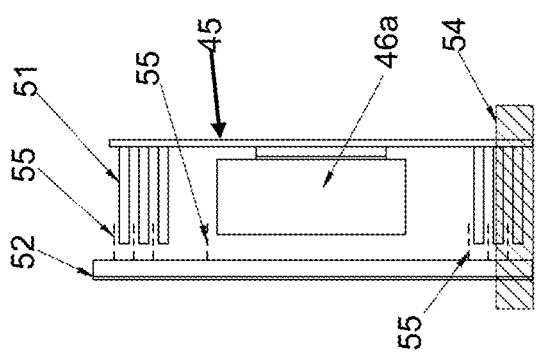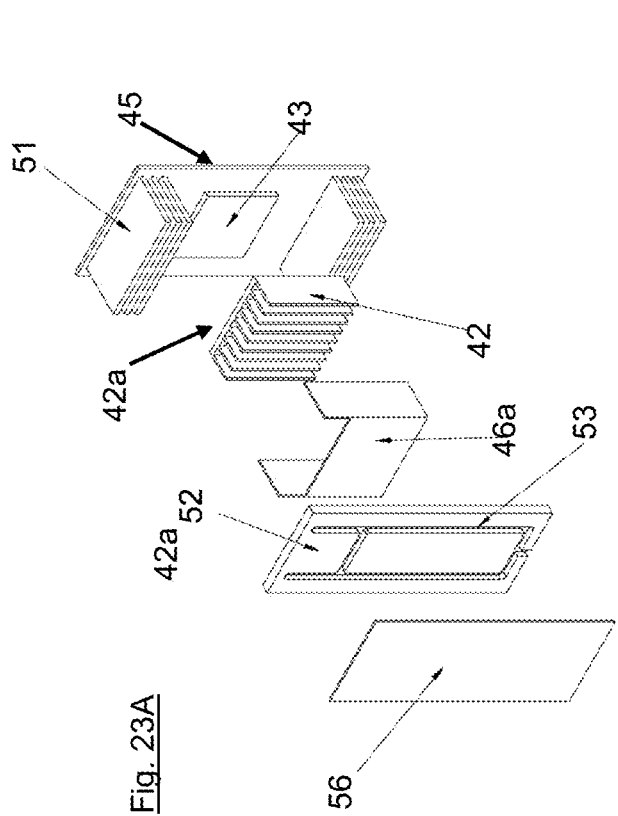

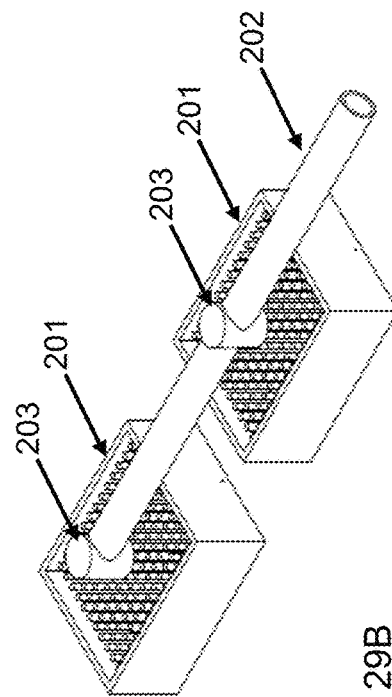
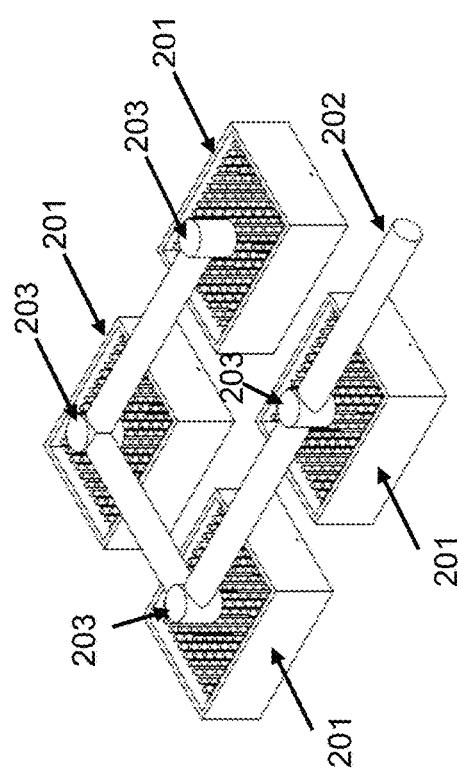
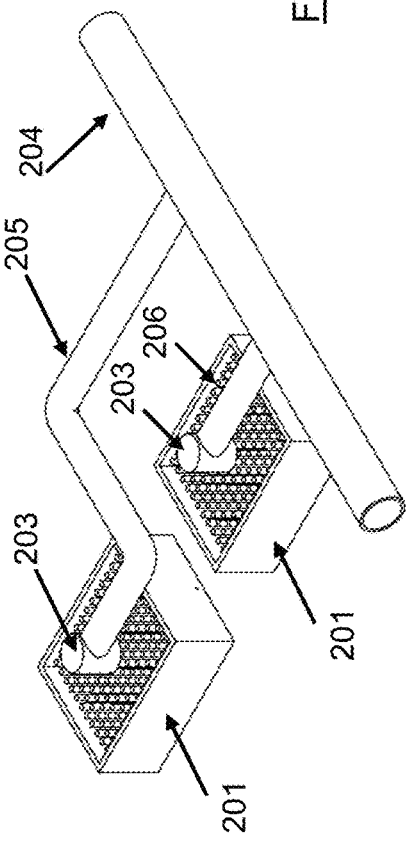
Figure 29B
Figure 29A
Figure 29C

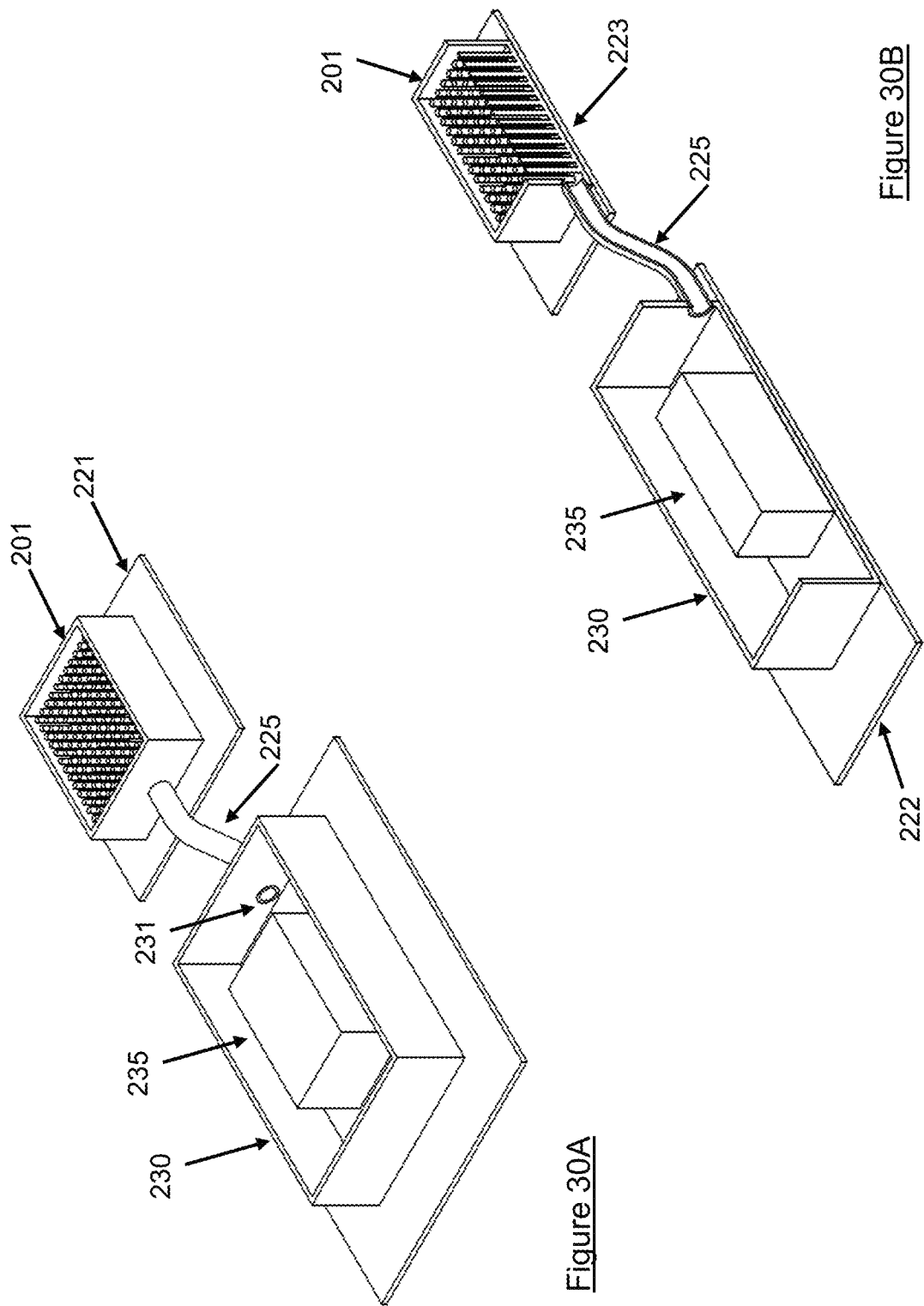

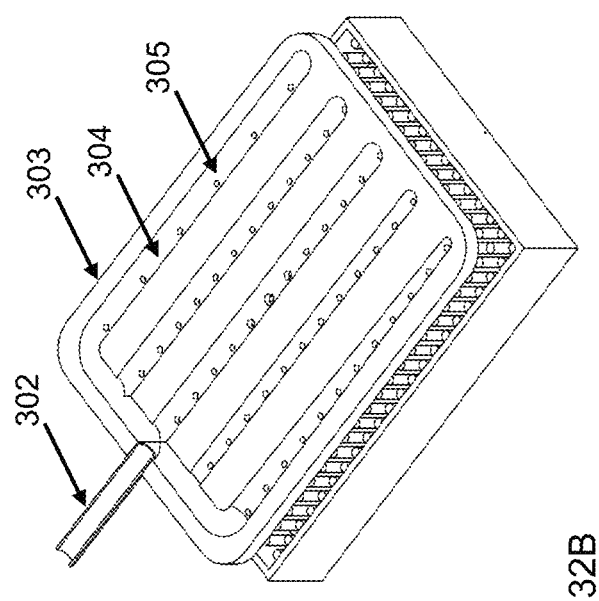
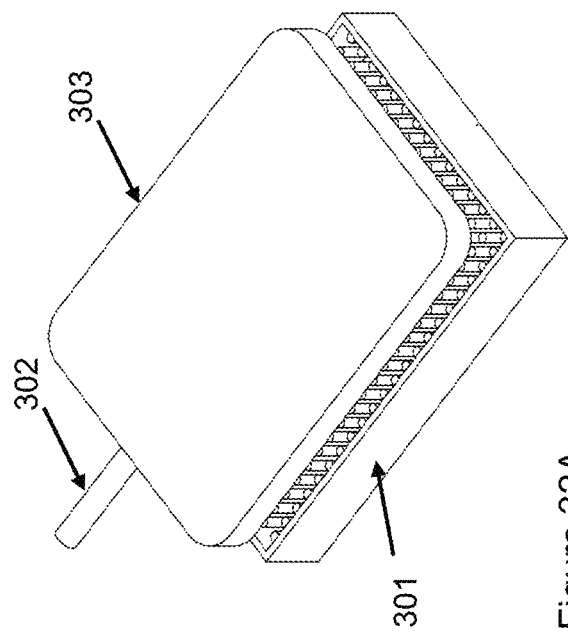
Figure 32A
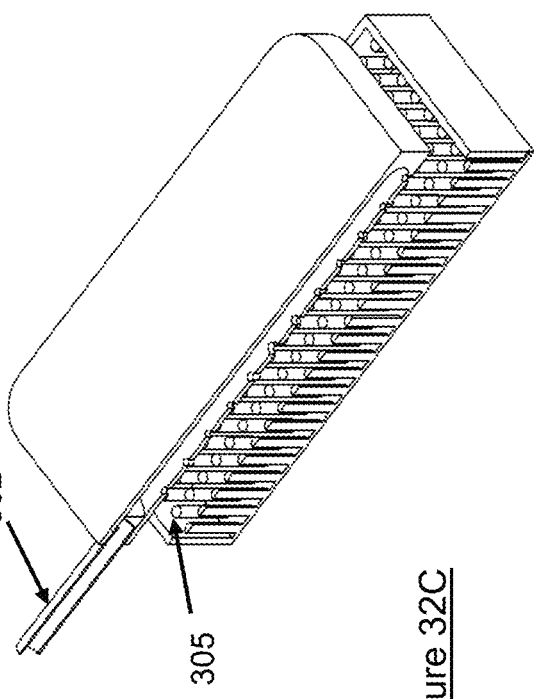
Figure 32B
Figure 32C

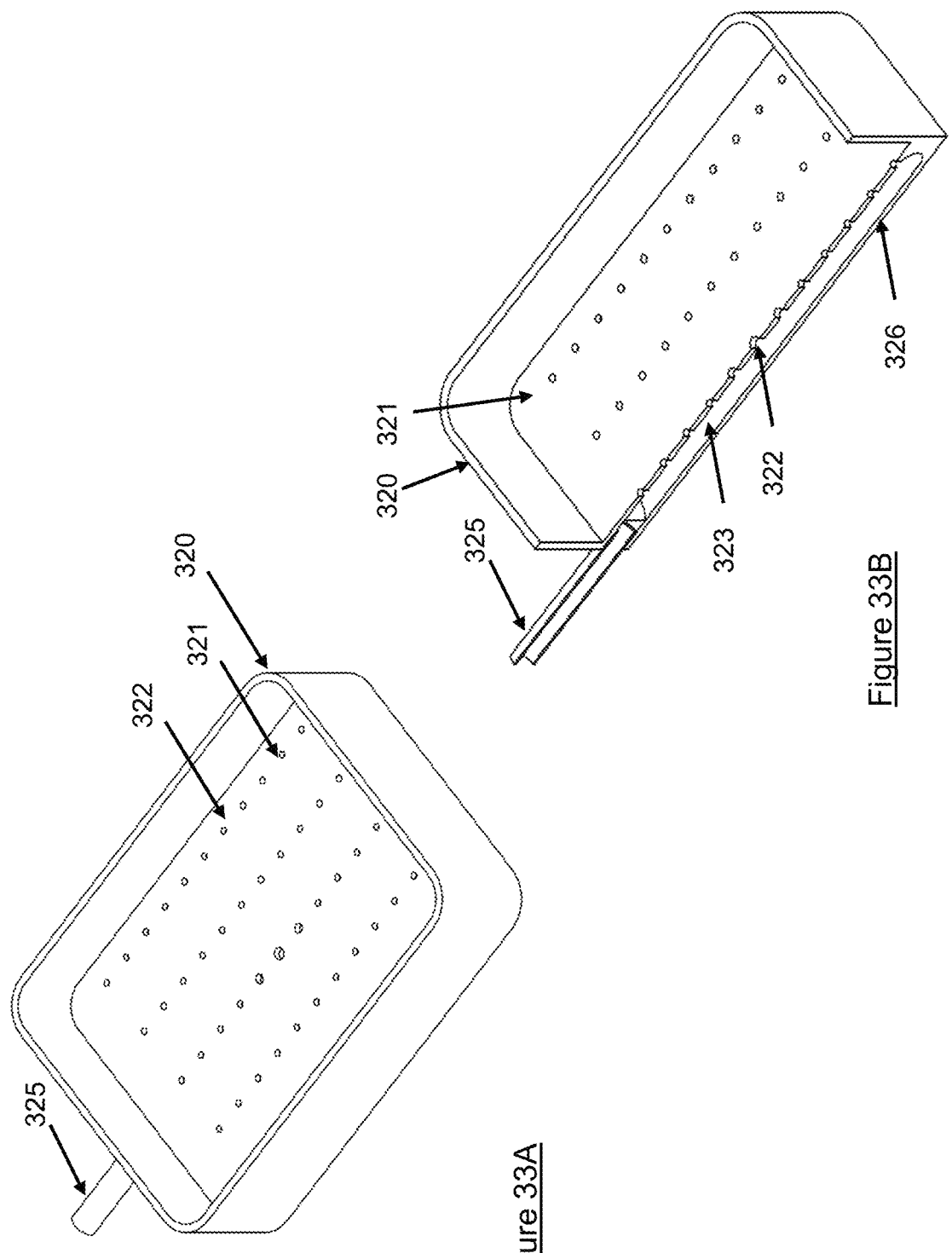

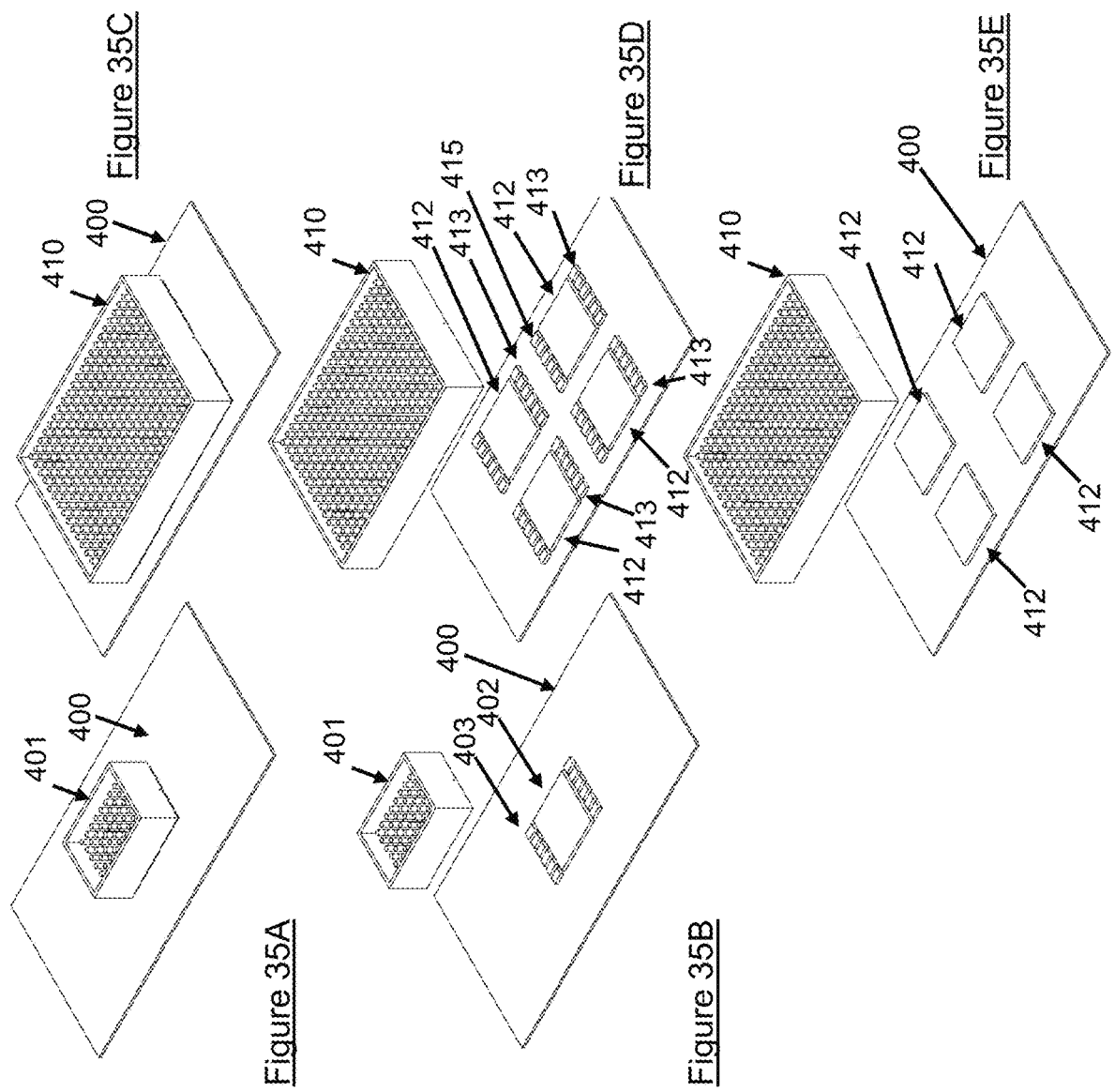

HEAT SINK, HEAT SINK ARRANGEMENT AND MODULE FOR LIQUID IMMERSION COOLING

TECHNICAL FIELD OF THE INVENTION

The disclosure concerns heat sinks for an electronic device immersed in a liquid coolant, a cooling module for the electronic device comprising one or more such heat sinks, a cooling module allowing an electronic device to be immersed in a liquid coolant.

BACKGROUND TO THE INVENTION

Many types of electrical component generate heat during operation. In particular, electrical computer components such as motherboards, central processing units (CPUs) and memory modules may dissipate substantial amounts of heat when in use. Heating of the electrical components to high temperatures can cause damage, affect performance or cause a safety hazard. Accordingly, substantial efforts have been undertaken to find efficient, high performance systems for cooling electrical components effectively and safely.

One type of cooling system uses liquid cooling. Although different liquid cooling assemblies have been demonstrated, in general the electrical components are immersed in a coolant liquid so as to provide a large surface area for heat exchange between the heat generating electrical components and the coolant.

U.S. Pat. No. 7,905,106 describes a liquid submersion cooling system that cools a number of electronic devices within a plurality of cases connected to a rack system. A housing is filled with a dielectric cooling liquid with heat generating electronic components submerged in the dielectric cooling liquid. The rack system contains a manifold that allows liquid transfer for multiple cases and a pump system for pumping the dielectric cooling liquid into and out of the rack. External heat exchangers allow the heated dielectric cooling liquid to be cooled before being returned to the rack. In areas where there is significant heat, directed liquid flow is used to provide localized cooling. A plurality of tubes extend from a manifold to direct the dielectric cooling liquid to specific targeted hot spots. The ends of the tubes are positioned adjacent the desired hot spots or the tubes can connect to dispersion plenums to help direct the flow of the return liquid to the targeted hot spots. Directing or focusing of the cooling fluid within each case is thereby done at the expense of other components, which may not be cooled as effectively. Moreover, the heat-carrying capacity of the liquid coolant may not be used efficiently. For these reasons, this technique requires a significant quantity of dielectric cooling fluid to be pumped into and out of each case in the rack.

In U.S. Pat. No. 8,305,759, dielectric liquid is used to cool heat-generating electronic components disposed on a circuit board within a case. The liquid is poured or otherwise directed over the electronic components, with gravity assisting the liquid in flowing downward over the components, with the liquid thereafter being collected in a sump for eventual return back to the electronic components. Plenums disposed over the electronic component are provided, to contain the liquid as it flows over the electronic component. This is intended to make more of the liquid contact the component, thereby enhancing the effectiveness of the liquid cooling. Again, this requires a significant quantity of dielectric cooling liquid and relies on gravity-assistance, which can make the system less flexible and introduce other design constraints that may cause the system to be less efficient.

U.S. Pat. No. 8,014,150 describes the cooling of electronic modules in which a cooling apparatus is coupled to a substrate to form a sealed component around an electronic device. Pumps are located within the sealed compartment so that dielectric fluid is pumped towards the electronic device. Cooling occurs by changing the phase of the dielectric fluid from liquid to vapour, which then is caused to condense as it rises towards a liquid-cooled cold plate that is fed by a second fluid. However, this cooling system requires high pressure seals and multiple cooling compartments within a case and so relatively complicated plumbing arrangements for the second cooling fluid.

A more efficient way to use liquid coolant for cooling electronic systems is therefore desired.

SUMMARY OF THE INVENTION

Against this background, there is generally provided a heat sink for cooling a heat-generating electronic device (example are discussed below). The heat sink is designed for use in a cooling module, in which the electronic device is to be partially or fully immersed in a liquid coolant. It provides a volume for holding or retaining liquid coolant against the heat-generating electronic device, for example resembling a bath or reservoir. Coolant may then be pumped from a low-level within the cooling module to within the volume of the heat sink, at a higher level. A number of different structures and embodiments of a heat sink and/or cooling module in accordance with this design are discussed herein.

In a first aspect, there is provided a heat sink for an electronic device immersed in a liquid coolant and a cooling module for an electronic device as defined herein.

A heat sink is mountable on a heat-generating electronic device, such as an integrated circuit, computer processor or other electronic component (which generates heat when electrical power is supplied to it in normal operation). The heat sink is designed for use in a cooling module, in which the electronic device is to be immersed in a liquid coolant. It provides a volume for holding or retaining liquid coolant against the heat-generating electronic device, for example resembling a bath tub or reservoir. In this way, the liquid coolant can be applied more effectively to the place or places where the most heat is generated. Less coolant can therefore be used. Since the coolant is expensive and heavy, reducing the quantity of coolant can improve flexibility, efficiency and reliability (for example, since coolant leakages are less likely and because the coolant in the volume can resist instant temperature changes caused by the failure of other components in the system).

A cooling module for an electronic device has a container, housing the electronic device such that the electronic device can be (at least partially) immersed in the liquid coolant, with the heat sink of the first aspect as disclosed herein, mounted on the electronic device. In some embodiments, the electronic device is planar or mounted on a planar circuit board and the cooling module is configured to be operated such that the plane of the electronic device and/or circuit board is horizontal. The container may be elongated in accordance with the plane of the electronic device and/or circuit board, for example having a shape to match that of the electronic device and/or circuit board.

In respect of such a heat sink, the volume for holding or retaining the liquid coolant can be defined by a base and a retaining wall (which may be integral or separate). The base is the part of the heat sink mounted on top of the electronic device (more specifically, a heat-transmitting surface of the electronic device) and transfers heat from the heat-transmitting surface. The base typically has a planar surface defining the volume (and the base itself may be planar in shape). Heat transferred (typically conducted) through the base (in particular its surface defining the volume) is transferred to the liquid coolant held in the volume. The retaining wall extends from the base.

One effect of this type heat sink is to raise the level of the coolant held within the heat sink's volume above that external the volume (for example when the cooling module is operated with the plane of the electronic device and/or circuit board horizontal and the quantity of coolant within the container of the cooling module is lower than the height of the retaining wall). This also reduces the quantity of coolant required.

Advantageously, the heat sink has projections (such as pins and/or fins) extending from the base (or less preferably, from the retaining wall) within the volume. These projections beneficially extend no further from the base (especially in the direction perpendicular from a plane of the base) as the retaining wall. This may ensure that coolant liquid submerges all the projections. More preferably, the projections extend to substantially the same distance from the base as the retaining wall. This may additionally avoid creating paths within the volume that might bypass the projections. The projections may cause the liquid coolant to spread in a radial direction away from a predetermined point on a surface of the base (for example coincident with a hottest part of the electronic device). In particular, the projections may be formed in a non-linear pattern.

The liquid coolant is advantageously caused to flow within the container, preferably by a pump as part of the cooling module, or less preferably by configuration of the cooling module (for example, to encourage convection). This may cause the liquid coolant to reach the volume of the heat sink. For example, a nozzle arrangement may further be provided, which receives flowing or pumped liquid coolant and directs it to the volume of the heat sink. The nozzle arrangement typically comprises one or more nozzles (which may be push-fit), each of which directs the flowing or pumped liquid coolant to a respective part of the volume of the heat sink, particularly a part of the heat sink's base. For instance, each nozzle may direct the flowing or pumped liquid coolant to a respective part of the volume of the heat sink adjacent a part of the heat-transmitting surface of the electronic device having a maximum temperature or a temperature above a threshold level (that is, one of the hottest parts of the device). Most preferably, the nozzle arrangement directs the flowing or pumped liquid coolant in a direction perpendicular to the base of the heat sink. This may force the coolant directly into the volume and improve heat dissipation.

In a second aspect, there is provided a cooling module for an electronic device as defined herein.

The cooling module is arranged such that the electronic device (such as an integrated circuit, computer processor, electronic component or circuit board) is immersed (at least partially) in a liquid coolant and a heat sink is provided on the electronic device. A nozzle is positioned to direct coolant to the heat sink, in particular to a base of the heat sink (the base being the part mounted on or configured for mounting on the electronic device to be cooled). In preferred embodiment, the nozzle causes the liquid coolant to flow in a direction perpendicular to the heat sink's base (and/or if the electronic device is planar, in a direction perpendicular to that plane).

The cooling module preferably comprises a container, housing the electronic device for cooling, such that the electronic device can be at least partially immersed in the liquid coolant. The heat sink comprises a base mounted on the electronic device. The nozzle is part of a nozzle arrangement. Advantageously, the liquid coolant is caused to flow within the container, preferably by a pump, as part of the cooling module. The nozzle arrangement may be arranged to receive flowing or pumped liquid coolant. The nozzle arrangement may allow the delivery of coolant directly to the hottest part of the heat sink and thereby may provide a contraflow.

Advantageously, the nozzle arrangement is arranged to direct the flowing or pumped liquid coolant to a part of the heat sink adjacent the hottest part of the electronic device. The nozzle arrangement beneficially comprises one or more nozzles. Then, each of the one or more nozzles may be configured to direct the flowing or pumped liquid coolant to a respective part of the heat sink. In some embodiments, the nozzle arrangement comprises a plurality of nozzles. Then, each nozzle may be configured to direct the flowing or pumped liquid coolant to a respective part of the heat sink adjacent a part of the electronic device having a temperature above a threshold level. The threshold level may be set based on the temperature of the hottest part of the electronic device, for example based on a percentage or in order to cool a certain number of hottest areas of the electronic device.

In the preferred embodiment, the cooling module further comprises: at least one pipe, arranged to transport liquid coolant (preferably from the pump, where one is provided) to the nozzle arrangement. Each of the one or more nozzles may then be configured to couple to a respective end of the at least one pipe. Preferably, the coupling is by push-fit. In other words, each nozzle may be push-fit coupled to a respective pipe end.

The liquid coolant may be a primary liquid coolant. Then, the cooling module may further comprise: a heat exchanger, configured to receive a secondary liquid coolant and to transfer heat from the primary liquid coolant to the secondary liquid coolant. The pump may be configured to cause the liquid coolant to flow to and/or from the heat exchanger. The nozzle arrangement is advantageously arranged to receive the primary liquid coolant from the heat exchanger. In this way, the coolant directed by the nozzle arrangement to the heat sink may be the coldest coolant. Then, it may beneficially be directed to the hottest part of the heat sink.

In a third aspect, there is provided a heat sink for an electronic device and a cooling module as detailed herein.

A heat sink may be provided for within a cooling module. The heat sink contains the electronic device (for instance, a power supply unit) and allows liquid coolant to accumulate around it. The electronic device is thereby immersed (at least partially) in the liquid coolant. The heat sink advantageously has a wall arrangement to define an internal volume, in which the electronic device is mounted. The liquid coolant thereby accumulates around the electronic device in operation, such that heat is transferred from the electronic device to the liquid coolant held in the internal volume.

The wall arrangement may be formed from: a base, configured for mounting the heat sink within the cooling module; and a retaining wall extending from the base. Then, the base and retaining wall may define the internal volume for accumulating the liquid coolant. The base and/or a surface of the base defining the internal volume is preferably planar.

A cooling module for an electronic device may comprise: a container, for housing the electronic device such that the electronic device can be at least partially immersed in a liquid coolant; and the heat sink of the third aspect of the disclosure, mounted in the container. The cooling module may be further configured for causing the liquid coolant to flow within the container, preferably using a pump. In addition, the cooling module may comprise at least one pipe, arranged to receive flowing or pumped liquid coolant and having an outlet, from which the flowing or pumped liquid coolant is directed into the internal volume of the heat sink.

The wall arrangement beneficially further defines a spout to allow or encourage the liquid coolant to flow out of the internal volume. This may (at least partially) define a direction of flow of the liquid coolant through the internal volume. Additionally or alternatively, the internal volume may be elongated in shape, thereby defining first and second end portions at opposite extremities of the elongated internal volume. The outlet of the pipe and the spout are advantageously located at the first and second end portions respectively.

In some embodiments, the outlet is located in an upper half of a height of the internal volume. In other embodiments, the outlet is located in a lower half of a height of the internal volume. The outlet of the pipe may comprise one or more nozzles. Then, each nozzle is preferably configured to direct the flowing or pumped liquid coolant to a respective part of the internal volume. Optionally, each of the one or more nozzles is configured to push fit couple to a respective end of the at least one pipe.

In a fourth aspect, there is provided a heat sink arrangement for an electronic device and a cooling module for an electronic device as defined herein.

The electronic device is to be mounted on a surface in a container and in an orientation that is substantially perpendicular to a floor of the container, the floor generally being a horizontal planar surface so that the orientation of the electronic device is substantially vertical. For example, the electronic device may be mounted on a printed circuit board and the printed circuit board may be oriented substantially perpendicular to the floor of the container (that is, generally vertically for a horizontal container floor). The printed circuit board can be a daughter board that is coupled to a motherboard, which may be oriented substantially parallel to the floor of the container. In other embodiments, the printed circuit board could be a motherboard and there may or may not be a further printed circuit board oriented substantially parallel to the floor of the container.

The heat sink arrangement has a retaining wall, configured to at least partially define an internal volume. The retaining wall cooperates (or is configured to cooperate) with the surface on which the electronic device is to be mounted (if the electronic component is mounted on a printed circuit board, this surface may be the printed circuit board) and/or a surface mounted on the electronic device (such as a plate) so that liquid coolant directed into the internal volume accumulates within the internal volume. This means that the internal volume may be defined by the retaining wall in cooperation with the surface on which the electronic device is to be mounted (in which case the internal volume may enclose the electronic device) and/or a surface mounted on the electronic device (in which case, the internal volume may be mounted adjacent and thermally coupled to the electronic device). These arrangements may permit heat to be transferred from the electronic device to the liquid coolant accumulated in the internal volume.

This may mean that the surface on which the electronic device is to be mounted and/or the surface mounted on the electronic device (referred to below as the one or both surfaces) cooperate with or form part of the heat sink arrangement. For example, the retaining wall may be attached and/or close (or sealed) enough to the surface on which the electronic device is to be mounted and/or the surface mounted on the electronic device to allow liquid to accumulate in the internal volume, although any seal between the retaining wall and the one or both surfaces need not be sufficient to prevent leakage (and in embodiments, no such seal may be required). Holes may be provided in the retaining wall for liquid coolant to pass through at a predefined rate. The retaining wall and the one or both surfaces preferably cooperate (or are configured to cooperate) such that the internal volume has at least one opening (as indicated above, which may be distal to the floor of the container or if provided in the form of holes, may be in a base part of the retaining wall) to allow liquid coolant accumulated within the internal volume to leave. The surface mounted on the electronic device may be part of (that is, integrated with) the electronic device.

The heat sink arrangement advantageously includes a nozzle arrangement, arranged to receive liquid coolant and direct the liquid coolant into the internal volume of the heat sink. In one embodiment, the nozzle arrangement is arranged to direct the liquid coolant from the open (top) side of the internal volume distal the floor of the container, for example, using a nozzle located towards the top of the internal volume.

Generally, the retaining wall defines a cuboid shaped internal volume. The internal volume as defined by the retaining wall alone may be open on one or both of two sides: a first side adjacent the electronic component; and a second side typically distal the floor of the container (a top side). Optionally, the retaining wall comprises a base part, oriented substantially parallel to the floor of the container. Then, one or more (typically three) sidewall parts may extend from the base part (in a direction substantially perpendicular to the floor of the container). In another sense, the retaining wall may be seen to comprise: a sidewall part, extending substantially parallel to the floor of the container; and a cover part, oriented substantially perpendicular to the floor of the container and arranged to fit with the sidewall part so as to define the internal volume. The sidewall part may be separable from the cover part. In certain embodiments, the retaining wall may comprise: a mounting plate, oriented substantially perpendicular to the floor of the container and arranged to fit with the sidewall part so as to define the internal volume. The mounting plate may be the surface mounted on the electronic device.

Projections (such as pins and/or fins) may extend into the internal volume from the retaining wall and/or a surface mounted on the electronic device (for example, a plate). A thermal interface material may be arranged between the electronic device and the surface mounted on the electronic device. The projections may extend in a direction perpendicular to a plane of the electronic device (when the electronic device is substantially planar) and/or parallel to the floor of the container. The projections may be arranged in a linear or a non-linear pattern. In some embodiments, the projections comprise one or more baffles, for directing the flow of liquid coolant within the internal volume. The baffles may cause the liquid coolant to flow (under gravity) first to a lower part of the internal volume and then to an upper part of the internal volume. Additionally or alternatively, the baffles may cause the liquid coolant to flow from a more central part of the internal volume to a more outer part of the internal volume (before leaving the internal volume). The baffles may cause the flow of liquid coolant to be split between two distinct flow paths (which may be generally symmetrical or asymmetrical).

In one embodiment, the nozzle arrangement comprises a piping system forming at least one channel for liquid coolant to flow therethrough. The at least one channel has one or more holes, each acting as a nozzle for directing liquid coolant from the channel into the internal volume of the heat sink. The channel is optionally oriented in a direction perpendicular to the floor of the container. The channel may be integrated within part of the retaining wall. Optionally, the piping system comprises first and second panels, one or both of the first and second panels being shaped to form the at least one channel. Then, the first and second panels may be attached to each other to allow liquid coolant to flow through the at least one channel.

A cooling module for an electronic device may comprise a container, having an internal surface defining the floor and defining a volume for housing the electronic component in an orientation that is substantially perpendicular to the floor. A heat sink arrangement of the fourth aspect as disclosed herein may be mounted within the volume of the container. In embodiments, the electronic device is mounted within the volume of the container. The nozzle arrangement may receive flowing liquid coolant and direct it to the internal volume of the heat sink arrangement. Optionally, the nozzle arrangement may direct the flowing liquid coolant to a part of the internal volume of the heat sink arrangement adjacent the hottest part of the electronic device. The nozzle arrangement may comprise a plurality of nozzles, each nozzle being configured to direct the flowing liquid coolant to a respective part of the internal volume of the heat sink arrangement adjacent a part of the electronic device having a temperature above a threshold level. A pump may be configured to cause the liquid coolant to flow within the container. At least one pipe may be arranged to transport liquid coolant from the pump to the nozzle arrangement. A single pipe (or a plurality of connected pipes) may transport liquid coolant to a first heat sink arrangement and from the first heat sink arrangement to a second heat sink arrangement (in a 'daisy-chain' or series linked arrangement).

In respect of any and all of the aspects disclosed herein, features of a method for manufacturing and/or operating corresponding with those of any one or more of the heat sinks and/or cooling modules disclosed may additionally be provided. Combinations of aspects are also possible. Moreover, combinations of specific features for one aspects with the heat sink and/or cooling module of another aspect are also disclosed, where such combinations are compatible. Specific examples of such combinations are suggested herein, by way of example.

BRIEF DESCRIPTION OF THE DRAWINGS

The invention may be put into practice in a number of ways and preferred embodiments will now be described by way of example only and with reference to the accompanying drawings, in which:

FIG. 17A depicts a perspective view of a cooling system incorporating a first variant of the embodiment of FIGS. 16 and 17;

FIG. 17B depicts an exploded view of the cooling system of FIG. 17A;

FIG. 17C depicts a second variant of the embodiment of FIGS. 16 and 17;

FIG. 17D depicts a modification of the second variant as shown in FIG. 17A;

FIG. 22A shows an exploded front view of a fourth embodiment of a heat sink arrangement in accordance with the disclosure;

FIG. 22B shows an assembled perspective view of the embodiment of FIG. 22A;

FIG. 22C shows an assembled side view of the embodiment of FIG. 22A;

FIG. 22D shows an exploded back view of the embodiment of FIG. 22A;

FIG. 23A shows an exploded front view of a fifth embodiment of a heat sink arrangement in accordance with the disclosure;

FIG. 23B shows an assembled perspective view of the embodiment of FIG. 23A;

FIG. 23C shows an assembled side view of the embodiment of FIG. 23A;

FIG. 29A depicts a perspective view of a first design with multiple heat sinks coupled to receive liquid coolant in series;

FIG. 29B illustrates a perspective view of a second design with multiple heat sinks coupled to receive liquid coolant in series;

FIG. 29C depicts a perspective view of a first design with multiple heat sinks coupled to receive liquid coolant in parallel;

FIG. 30A illustrates a perspective view of a design showing transfer of coolant from a first type of heat sink to a second type of heat sink;

FIG. 30B shows a section view of the design of FIG. 30A;

FIG. 32A illustrates a top perspective view of a heat sink with a variant nozzle arrangement;

FIG. 32B shows a top sectional view of the heat sink of FIG. 32A;

FIG. 32C shows a side sectional view of the heat sink of FIG. 32A;

FIG. 33A illustrates a perspective view of a heat sink with coolant introduction via its base;

FIG. 33B shows a side sectional view of the heat sink of FIG. 33A;

FIG. 35A illustrates a perspective view of a first design of a heat sink arrangement for cooling multiple devices;

FIG. 35B depicts an exploded view of the design of FIG. 35A;

FIG. 35C illustrates a perspective view of a second design of a heat sink arrangement for cooling multiple devices;

FIG. 35D depicts an exploded view of the design of FIG. 35C; and

FIG. 35E illustrates a perspective, exploded view of a third design of a heat sink arrangement for cooling multiple devices.

DETAILED DESCRIPTION OF PREFERRED EMBODIMENTS

Figure 1:
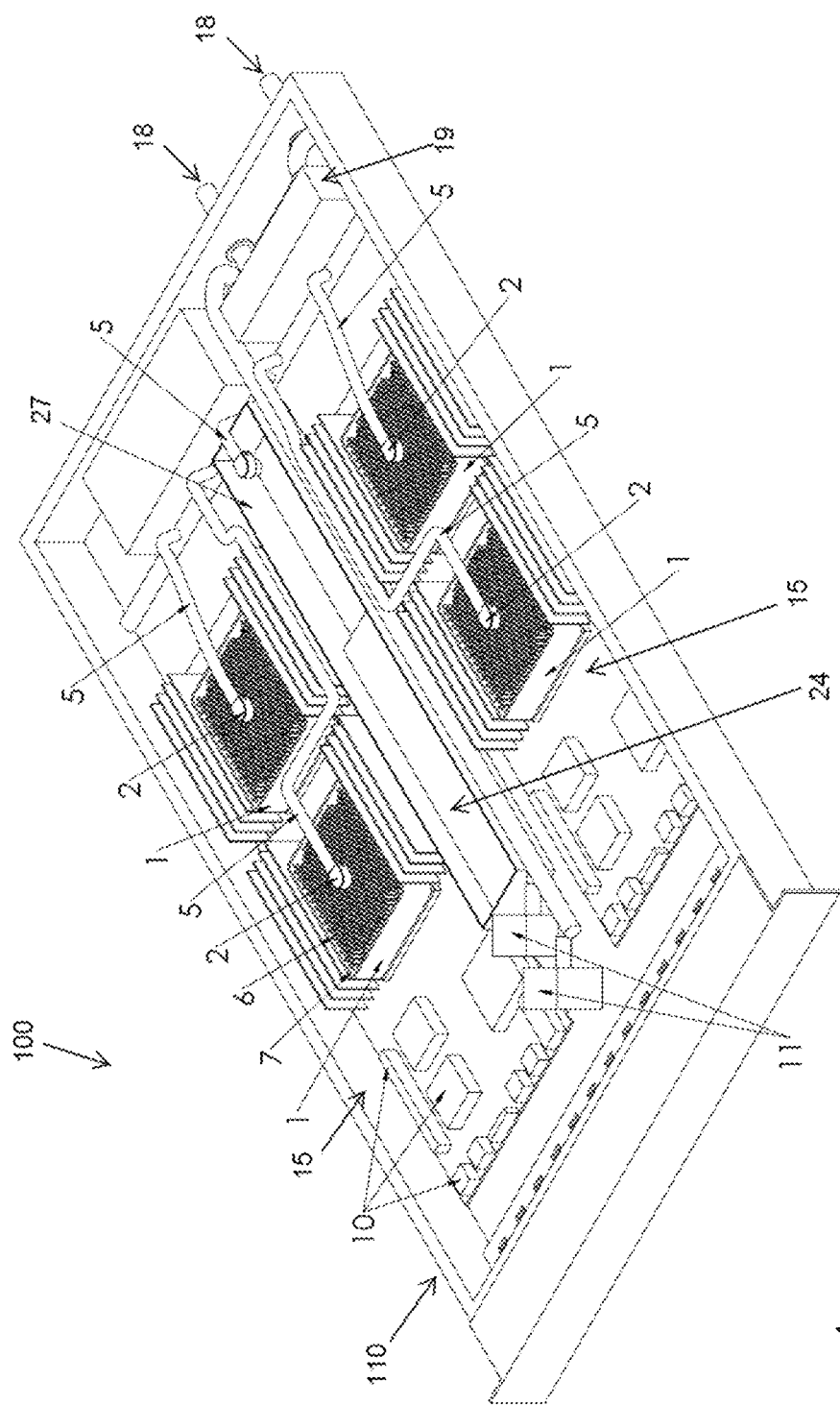
FIG. 1 shows an embodiment of a cooling module in accordance with the disclosure.
Figure 2:
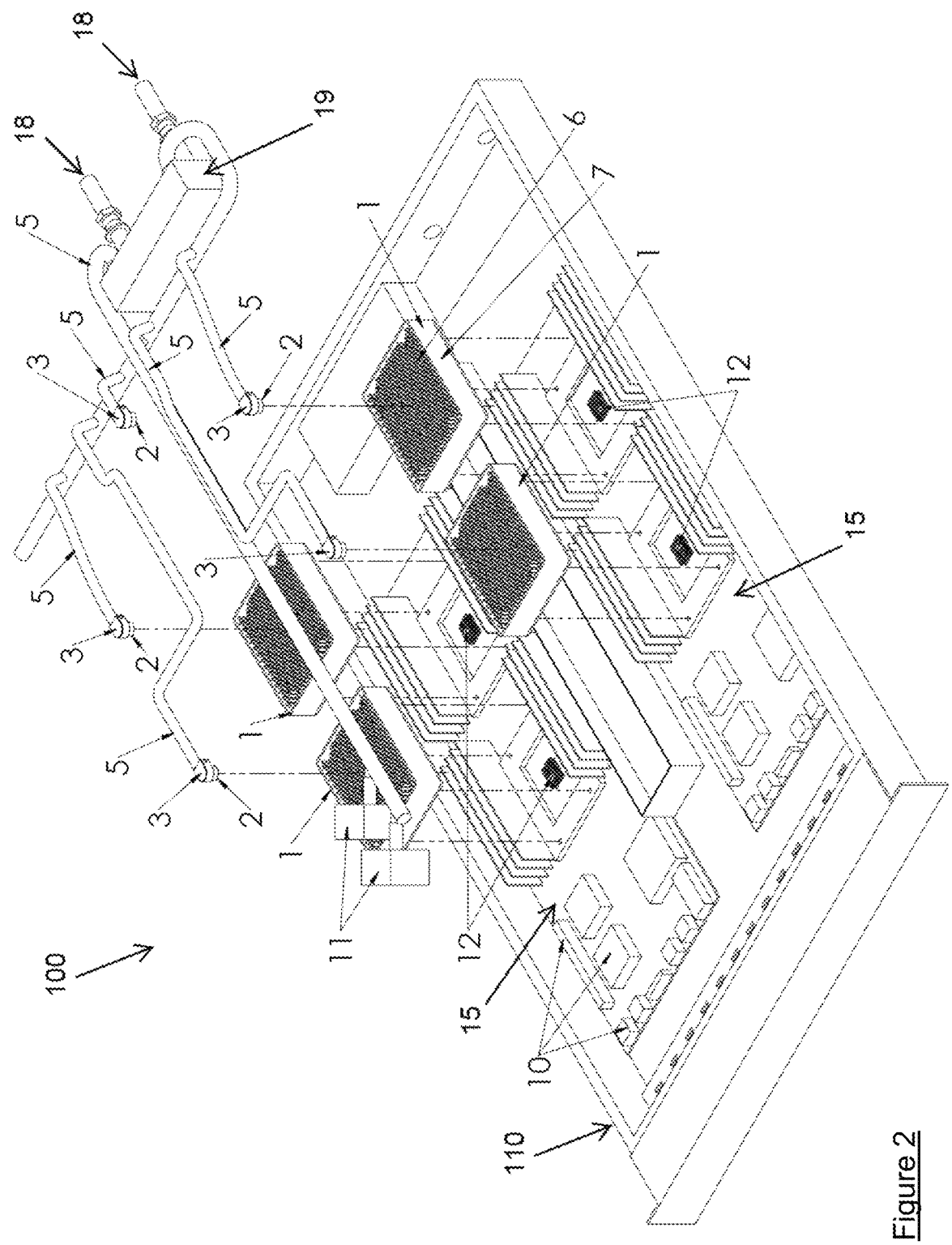
FIG. 2 depicts an exploded view of the embodiment of FIG. 1.

With reference to FIG. 1, there is shown an embodiment of the cooling module (sometimes termed a 'blade') in accordance with the disclosure. Also to be considered is FIG. 2, in which there is depicted an exploded view of the embodiment of FIG. 1. The cooling module 100 comprises a container 110 (shown without a lid), housing components 12 generating a relatively high temperature and components 10 generating a relatively low temperature. Both low temperature components 10 and high temperature components 12 are mounted on a circuit board 15. In FIGS. 1 and 2, two such identical circuit boards 15 are shown within the container 110. Heat sinks 1 are mounted on the high temperature components 12. More details regarding heat sinks 1 will be discussed subsequently.

The container 110 is, in operation, filled with a dielectric liquid coolant (not shown), which may be termed a primary coolant. The liquid coolant is not electrically conductive, but is normally thermally conductive and can carry heat by conduction and/or convection. The quantity of liquid coolant inside the container 110 is sufficient to cover or immerse the low temperature components 10 at least partially, but it may not necessarily fully immerse the low temperature components 10. The level of liquid coolant used in operation is discussed below. Pumps 11 cause liquid coolant to flow through pipes 5 and travel to a heat exchanger 19. The heat exchanger 19 receives a secondary liquid coolant (typically water or water-based) and transfers heat from the liquid coolant within the container 110 to this secondary liquid coolant. The secondary liquid coolant is provided to and emerges from the heat exchanger 19 via interface connections 18. The pumps 11 cause the cooled primary liquid coolant to exit the heat exchanger 19 through pipes 5 and emerge through nozzles 2. The pipes 5 and the nozzles 2 are positioned to cause coolant to flow directly onto the heat sinks 1.

The cooling module 100 is typically a rack-mounted module and the electronic components within the container 110 are preferably at least part of a computer server circuitry, for instance comprising a motherboard and associated components. The cooling module may therefore have a height of 1 rack unit (1 U, corresponding with 44.45 mm) or an integer number of rack units. The cooling module 100 may be configured for installation or installed in a corresponding rack, housing multiple such cooling modules (one, some or all of which may have different internal construction from cooling module 100 disclosed herein). In this configuration, the secondary liquid coolant may be shared between cooling modules in a series or parallel arrangement. A plenum chamber and/or manifold may be provided in the rack to allow this. Other components may be provided in the rack for efficient and safe (such as power regulators, one or more pumps or similar devices).

Figure 3:
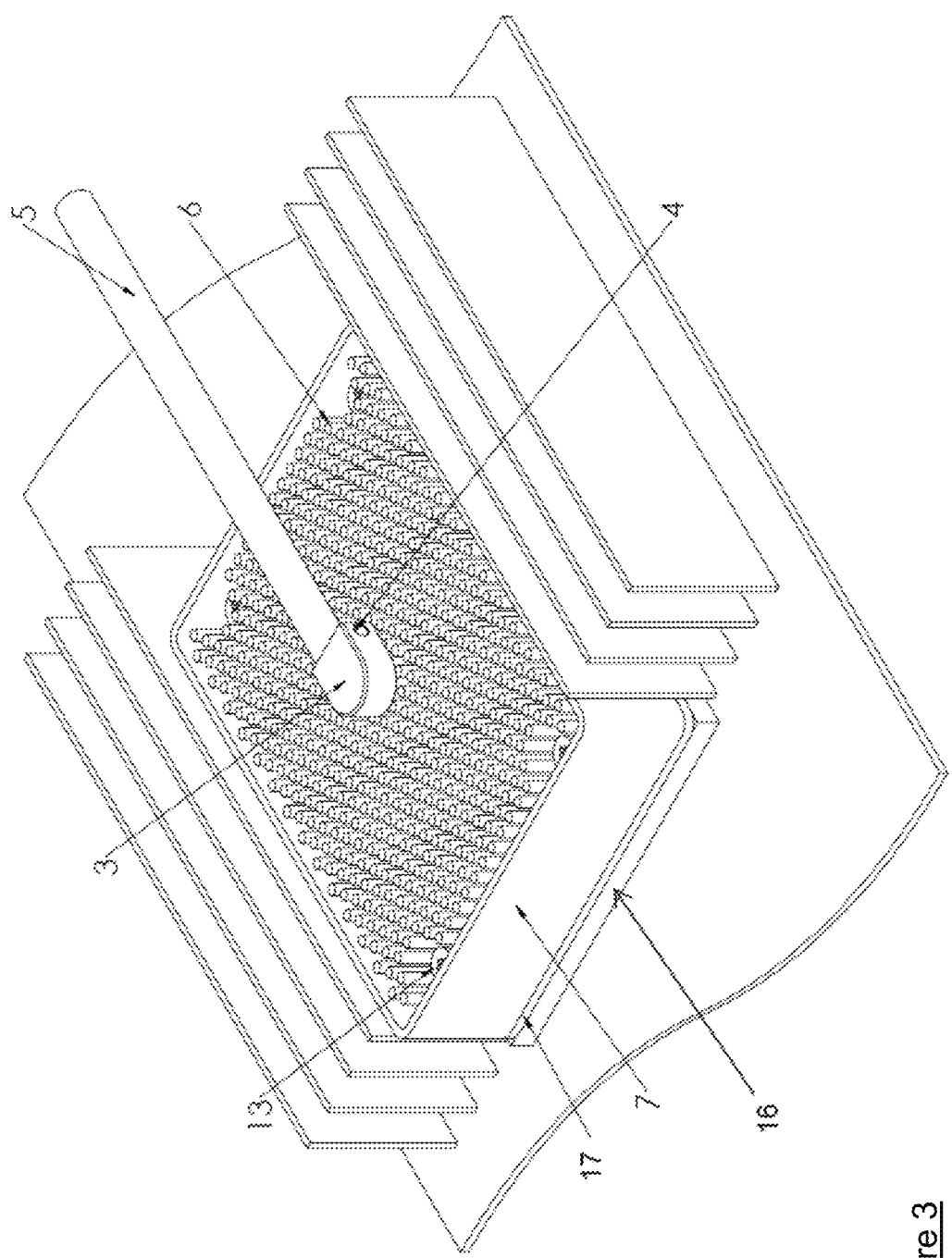
FIG. 3 illustrates a first embodiment of a heat sink in accordance with the disclosure.
Figure 4:
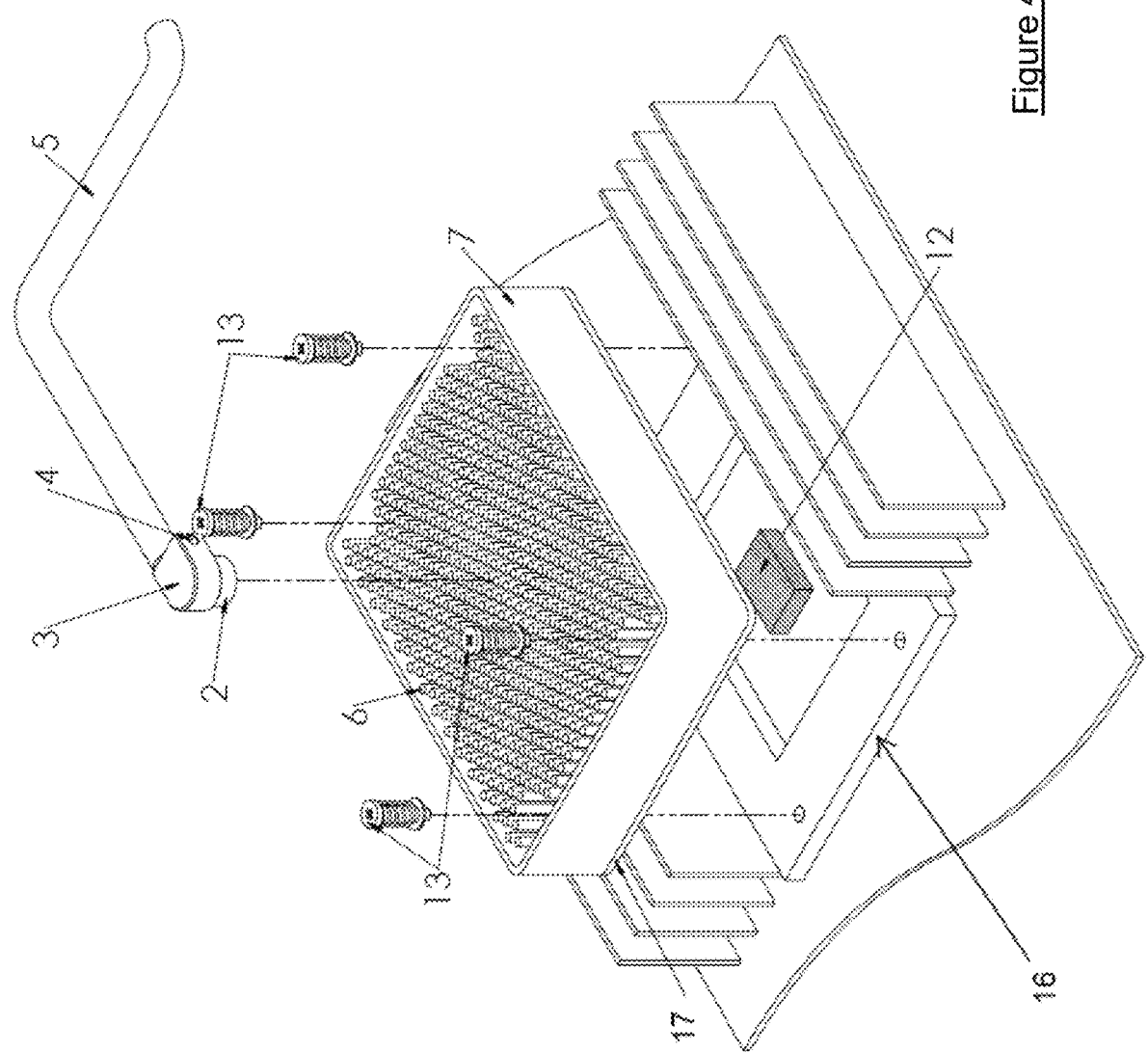
FIG. 4 depicts an exploded view of the embodiment of FIG. 3.

Referring to FIG. 3, there is illustrated a first embodiment of a heat sink in accordance with the disclosure. With reference to FIG. 4, there is shown an exploded view of the embodiment of FIG. 3. This is a magnified view of the heat sink shown in FIGS. 1 and 2. The heat sink 1 comprises: a base made up of a mount 16 and a planar substrate 17 fixed to the mount 16; a retaining wall 7 attached to the planar substrate 17; projections (shown in the form of pins) 6; and fixing screws 13, which attach the substrate 17 to the mount 16. In this way, the planar substrate 17 sits directly on the high temperature component 12 and transfers heat from the high temperature component 12 to a volume defined by the planar substrate 17 and the retaining wall 7, in which projections 6 are provided.

The heat sink 1 can be made from a single component, for example by: die cast; lost wax casting; metal injection mould (MIM); additive manufacture; or forged. It could also be machined out of a block of material or skived. The heat sink 1 may be formed from any material that is thermally conductive, such a metal or other thermal conductor. Some examples may include aluminium, copper or carbon.

Also shown in FIGS. 3 and 4 are pipe 5 and nozzle 2. The liquid coolant is delivered to the heat sink 1 via the nozzle 2. The nozzle 2 is arranged to direct coolant perpendicular to the plane of the substrate 17. This forces the jet or flow of the liquid coolant directly into the volume defined by the substrate 17 and retaining wall 7 of the heat sink 1. As a consequence, the heat dissipation is improved. This is especially the case in comparison with a system where the coolant is directed to flow over the heat sink, in a direction parallel to the plane of the heat sink substrate, such as in an air cooled system.

In the examples shown in FIGS. 3 and 4, the nozzle 2 delivers the coolant directly in the centre of the volume defined by substrate 17 and retaining wall 7. In this example, the centre of that volume corresponds with the hottest part of the area of the substrate 17, which is adjacent to (and directly on) the high temperature component 12. This provides a contraflow, such that the coldest coolant is directed to contact the hottest area of the heat sink. The coolant moves out radially from the hottest part.

The nozzle 2 is designed to have a push-fit connection 3 to the pipe 5. This does not require tools, so it can be fitted and removed straightforwardly. Consequently, replacing circuit boards 15, which may be computer motherboards, all the components can be easy and quick. The nozzle is further provided with an earth point 4, which can be coupled to an earth or ground point, to eliminate static build up in the pipe 5 and nozzle 2.

Figure 5:
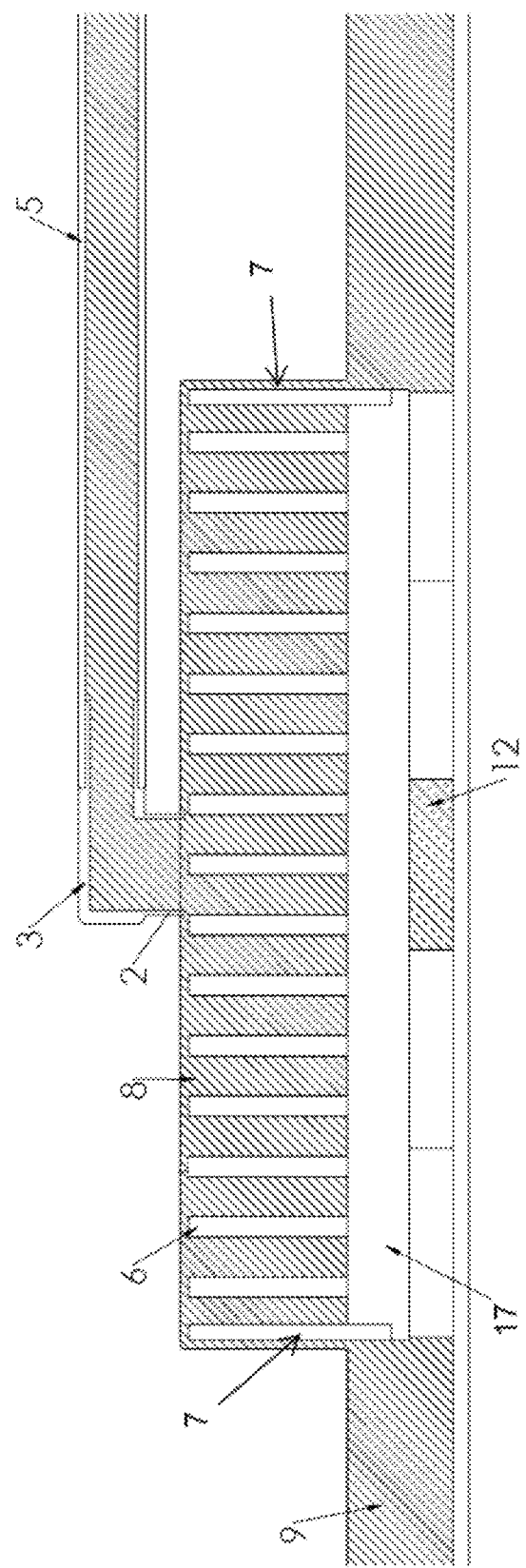
FIG. 5 shows a cross-sectional view of the heat sink in FIG. 3 in operation.

With reference to FIG. 5, there is shown a cross-sectional view of the heat sink in FIG. 3 in operation. The same features as shown in previous drawings are identified by identical reference numerals. Arrow indicate the flow of coolant within the pipe 5, to provide coolant 8 within the volume defined by the substrate 17 and retaining wall 7 of heat sink 1 and coolant 9 outside the heat sink 1. As indicated previously, coolant emerging from nozzle 2 is directed towards the centre of the volume (corresponding with the centre of the surface area of substrate 17) and from there moves out radially towards the retaining wall 7. Sufficient coolant is pumped via nozzle 2 into the volume, such that it overflows the retaining wall 7 and collects with remaining coolant 9 exterior to heat sink 1.

The retaining wall 7 acting as a side wall enables different levels of coolant. The coolant 8 within the volume of the heat sink 1 is at a relatively high level and the coolant 9, which at least partially immerses the low temperature components 10 (not shown in this drawing), is at a lower level. This allows significantly less liquid coolant to be used than in other similar systems that cover all components at the same height.

A number of benefits are thereby realised. Firstly, since less dielectric coolant is being used and this coolant can be expensive, costs can be significantly reduced. Dielectric liquid coolants are typically very heavy. By using less liquid coolant, the cooling module 100 can be more straightforward to install and/or lift. Also, installing the cooling module 100 can require less infrastructure. In addition, the cooling module 100 is easier to handle than similar devices are systems using significantly more primary liquid coolant. The level of the primary liquid coolant 9 within the majority of the container 110 is not close to the top of the container. As a result, spillages during maintenance or exchange of components are less likely. The risk of leakage is also reduced.

The retaining wall 7 creates a weir effect. The coolant 9 at a relatively low level cools the low temperature components 10 that, in the absence of a liquid coolant, would usually be cooled by air. It is not necessary for low temperature components 10 to be fully immersed in liquid coolant.

A further advantage of the volume bound by the substrate 17 and retaining wall 7 is temporary cooling redundancy. If the pump 11 or another component critical to the flow of liquid coolant, breaks down there is a volume of coolant trapped in the volume of heat sink 1. This coolant is sufficient to continue cooling the high temperature component 12, at least for a short time. This will counteract and potentially prevent instant temperature changes on high temperature component 12, thereby reducing show and giving time for these components to shut down.

An aspect of the invention will now be discussed in more general terms. For example, there may be considered a heat sink for an electronic device immersed in a liquid coolant, comprising: a base, configured for mounting on top of a heat-transmitting surface of the electronic device and transferring heat from the heat-transmitting surface; and a retaining wall extending from the base. In particular, the base and retaining wall define a volume for holding some of the liquid coolant, such that heat transferred through the base is transferred to the liquid coolant held in the volume. The volume advantageously allows retains heat adjacent the heat-transmitting surface.

Less dielectric coolant may be used than in existing cooling systems or modules. The base and retaining wall are preferably arranged such that a level of liquid coolant held within the volume is higher than a level of coolant external the volume. For example, this may be implemented by the base comprising a mount, which may cause the volume to be raised above a bottom of the base. The base may further comprise a substrate integral with or attached to the mount, defining a part of the volume. The base and the retaining wall can be separate parts or integral.

In the preferred embodiment, a surface of the base defining the volume (such a substrate part of the base) is planar or essentially or substantially planar. However, this is not necessary. The base (which may be considered a surface mounted on the electronic device) may be attached to the retaining wall and/or integrated with the electronic device. Optionally, the retaining wall cooperates with the base, such that the internal volume has at least one opening to allow liquid coolant accumulated within the internal volume to leave.

Advantageously, projections extend from the base and/or retaining wall within the volume. In particular, the projections may extend to substantially the same distance from the base (in a direction perpendicular from a plane of the base) as the retaining wall. The projections may comprise pins and/or fins. The projections preferably extend in a direction perpendicular to a plane of the base (the projections are beneficially straight). In particular, the projections may be arranged to cause the liquid coolant to spread in a radial direction away from a predetermined point on a surface of the base (such as a point coincident with or adjacent to a hottest part of the electronic device). The projections are preferably formed in a non-linear pattern. This may allow the coolant to disperse radially from the predetermined point.

In another aspect, there is provided a (sealable) cooling module for an electronic device, comprising: a container, housing the electronic device such that the electronic device can be at least partially immersed in a liquid coolant; and the heat sink as herein described, mounted on the electronic device. The cooling module may further comprise the liquid coolant. The liquid coolant is advantageously a dielectric. It is beneficially thermally conductive and electrically insulating.

The cooling module may be further configured to cause the liquid coolant to flow within the container. In particular, the cooling module may further comprise: a pump for causing the liquid coolant to flow within the container. Additionally or alternatively, the configuration of the cooling module may cause the liquid coolant to flow within the container (for example, by allowing or encouraging convection of the liquid coolant). In any case, the liquid coolant may be a primary coolant. The cooling module may comprise a heat exchanger, configured to receive a secondary liquid coolant and to transfer heat from the primary liquid coolant to the secondary liquid coolant. The heat exchanger is preferably inside the container. The pump may be configured to cause the liquid coolant to flow to and/or from the heat exchanger. Multiple such heat exchangers may optionally be provided.

Beneficially, the cooling module may additionally comprise a nozzle arrangement, arranged to receive flowing or pumped liquid coolant and direct it to the volume of the heat sink. The nozzle arrangement may be arranged to direct the flowing or pumped liquid coolant to a part of the base of the heat sink and/or a part of the volume of the heat sink adjacent the hottest part of the heat-transmitting surface of the electronic device. The nozzle arrangement is advantageously arranged to direct the flowing or pumped liquid coolant in a direction perpendicular to the base of the heat sink.

The nozzle arrangement preferably comprises one or more nozzles. Each of the one or more nozzles may be configured to direct the flowing or pumped liquid coolant to a respective part of the volume of the heat sink. In some embodiments, the nozzle arrangement comprises a plurality of nozzles. Then, each nozzle may be configured to direct the flowing or pumped liquid coolant to a respective part of the volume of the heat sink adjacent a part of the heat-transmitting surface of the electronic device having a temperature above a threshold level. The threshold level may be set based on the temperature of the hottest part of the heat-transmitting surface of the electronic device, for example based on a percentage or in order to cool a certain number of hottest areas of the heat-transmitting surface.

The cooling module may further comprise at least one pipe, arranged to transport liquid coolant (preferably from the pump, where one is provided) to the nozzle arrangement. Each of the one or more nozzles may then be configured to couple to a respective end of the at least one pipe. Preferably, the coupling is by push-fit. In other words, each nozzle may be push-fit coupled to a respective pipe end.

Figure 6:
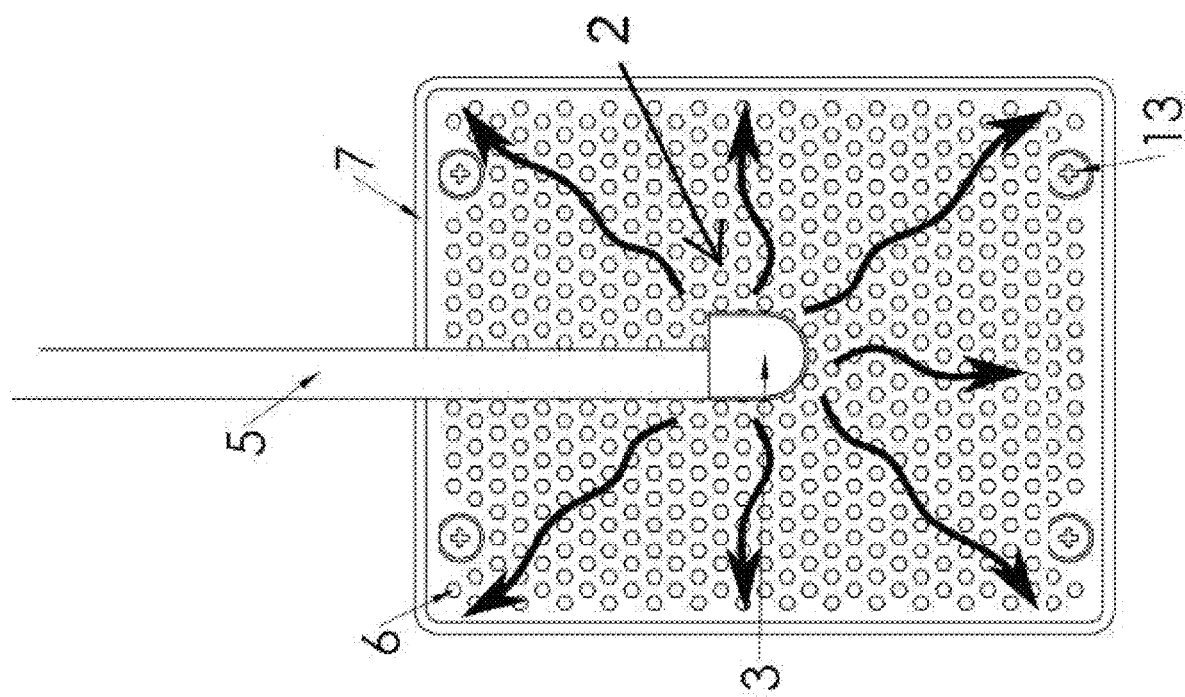
FIG. 6 shows a top view of the embodiment of FIG. 3, showing a nozzle arrangement.

Referring next to FIG. 6, there is shown a top view of the embodiment of FIG. 3, showing a nozzle arrangement. As previously discussed, the nozzle 2 (of which the push-fit connection 3 can be seen) coupled to pipe 5. The nozzle 2 is positioned to face the centre of the surface area of the substrate 17 (not shown in this drawing). The radial flow of coolant is shown by arrows in this drawing.

Figure 7:
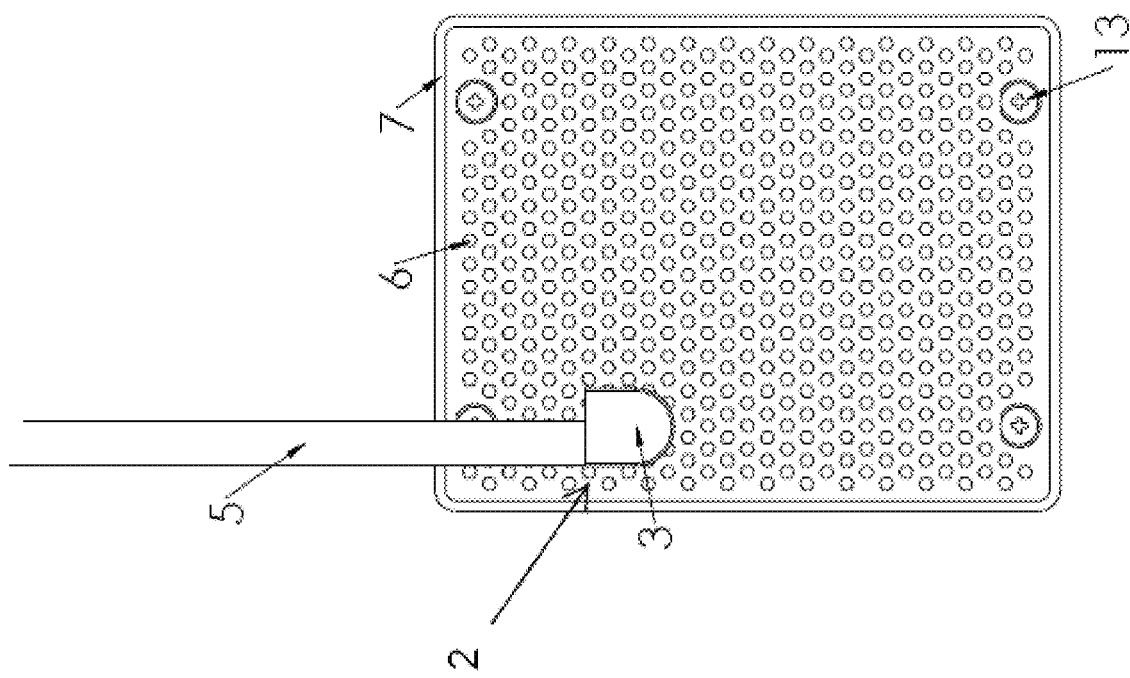
FIG. 7 shows a top view of a first variant of the nozzle arrangement of the embodiment of FIG. 3.
Figure 8:
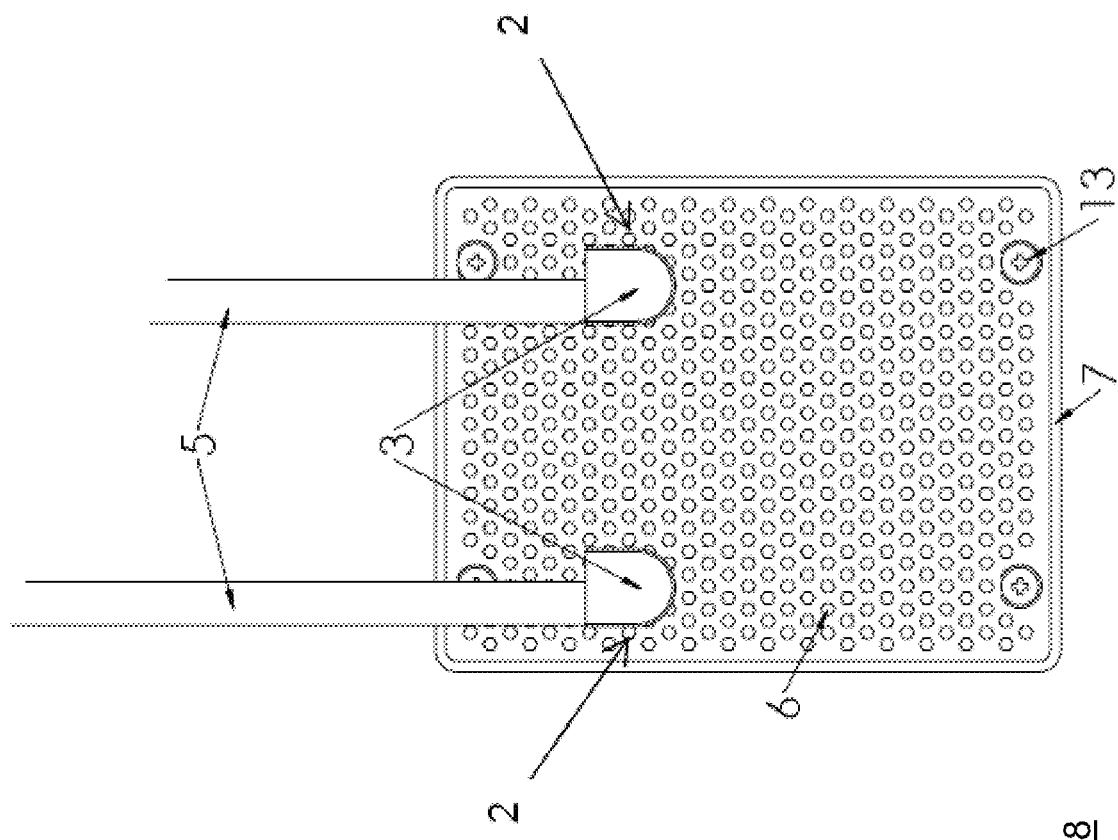
FIG. 8 shows a top view of a second variant of the nozzle arrangement of the embodiment of FIG. 3.

Alternative positions for the nozzle 2 are possible. Some such positions will now be described with reference to FIG. 7, in which there is shown a top view of the first variant of the nozzle arrangement of the embodiment of FIG. 3 and with reference to FIG. 8, in which there is shown a top view of a second variant of the nozzle arrangement of the embodiment of FIG. 3. Referring first to FIG. 7, the nozzle 2 is shown off-centre. Such an arrangement may be provided if the hottest part of the temperature component 12 is not adjacent the centre of the substrate 17. Referring to FIG. 8, two nozzles are shown. The two nozzles 2 are positioned over the surface area of the substrate 17 (not shown) adjacent two of the hottest parts of the high temperature component 12 (not shown) below.

Figure 8B:
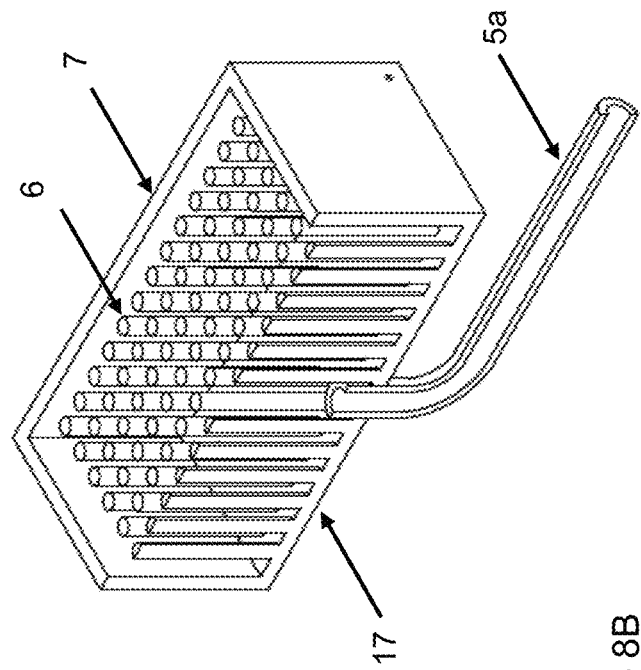
FIG. 8B shows a section view of the illustration of FIG. 8A.
Figure 8A:
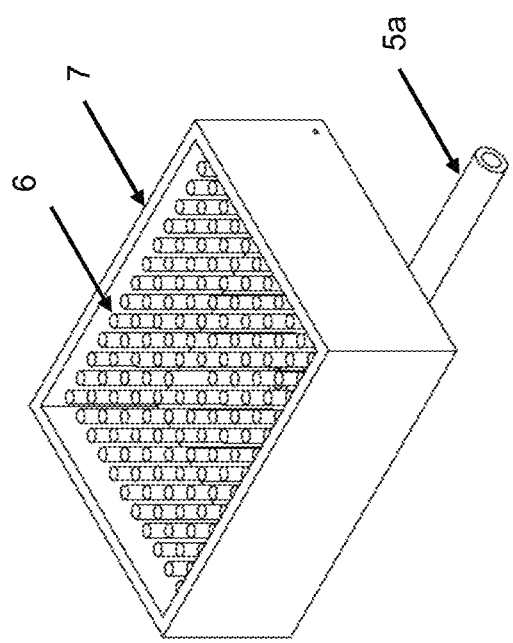
FIG. 8A illustrates a perspective view of a third variant of the nozzle arrangement of the embodiment of FIG. 3.

Referring next to FIG. 8A, there is illustrated a perspective view of a third variant of the nozzle arrangement of the embodiment of FIG. 3. In this variant, pins 6 within retaining wall 7 are shown. Pipe 5a is coupled directly to an opening within the planar substrate 17. This is more visible with reference to FIG. 8B, in which there is shown a section view of the illustration of FIG. 8A. Pipe 5a may thereby provide coolant directly within the volume defined by the retaining wall 7. In a further variant (not shown), the pipe 5a may be directly coupled to an opening or aperture in a side of the retaining wall 7.

Figure 8D:
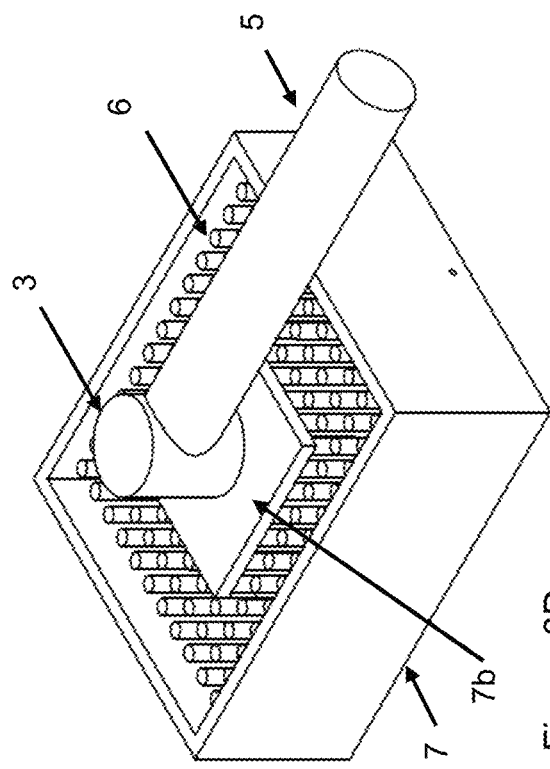
FIG. 8D illustrates a perspective view of a fifth variant of the nozzle arrangement of the embodiment of FIG. 3.
Figure 8F:
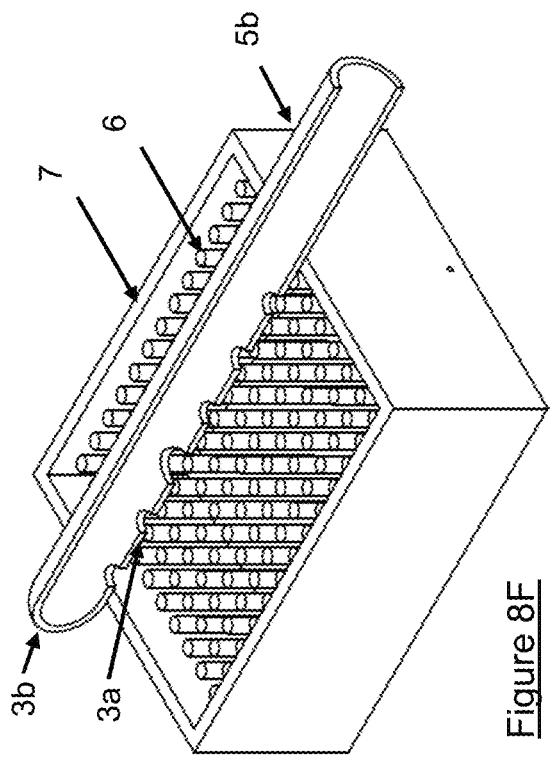
FIG. 8F shows a partial section view of the illustration of FIG. 8E.
Figure 8C:
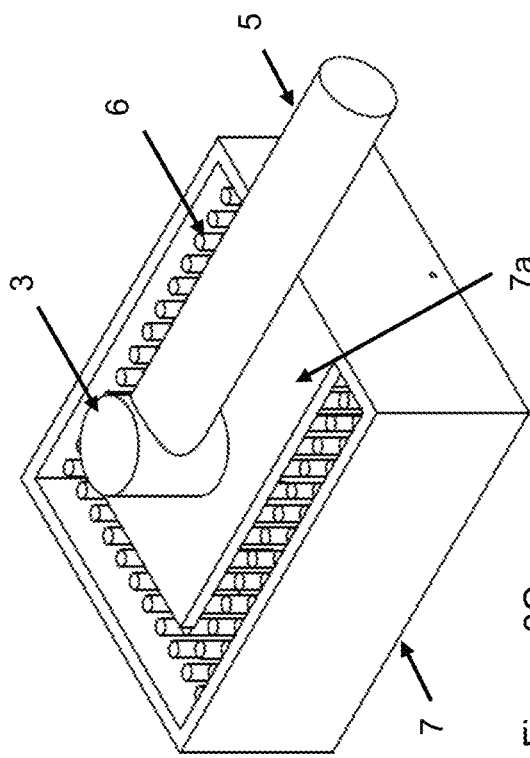
FIG. 8C illustrates a perspective view of a fourth variant of the nozzle arrangement of the embodiment of FIG. 3.

Referring now to FIG. 8C, there is illustrated a perspective view of a fourth variant of the nozzle arrangement of the embodiment of FIG. 3. This variant is similar to the design shown in FIG. 7. The pipe 5 and nozzle 3 are positioned such that nozzle 3 is more centrally located with respect to the volume defined by the retaining wall 7. Moreover, a partial lid 7a is provided to cover some of the internal volume. One or more apertures in the partial lid 7a may allow liquid coolant from the nozzle 3 to reach the internal volume. The partial lid 7a may be attached to a part of the nozzle 3, although this may not be needed.

The partial lid may allow an increase in the pressure and flowrate of the coolant. In other words, it may stop the coolant from immediately leaving the volume over the sides of retaining wall 7. In this variant, the partial wall joins the retaining wall 7. However, it has been recognised that this may be adjusted based on the desirability and/or requirements of individual heat sinks. For example, one or more of the shape and position of lid and whether, how and where the lid joins to the retaining wall 7 may be adjusted to change the flow of liquid coolant and set or adjust where the coolant overspills the retaining wall 7. With reference to FIG. 8D illustrates a perspective view of a fifth variant of the nozzle arrangement of the embodiment of FIG. 3, which is similar to the fourth variant shown in FIG. 8C, but with a partial lid 7b that is smaller than the partial lid 7a and is not joined to the retaining wall 7.

Figure 8E:
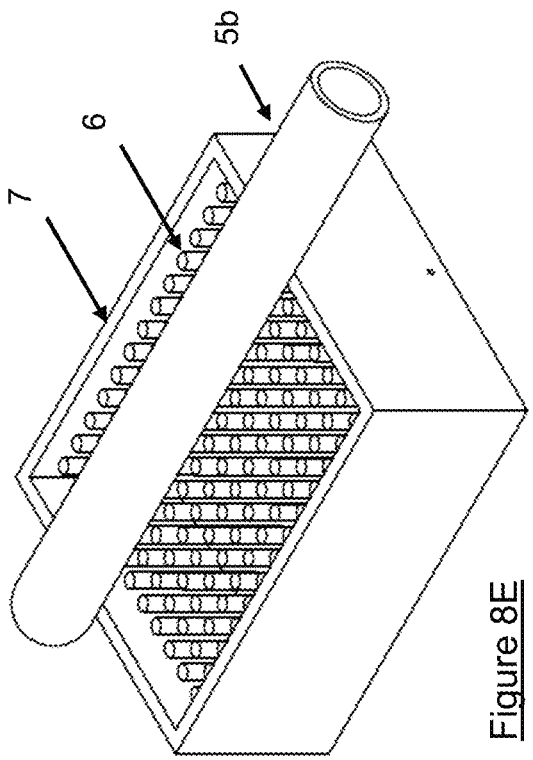
FIG. 8E illustrates a perspective view of a sixth variant of the nozzle arrangement of the embodiment of FIG. 3.

Next, reference is made to FIG. 8E, in which there is illustrated a perspective view of a sixth variant of the nozzle arrangement of the embodiment of FIG. 3. In this variant, the nozzle is integrated with the pipe 5b. Referring to FIG. 8F, there is shown a partial section view of the illustration of FIG. 8E, in which this can be more clearly seen. Apertures or holes 3a in an underside of the pipe 5b allow liquid coolant to be directed and/or distributed to the volume defined by the retaining wall 7, without the need for a separate nozzle. Such an arrangement may allow more even spreading of coolant to different areas using a single pipe 5b. One or more of the positions, number, pitch and size of the holes 3a may be set or adjusted to meet desired performance. For example, it can be seen in FIG. 8F that at least one of the holes 3a has a large diameter than the other holes, for higher flow-rate of coolant through that hole than the other holes. The pipe 5b may have a closed end 3b, although this is not necessary (as will be discussed further below). In some further variants (not shown), the pipe 5b may be tapered or otherwise have its cross-sectional area varied to control and/or balance coolant distribution between different areas.

Another generalised aspect of the present disclosure will now be discussed, in which there is provided a cooling module, comprising: a container, housing an electronic device for cooling, such that the electronic device can be at least partially immersed in a liquid coolant; a heat sink, comprising a base mounted on the electronic device; and a nozzle arrangement, arranged to receive liquid coolant and direct it to the base of the heat sink. In particular, the nozzle arrangement may be arranged to direct the received liquid coolant to the heat sink in a direction perpendicular to the base. In some embodiments, the nozzle arrangement may be arranged to direct the received liquid coolant to the base of the heat sink via an internal (reservoir) volume of the heat sink. Directing the flow of liquid coolant in these ways may promote cooling of the electronic device via the heat sink, since colder liquid coolant may be directed to the hottest parts in an efficient way.

The nozzle arrangement may comprise a pipe, arranged to receive the liquid coolant, for instance from a pump. An end of the pipe may be outside a volume defined by the heat sink. In this case, a nozzle may be attached, mounted or arranged on the end of the pipe to direct the liquid coolant. A nozzle may be integrated with the pipe, by providing one or more holes in the pipe to direct coolant accordingly. Where multiple holes are provided in the pipe, one or more of the positions, number, pitch and size of the holes may vary between holes. A lid may be provided over a part of the volume defined by the retaining wall, which may optionally be joined to the retaining wall. The lid may be positioned and/or configured to allow liquid coolant to reach the volume, but to prevent some coolant from leaving the volume via an open part not bounded by a base and/or retaining wall. In another embodiment, the pipe may be coupled to the base of the heat sink (such that coolant is directed to the base) or to a sidewall of the heat sink, adjacent the base.

Advantageously, the liquid coolant is caused to flow within the container. In some embodiments, the cooling module further comprises a pump for causing the liquid coolant to flow within the container. The nozzle arrangement may be arranged to receive flowing or pumped liquid coolant. The nozzle arrangement may allow the delivery of coolant directly to the hottest part of the heat sink and thereby may provide a contraflow.

Advantageously, the nozzle arrangement is arranged to direct the flowing or pumped liquid coolant to a part of the heat sink adjacent the hottest part of the electronic device. The nozzle arrangement beneficially comprises one or more nozzles. Then, each of the one or more nozzles may be configured to direct the flowing or pumped liquid coolant to a respective part of the heat sink. In some embodiments, the nozzle arrangement comprises a plurality of nozzles. Then, each nozzle may be configured to direct the flowing or pumped liquid coolant to a respective part of the heat sink adjacent a part of the electronic device having a temperature above a threshold level. The threshold level may be set based on the temperature of the hottest part of the electronic device, for example based on a percentage or in order to cool a certain number of hottest areas of the electronic device.

In the preferred embodiment, the cooling module further comprises: at least one pipe, arranged to transport liquid coolant (preferably from the pump, where one is provided) to the nozzle arrangement. Each of the one or more nozzles may then be configured to couple to a respective end of the at least one pipe. Preferably, the coupling is by push-fit. In other words, each nozzle may be push-fit coupled to a respective pipe end. Alternative arrangements are possible, as discussed above.

The heat sink of this aspect may be the heat sink of the other aspect described above. For example, the base of the heat sink may be configured for mounting on top of a heat-transmitting surface of the electronic device and transferring heat from the heat-transmitting surface. The heat sink may further comprise: a retaining wall extending from the base, the base and retaining wall defining a volume for holding some of the liquid coolant, such that heat transferred through the base is transferred to the liquid coolant held in the volume. The base and retaining wall may be arranged such that a level of liquid coolant held within the volume is higher than a level of coolant external the volume. A surface of the base defining the volume is planar. The heat sink volume may be configured such that coolant received in the volume from the nozzle arrangement moves out radially from the part of the volume at which the coolant is received. The heat sink may further comprise projections extending from the base and/or retaining wall within the volume. Preferably, the projections extend to substantially the same distance from the base as the retaining wall. The projections advantageously comprise pins and/or fins. In embodiments, the projections extend in a direction perpendicular to a plane of the base. The projections may be arranged to cause the liquid coolant to spread in a radial direction away from a predetermined point on a surface of the base (such as the hottest part). For instance, they may be formed in a non-linear pattern.

The liquid coolant may be a primary liquid coolant. Then, the cooling module may further comprise: a heat exchanger, configured to receive a secondary liquid coolant and to transfer heat from the primary liquid coolant to the secondary liquid coolant. The pump may be configured to cause the liquid coolant to flow to and/or from the heat exchanger. The nozzle arrangement is advantageously arranged to receive the primary liquid coolant from the heat exchanger. In this way, the coolant directed by the nozzle arrangement to the heat sink may be the coldest coolant. Then, it may beneficially be directed to the hottest part of the heat sink.

The projections 6 (as pin and/or fins) could integrally formed with the rest of heat sink 1 or be made from separate components from the remainder of the heat sink 1. The projections 6 could be tolerance fit, glued or brazed in place. Additionally or alternatively, the retaining wall 7 could be integrally formed or made separately from the rest of the heat sink 1, for example by an extrusion or fabricated sheet metal part. Then, the retaining wall 7 could be tolerance fit, glued in place, brazed or welded.

Figure 9:
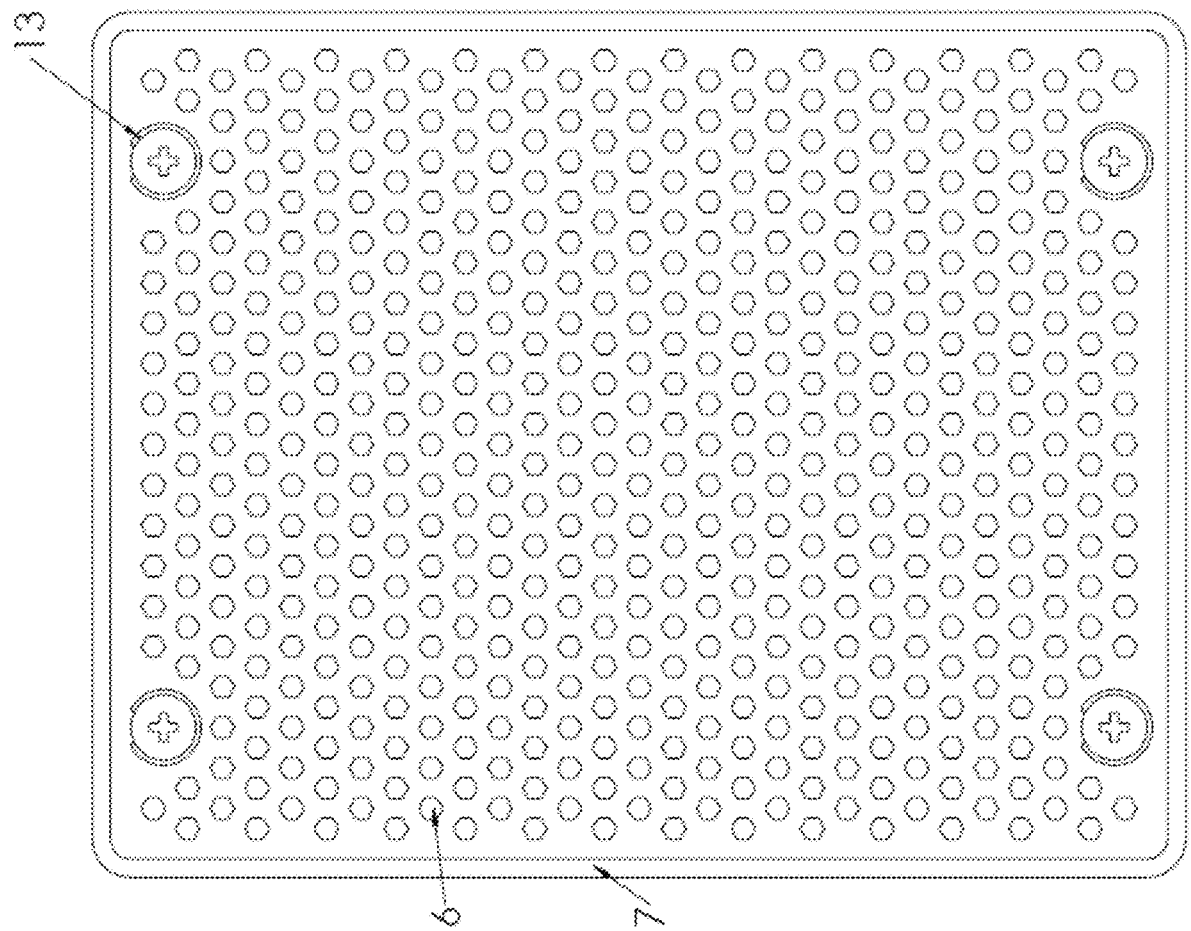
FIG. 9 depicts an expanded top view of a part of the embodiment of FIG. 3, showing a projection arrangement.

With reference to FIG. 9, there is depicted an expanded top view of part of the embodiment of FIG. 3, showing a projection arrangement. As can be seen in this embodiment, the projections 6 are regularly spaced pins.

Although the projections 6 have been shown as pins, other arrangements may be possible and indeed, advantageous. The projections 6 can be fins or a combination of pins and fins. A number of such variants will now be described. For example, the pins and/or fins can be arranged non-linearly (not in straight lines). This may improve the radial flow of coolant. The variants now described are examples of possible alternative implementations, but further options will readily be considered by the skilled person.

Figure 10:
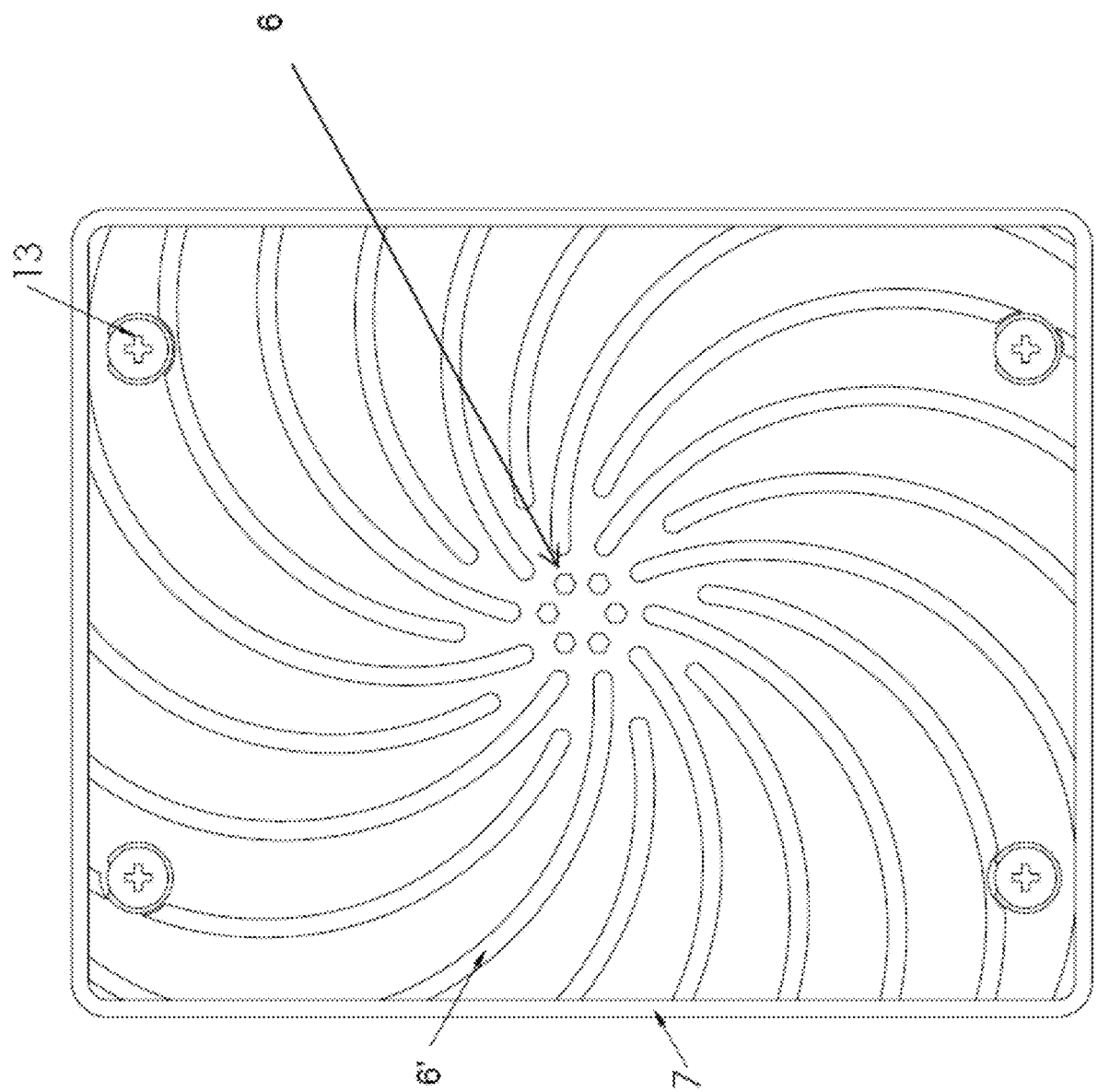
FIG. 10 depicts a top view of a first variant of the projection arrangement of the embodiment of FIG. 3.

With reference to FIG. 10, there is depicted a top view of a first variant of the projection arrangement of the embodiment of FIG. 3. Here, the projections comprise pins 6 and fins 6' arranged in a spiral design. These projections again promote radial flow of liquid coolant.

Figure 11:
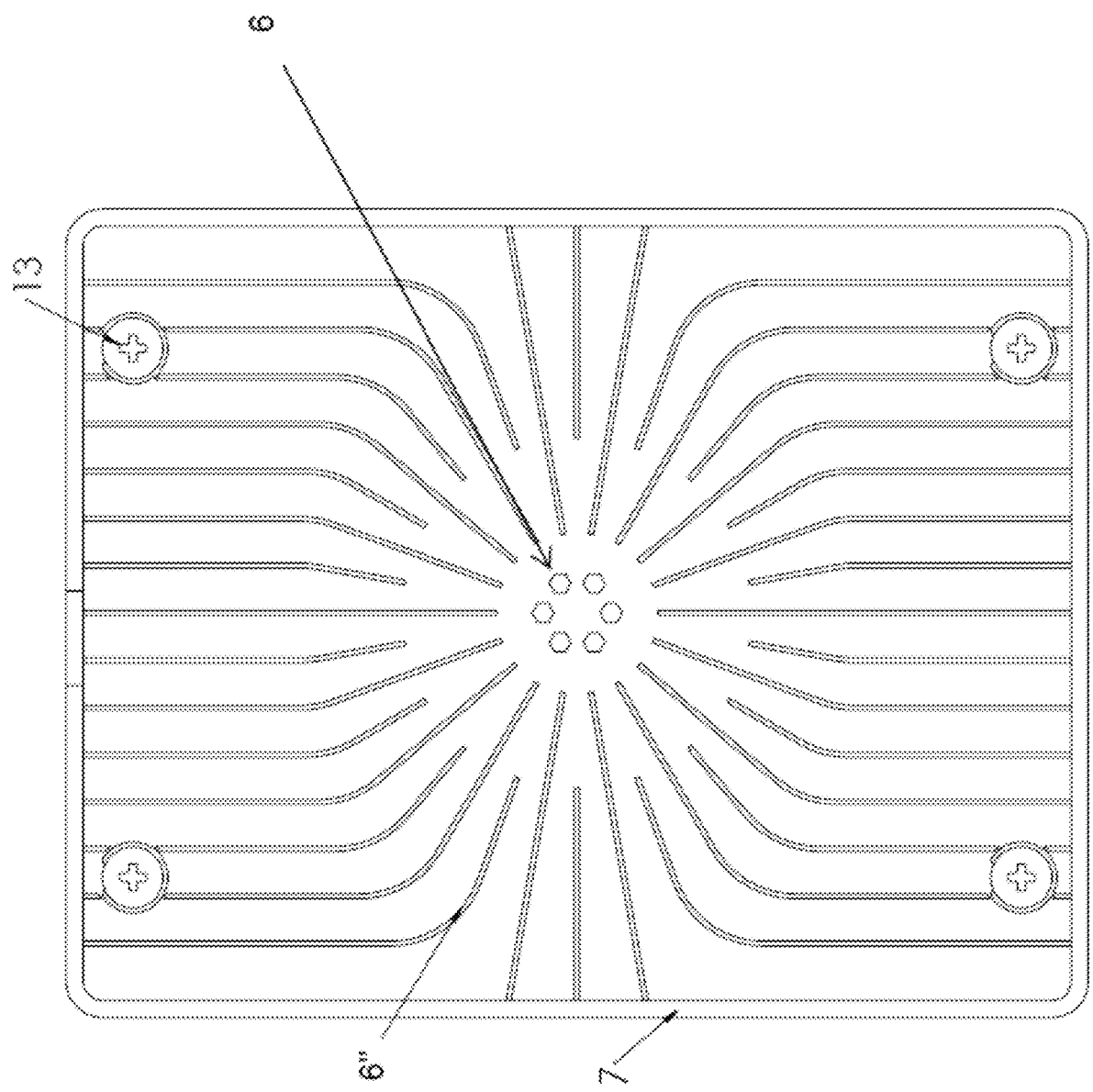
FIG. 11 depicts a top view of a second variant of the projection arrangement of the embodiment of FIG. 3.

With reference to FIG. 11, there is depicted a top view of a second variant of the projection arrangement of the embodiment of FIG. 3. The projections comprise pins 6 and fins 6", arranged in a 'spider' design. Like previous designs this further encouraged radial flow.

Figure 12:
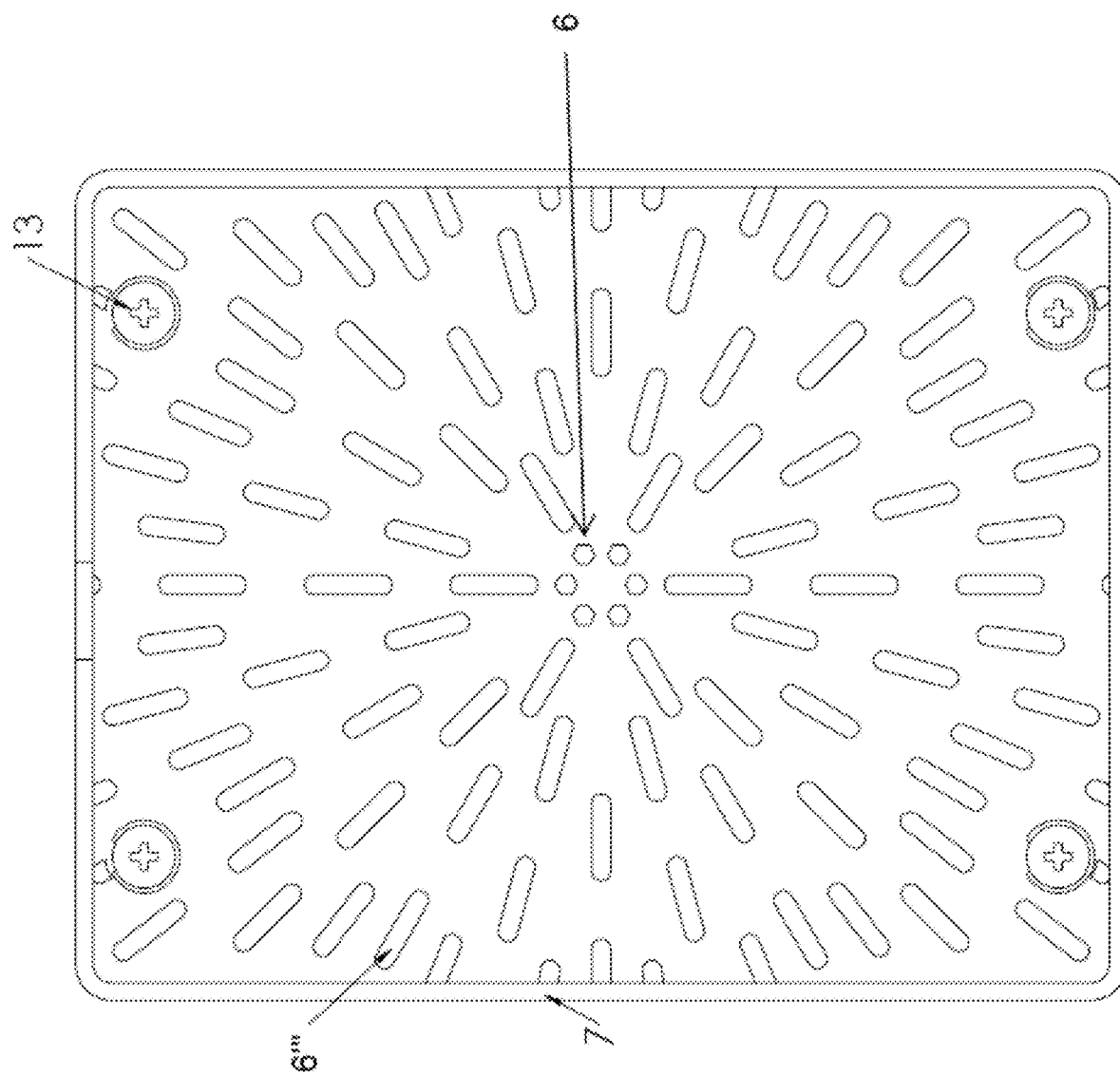
FIG. 12 depicts a top view of a third variant of the projection arrangement of the embodiment of FIG. 3.

With reference to FIG. 12, there is depicted a top view of a third variant of the projection arrangement of the embodiment of FIG. 3, in which the projections comprise pins 6 and pin-fins 6'". These are arranged in a 'burst' design, which likewise promotes radial flow.

Figure 13:
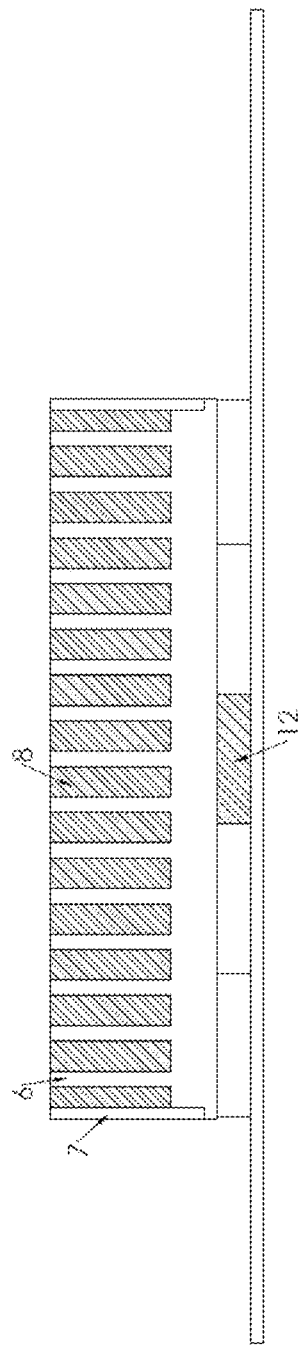
FIG. 13 illustrates a cross-sectional view of a part of the heat sink in FIG. 3, showing a height of the projection arrangement.

Referring next to FIG. 13, there is illustrated a cross-sectional view of a part of the heat sink of FIG. 3, showing a height of the projection arrangement. As can be seen here, the pins 6 are flush with the height of the retaining wall 7. This has a number of benefits. The retaining wall 7 can ensure that all of the projections 6 are fully wetted. In other words, it is intended that all of the projections 6 (whether pins, fins or a combination thereof) are submerged in coolant 8. This can help to ensure that every possible surface is being used for heat dissipation. Moreover, the coolant cannot bypass or short-cut over the projections 6, since they are the same height as the retaining wall 7. Such designs may be possible however the formation of the projections 6, which need not be as pins shown in FIG. 13.

Figure 14:
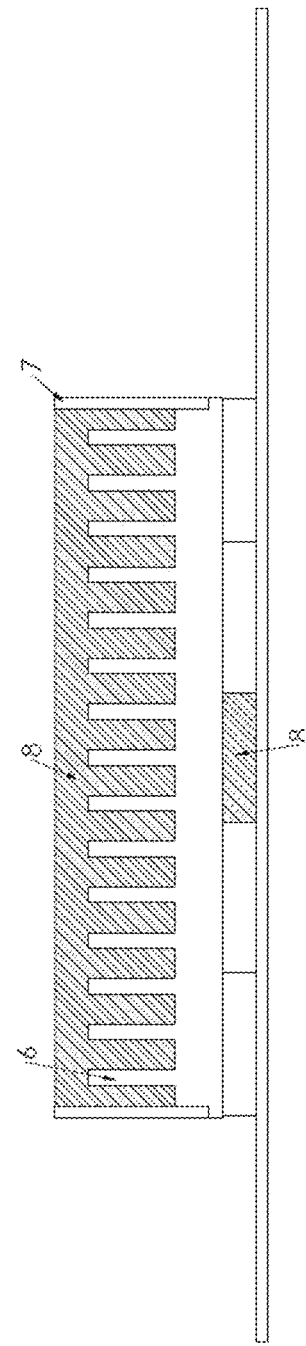
FIG. 14 illustrates a cross-sectional view of a first variant of the projection arrangement height of the embodiment of FIG. 3.
Figure 15:
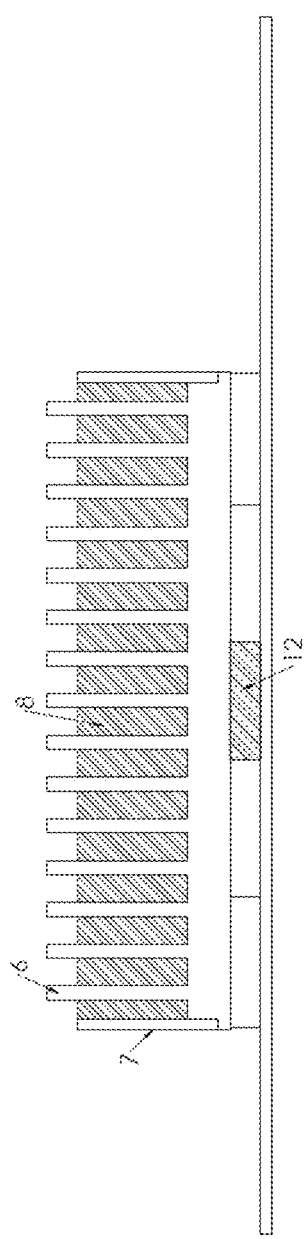
FIG. 15 illustrates a cross-sectional view of a second variant of the projection arrangement height of the embodiment of FIG. 3.

With reference now to FIG. 14, there is illustrated a cross-sectional view of the first variant of the projection arrangement height of the embodiment of FIG. 3. In this, the projections 6a are at a lower height than the retaining wall 7. This maintains the benefit of projections that are fully wetted, but without the benefit that coolant can bypass the projections. With reference to FIG. 15, there is illustrated a cross-sectional view of a second variant of the projection arrangement height of the embodiment of FIG. 3, in which the projections 6b are higher than the height of the retaining wall 7. This maintains the benefit that the coolant cannot bypass the projection 6b, but does not benefit from all of the projection 6b being fully wetted.

Figure 16:
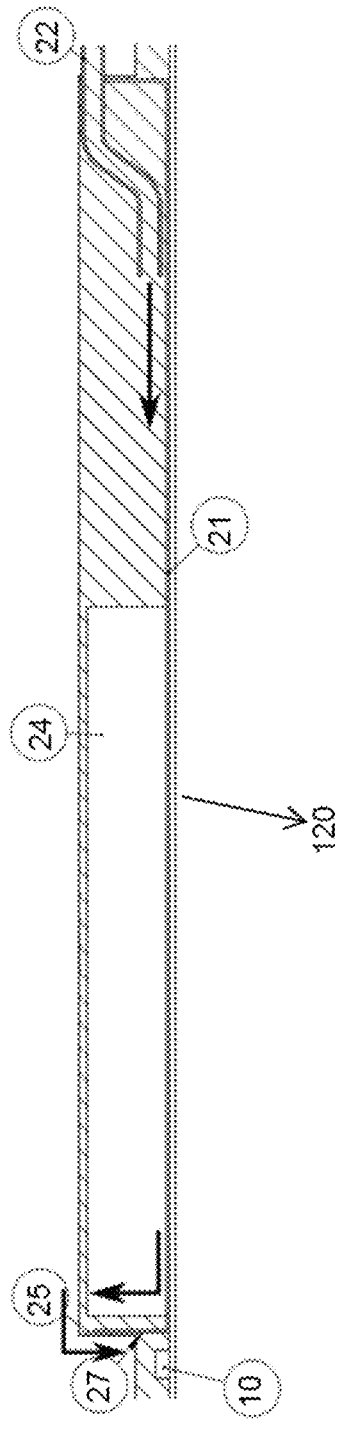
FIG. 16 depicts a cross-sectional view of a second embodiment of a heat sink in accordance with the disclosure.
Figure 17:
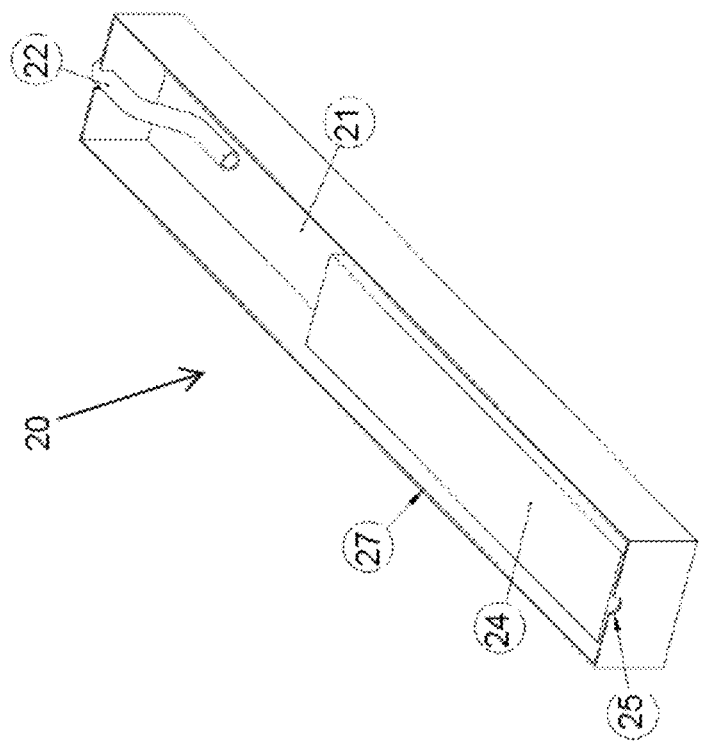
FIG. 17 shows a perspective view of the heat sink of FIG. 16.

Reference is again made to FIGS. 1 and 2. Another part of the cooling module 100 (as shown most clearly in FIG. 1) will now be discussed. In the centre of the container 110 sits an electronic device 24. This is typically a power supply. It sits within a separate portion of the container 110 base area from the circuit boards 15, bounded by a retaining wall 27. With reference now to FIG. 16, there is depicted a cross-sectional view of a second embodiment of a heat sink in accordance with the disclosure, which corresponds with a variant of the electronic device 24 and retaining wall 27 shown in FIG. 1. FIG. 17 shows a perspective view of the heat sink of FIG. 16. FIG. 17 shows a perspective view of the heat sink of FIG. 16.

In this embodiment, a heat sink 20 is provided upon a base 120 of the container 110. The heat sink 20 comprises a base 21 and a retaining wall 27. The electronic device, such as power supply 24, sits on the base 21 of the heat sink 20, within a volume (an internal volume) defined by the base 21 and retaining wall 27. The construction process and/or materials of the heat sink 20 may be equivalent or similar to that used in respect of the previously described heat sink 1.

Coolant is piped into this volume by means of pipe 22. As shown in FIG. 16, this coolant flows directly from the end of the tube into a lower portion of the volume defined by base 21 and retaining wall 27. The electronic device 24 is shown as being fully submerged within the coolant. However, it may only be partially submerged depending on the most efficient scenario in terms of heat extraction and volume of coolant.

As with other embodiments in the disclosure, the coolant can flow over the retaining wall 27 allowing for multiple levels of cooling. The same benefits as identified above for this feature equally apply to this embodiment. Moreover, this can provide two levels of cooling, in which low temperature components 10 are cooled by a layer level of coolant than a level of coolant within the volume of the heat sink 20. The benefit of temporary cooling redundancy is also provided.

A cut out 25 is used to create a spout at the other end of the volume from the coolant inlet tube 22. This can give a direction to the flow of coolant and ensure that components are not sat in stagnant coolant as the colder coolant is pumped straight over the side walls.

Variants of this design are possible. Referring to FIG. 17A, there is depicted a perspective view of a cooling system incorporating a first variant of the embodiment of FIGS. 16 and 17. Reference is also made to FIG. 17B, in which there is depicted an exploded view of the cooling system of FIG. 17A. The heat-generating (or heat-emitting) components or devices of the cooling system are mounted on a substrate 112, which is typically a circuit board (such as a PCB or motherboard). Some of these components or devices are not readily able to be cooled by a low level of liquid coolant. A solution in accordance with the general design of heat sink 20, shown in FIGS. 16 and 17 might be feasible. However, a base (such as base 21 of heat sink 20) is not necessary.

Instead, a retaining sidewall is provided, which acts as a weir wall to create a volume for retaining coolant. The base of the volume is provided by the substrate 112. Examples include a first retaining wall 113, second retaining wall 114 and third retaining wall 115. The retaining walls can be made from any material (such as metal, plastic or silicone) and can be bonded, adhered, screwed or otherwise fixed or attached to the substrate. The side walls could also be over-moulded, silicone-cast or 3D printed. A gasket or adhesive tape could be used to seal the join between the sidewalls and the substrate. The heat sinks formed by the retaining wall and the substrate can be any shape or height depending on the cooling requirements or footprint of the components being cooled.

Coolant is provided from a pump (not shown) into the volume formed by the substrate 112 and the first retaining wall 113 using a first pipe 116, into the volume formed by the substrate 112 and the second retaining wall 114 using a second pipe 117 and into the volume formed by the substrate 112 and the third retaining wall 115 using a third pipe 118. Although the design shown in FIGS. 17A and 17B shows each pipe providing coolant to a top of a respective retaining wall, it will be understood that other ways of delivering the coolant can be used (for example, as disclosed further herein).

In a second variant of this design, the base 21 need not be a separate component of the design, but rather may be the base of the container or a circuit board. With reference to FIG. 17C, there is depicted a second variant of the embodiment of FIGS. 16 and 17, along such lines. A substrate 121 is an existing part of the container, for example the container base 120 (such as shown in FIG. 16) or a circuit board 15 (as shown in FIG. 2, for instance). A retaining wall is partially formed by a vertical circuit board 122, perpendicular to the substrate 121. The parts of the retaining wall not formed by the vertical circuit boards 122 are formed by side wall parts 123. In this case, two vertical circuit boards 122 are provided to form opposite walls, with the side wall parts 123 also forming opposite walls to form a rectangular internal volume 125. The vertical circuit boards 122 and side wall parts 123 are partially sealed against the substrate 121, so that liquid coolant directed to the internal volume 125 is held against components (not shown) within the internal volume 125. A partial seal may allow some liquid to flow out of the internal volume 125, via gaps in the seal, but typically at a significantly slower rate that the rate of liquid being provided (such as no more than 50%, 30%, 25%, 20%, 10%, 5% or 1% of the rate of liquid provision into the internal volume 125. Optionally, the seal from the vertical circuit boards 122 and side wall parts 123 against the substrate 121 may be more substantial or complete. Means for directing liquid coolant (not shown) into the internal volume may include any of those described herein, for example with reference to FIGS. 7, 8, 8A to 8F or 16 or further options as discussed below.

Referring now to FIG. 17D, there is depicted a modification of the second variant as shown in FIG. 17C. Here, only one vertical circuit board 122 is provided with three side wall parts 123 together providing the internal volume 125 against the substrate 121. It will be recognised that the number of vertical circuit boards 122 and side wall parts 123 may be varied further (the shape of the retaining wall need not be square) and indeed, all of the retaining wall may be provided entirely by side walls 123 or entirely by vertical circuit boards 122. Such designs may be space efficient and optimised for particular component configurations. For example, existing components can be used for form part or all of the retaining wall. A weir effect is thereby used to create the internal volume 125.

Figure 19:
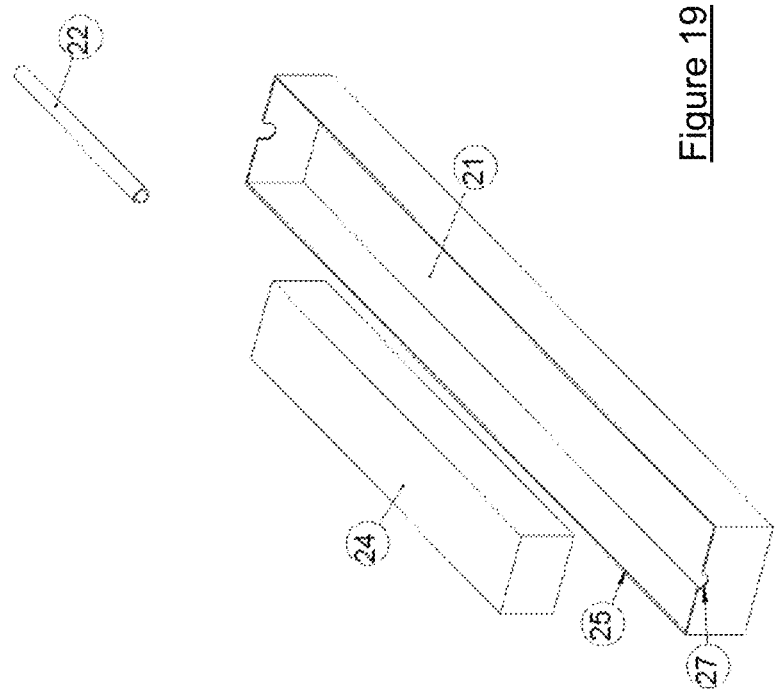
FIG. 19 shows the exploded view of FIG. 18 with a nozzle part removed.
Figure 18:
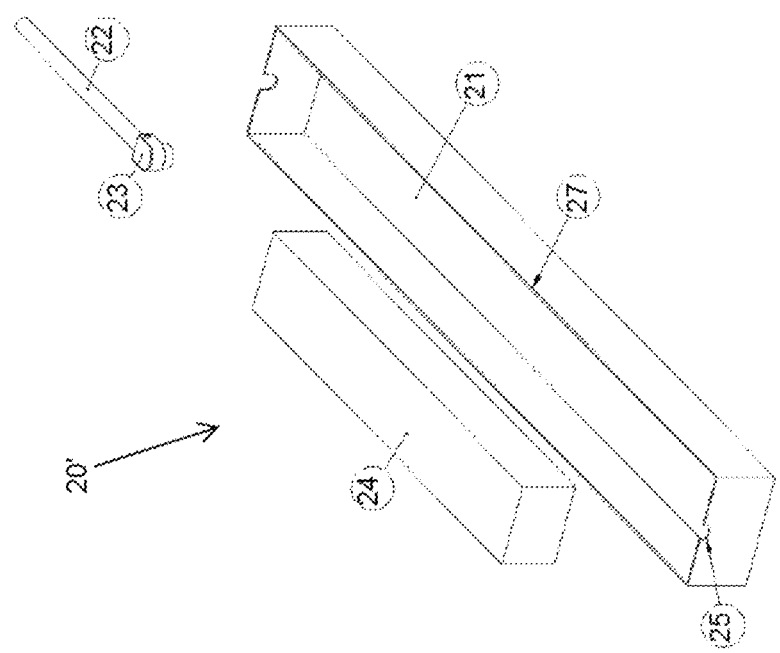
FIG. 18 illustrates an exploded perspective view of a third variant of the embodiment of FIGS. 16 and 17.

With reference to FIG. 18, there is illustrated an exploded perspective view of a third variant of the embodiment of FIGS. 16 and 17. In this embodiment, the heat sink 20' includes a volume defined by a base 21 and a retaining wall 27. An electronic device 24 is provided inside this volume. Coolant is delivered to the volume through pipe 22. However, rather than providing this coolant toward a lower portion of the volume, it is provided in an upper portion of the volume via a nozzle attachment 23. This may better control the direction of the coolant flow. A spout 25 at the other end of the volume from the coolant inlet tube 22 may again give direction to the flow of coolant. The other advantages associated with the spout 25 are also provided in this variant. With reference to FIG. 19, there is shown the exploded view of FIG. 18 with a nozzle part 3 removed. The nozzle need not be provided and coolant may flow directly from the end of the tube.

Figure 20:
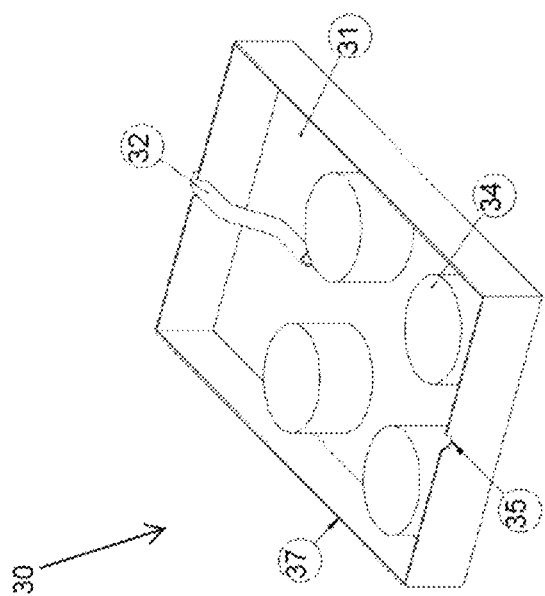
FIG. 20 depicts a perspective view of a third embodiment of a heat sink in accordance with the disclosure.

Referring to FIG. 20, there is depicted a perspective view of a third embodiment of a heat sink in accordance with the disclosure. This is similar to the second embodiment in that it comprises a base 31 and a retaining wall 37 to define a volume in which electronic devices 34 are provided. Coolant arrives in the volume via a pipe 32 and a spout 35 is provided at the other end of the volume from the pipe 32 for coolant to flow.

Figure 21:
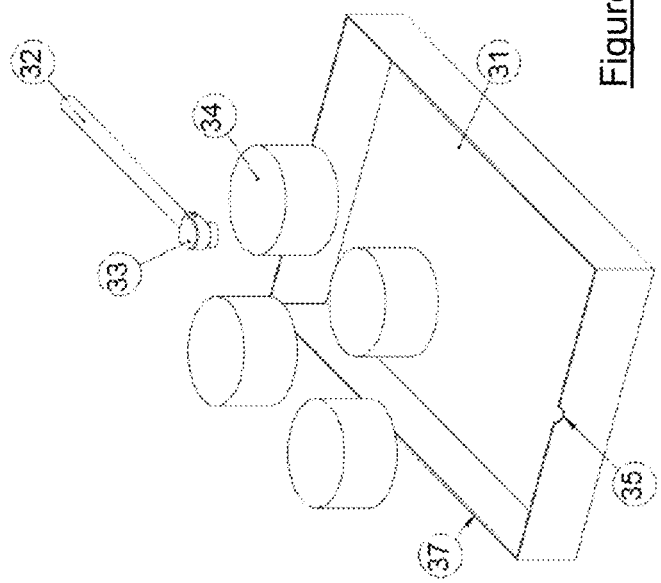
FIG. 21 illustrates an exploded perspective view of a variant of the embodiment shown in FIG. 20.

FIG. 21 illustrates an exploded perspective view of a variant of the embodiment shown in FIG. 20. Where the same features are shown, identical reference numerals are used. In this variant, the pipe 32 is provided with a nozzle attachment 33 and coolant is provided to an upper part of the volume defined by the base 31 and retaining wall 37. There will be a further variant of this provided, in which the nozzle attachment 33 is omitted.

A further generalised aspect of the present disclosure will now be considered. There may be provided a heat sink for an electronic device located in a cooling module and immersed in a liquid coolant. The heat sink has a wall arrangement to define an internal volume, in which the electronic device is mounted and in which the liquid coolant accumulates around the electronic device in operation, such that heat is transferred from the electronic device to the liquid coolant held in the internal volume. Optionally, the electronic device may further be provided, mounted within the internal volume. In the preferred embodiment, the electronic device is a power supply unit.

Typically, the wall arrangement comprises: a base, configured for mounting the heat sink within the cooling module; and a retaining wall extending from the base, the base and retaining wall defining the internal volume for accumulating the liquid coolant. The wall arrangement may therefore define an open-topped (or partially enclosed) cuboid-shaped or prism-shaped structure. In particular, the base or a surface of the base defining the internal volume is planar. For example, the surface of the base may lie flat against a surface of a container in which the heat sink is mounted as a result. A planar base surface may also allow the electronic device to lie flat against the base within the internal volume, especially if the electronic device also has a planar surface on which it is mounted.

Optionally, the base may be provided by a surface of the container housing the cooling module or a circuit board within the cooling module. Additionally or alternatively, part or all of the retaining wall may be formed by a side of the container housing the cooling module or a circuit board within the cooling module. The base and/or retaining wall may thereby not need to be a separate part of the heat sink, but may be integrated with other parts or components of the cooling module.

As described with respect to other aspects or embodiments of the disclosure, the wall arrangement is beneficially arranged such that a level of liquid coolant held within the internal volume is higher than a level of coolant external the internal volume. The advantages (and optionally, the implementation) of this are generally the same as for the other embodiments or aspects.

In the preferred embodiment, the wall arrangement further defines a spout. This may to allow the liquid coolant to flow out of the internal volume. It may also (at least partially) define the flow of liquid coolant through and/or within the internal volume of the heat sink. The spout may be a cut-out in the wall arrangement or retaining wall, for instance.

In addition, there may considered a cooling module for an electronic device, comprising: a container, for housing the electronic device such that the electronic device can be at least partially immersed in a liquid coolant; and the heat sink as described herein with reference to this aspect. The cooling module may be further configured for causing the liquid coolant to flow within the container, in particular by comprising a pump (although alternatives as discussed elsewhere herein may be used instead). In addition, the cooling module may comprise at least one pipe, arranged to receive pumped liquid coolant and having an outlet, from which the flowing or pumped liquid coolant is directed into the internal volume of the heat sink.

The internal volume may be elongated in shape (for example having a rectangular profile). First and second end portions at opposite extremities of the elongated internal volume may thereby be defined. Then, the outlet of the pipe is preferably located at the first end portion and the spout is preferably located at the second end portion. This may promote the flow of liquid coolant along the elongated dimension of the internal volume, to allow more efficient contact with the electronic device.

In some embodiments, the outlet is located in an upper half of a height of the internal volume (in other words, a top half of the internal volume). This may direct the flow of liquid coolant better than if the outlet is located in a lower half. In other embodiments, the outlet is located in a lower half of a height of the internal volume. This may improve efficiency compared with providing the outlet in an upper half, since the coolest coolant may have longer contact with the electronic device. In less preferred embodiments, the outlet is located around halfway of the height of the internal volume.

The outlet of the pipe may comprise one or more nozzles, each nozzle being configured to direct the flowing or pumped liquid coolant to a respective part of the internal volume. For example, this arrangement may resemble (and/or be implemented similarly to) that described with respect to other embodiments or aspects of the disclosure. For instance, each of the one or more nozzles may be configured to push fit couple to a respective end of the at least one pipe.

The liquid coolant is advantageously a primary liquid coolant. Then, the cooling module may further comprise a heat exchanger, configured to receive a secondary liquid coolant and to transfer heat from the primary liquid coolant to the secondary liquid coolant. Details of the primary and secondary liquid coolants have been discussed above, with reference to other aspects. The pump may be configured to cause the liquid coolant to flow to and/or from the heat exchanger. The one or more nozzles are preferably arranged to receive the primary liquid coolant from the heat exchanger.

Although specific embodiments have now been described, the skilled person will appreciate that various modifications and alternations are possible. The design of the container 110 may be different in shape and/or structure, from that indicated (for example, it may not be cuboid). Any of the thermally conductive parts of the design disclosed herein may be formed using any thermally conductive material, such as copper or aluminium. Different plantings or coatings could be used to improve thermal performance such a gold plating. Different material constructions could be used such as laser sintered, honey cone or foams to increase the surface area.

With reference to the heat sink 1, the base structure may be different. For example, mount 16 may be provided in a different way. Substrate 17 need not be planar. Alternatives to fixing screws 13 may be considered, such as adhesive, rivets or other attachments forms. Retaining wall 17, 37 may be provided as a single (integral) wall or multiple walls. The shape and/or size of retaining wall 17, 37 may also be adjusted.

The design of heat sink 20 may also be varied, with different shapes, sizes and/or implementations. For instance, it may be formed using multiple retaining walls and/or with a non-planar base. The base 120 and retaining wall 27 (or variants thereof) may be integral or separate components. It is typical for electronic devices or components, such as high temperature component 12 and electronic device 24 to have at least one (or some or all) planar surfaces, especially the surface on or to which the heat sink is mounted, placed or fixed (an attachment surface). However, the aspects of the disclosure can readily be adapted to be used with electronic devices and/or components that do not have planar surfaces. For example, the attachment surface can have bumps, be curved, comprise points (for example, shaped as a triangle or other polygonal shape).

Alternative electronic devices from those shown as high temperature component 12 and/or electronic device 24 may be used, for example having different shapes, structures or applications. In some embodiments, no low temperature component 10 may be provided and/or there may be a different design of (or indeed, no) circuit board 15. The layout of circuit boards 15 and/or components may be varied significantly. For instance, the position of electronic device 24 may be different from that shown.

Flow of liquid coolant within the container is preferably achieved using pumps 11. However, there may be more or fewer pumps than shown and indeed, only pump may be provided in some embodiments. Alternatively, the flow of liquid coolant may be achieved and/or encouraged without any pumps. For example, this is possible if the configuration of the container 110 and/or the liquid coolant permits flow of liquid coolant in some other way. One approach is to use the natural consequence of operation of the cooling module: when the electronic components and/or devices are operative, they cause the liquid coolant to heat and convect. Convection of the liquid coolant will cause it to flow. Suitable orientation or design of the container 110 may allow the convective flow of liquid coolant to circulate within the container 110. The flow of liquid coolant may then be further encouraged by baffle plates or other suitable constructions within the container 110. Other designs causing the liquid coolant to flow will also be suitable.

The heat sink arrangements of a further aspect of the disclosure are designed to fit on or around a heat-generating electronic device (for cooling) mounted on a printed circuit board (PCB) that is vertically oriented. Features of this aspect may also be applied to other aspects disclosed herein, where applicable. The electronic device may be a processor, application specific integrated circuit (ASIC) or other electronic device with a significant heat output in operation. The printed circuit board of this aspect is mounted within a container of a cooling module (sometimes termed a 'blade', not shown in the following drawings) and may be, for example, a daughter board mounted on (or adjacent to) a motherboard that is horizontally mounted in the container. The terms vertical and horizontal as used herein refer to a container of a cooling module with a floor and sidewalls extending from the floor. Horizontal implies parallel with the floor and vertical implies perpendicular to the floor (typically parallel to one or more sidewalls). Top implies distal the container floor and bottom implies proximate the container floor. The container of the cooling module may have a lid for sealing the internal volume of the cooling module.

With reference to FIG. 22A, there is shown an exploded front view of a fourth embodiment of a heat sink arrangement. The heat sink arrangement of comprises: a thermal interface material 41; heat sink projections part 42; retaining wall 46; and pipe 49. The heat sink projections part 42 comprises: a mounting surface part 42a (to be mounted on the thermal interface material 41 and in the absence of the thermal interface material 41, directly on a surface of the electronic device 43); and projections 44. Liquid coolant is provided through pipe 49 and passes into an internal volume formed by the retaining wall 46 and the mounting surface part 42a. The thermal interface material 41 thermally joins the heat sink projections part 42 to the electronic device 43. The retaining wall 46 may be formed from a thermally conductive material, such as a metal. The projections 44 are shown as linear fins in this embodiment, although a range of types of fins, pins or a combination of pins and fins can be used as alternatives. Also provided on the PCB 45 are additional devices 61, which in this case are random access memory (RAM) devices.

Referring to FIG. 22B, there is shown an assembled perspective view of the embodiment of FIG. 22A and with reference to FIG. 22C, there is shown an assembled side view of the embodiment of FIG. 22A. From these drawings, the relative positioning of the retaining wall 46 and pipe 49 can be seen. In use, liquid coolant is provided from pipe 49 and accumulates in the internal volume defined by the retaining wall 46 together with the mounting surface part 42a. Also shown in FIG. 22C is a normal operational liquid coolant level 54 for the container. The depth of the liquid coolant inside the container can remain low (lower than the height of the electronic device 43 and/or the retaining wall 46), as it is not required to submerge any of the electronic devices. Rather, the liquid coolant is held against the heat sink projections part 42 (which is thermally coupled to the electronic device 43 via the thermal interface material 41), with the top of the internal volume defined by the retaining wall 46 being open. This allows liquid coolant to spill over from the internal volume.

Reference is also made to FIG. 22D, in which there is shown an exploded back view of the embodiment of FIG. 22A. This further demonstrates the flow of liquid coolant from the pipe 49 into the internal volume defined by the retaining wall 46, via a set of coolant delivery holes 50 in the pipe 49. The positioning and spacing of the coolant delivery holes 50 may be set to deliver liquid coolant into specific parts of the internal volume, as desired. Other pipes (not shown) are used to deliver coolant to other components such as RAM 61 on the PCB 45.

Small holes 48 are provided in the base (that is bottom part) of the retaining wall 46 for liquid coolant. The size of these holes and/or the rate of flow of liquid coolant via the pipe 49 may be configured such that the liquid coolant is retained within the internal volume for at least a predetermined time duration. Such holes may also be applied to other embodiments and designs as herein described (with reference to FIGS. 3 and/or 16, for example) for a similar purpose.

In general terms, there may be considered a heat sink arrangement for an electronic device to be mounted on a surface in a container and in an orientation that is substantially perpendicular to a floor of the container. The heat sink arrangement comprises: a retaining wall configured to at least partially define an internal volume. The retaining wall cooperates (or is configured to cooperate) with a surface mounted on the electronic device (such as a plate or another surface, which may be planar or otherwise shaped), so that liquid coolant directed into the internal volume accumulates within the internal volume. The heat sink arrangement may further comprise a nozzle arrangement, arranged to receive liquid coolant and direct the liquid coolant into the internal volume of the heat sink. In particular, the internal volume may be defined and/or arranged such that is heat transferred from the electronic device to the liquid coolant accumulated in the internal volume. Optionally, the surface mounted on the electronic device is attached to retaining wall.

Advantageously, the retaining wall comprises a base part, oriented substantially parallel to the floor of the container. The retaining wall may further comprise the surface mounted on the electronic device (a mounting surface). The surface mounted on the electronic device and the retaining wall (or remainder of the retaining wall) advantageously cooperate (or are configured to cooperate) such that the internal volume has at least one opening (preferably distal to the floor of the container) to allow liquid coolant accumulated within the internal volume to leave. The heat sink arrangement may further comprise a thermal interface material arranged between the electronic device and the surface mounted on the electronic device.

The heat sink arrangement may further comprise projections extending into the internal volume from the retaining wall and/or a surface mounted on the electronic device (such as the mounting surface part). The projections optionally comprise pins and/or fins. The projections may extend in a direction perpendicular to a plane of the electronic device (particularly when the electronic device is substantially planar). In embodiments, the projections extend into the internal volume from a surface mounted on the electronic device, such as a mounting surface.

In some designs, the retaining wall comprises a sidewall part (which may include the base part), extending substantially parallel to the floor of the container. The retaining wall may then further comprise a mounting plate or mounting surface part, oriented substantially perpendicular to the floor of the container and arranged to fit with the sidewall part so as to at least partially define the internal volume. The mounting surface part or plate may be configured to mount adjacent to and/or on (particularly in thermal communication with) the electronic device. The mounting surface part or plate may therefore be the surface mounted on the electronic device.

The nozzle arrangement optionally comprises at least one nozzle located on a side of the internal volume distal from the floor of the container (a top of the internal volume). In some designs, the nozzle arrangement comprises a piping system forming at least one channel for liquid coolant to flow therethrough (for example, in the form of a pipe). Then, the at least one channel may have one or more holes, each acting as a nozzle for directing liquid coolant from the channel into the internal volume of the heat sink. The at least one channel is optionally oriented in a direction parallel to the floor of the container.

At least one aperture may be provided in the retaining wall (especially in a part of the retaining wall proximate the floor of the container) to allow coolant to flow through the retaining wall and leave the internal volume.

Figure 23E:
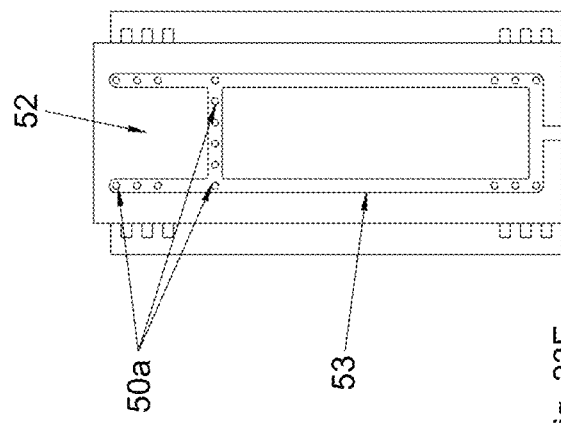
FIG. 23E shows a cross-sectional assembled view of the embodiment of FIG. 23A.

A fifth embodiment is now described with reference to FIGS. 23A to 23E. Referring next to FIG. 23A, there is shown an exploded front view of a fifth embodiment of a heat sink arrangement. Some aspects of this fifth embodiment are similar to the fourth embodiment and where the same components are shown, identical reference numerals are employed. The structure of the PCB 45, electronic device 43, heat sink projections part 42 and RAM 51 are the same as for the fourth embodiment.

The key difference is in the delivery of the liquid coolant. A panel 52 is mounted vertically facing the retaining wall 46a and other components on the board such as the RAM 51. Channels 53 are provided in the panel 52 and the channels are sealed by a plate 56. Referring to FIG. 23B, there is shown an assembled perspective view of the embodiment of FIG. 23A, in which the placement of the panel 52 over the retaining wall 46a and RAM 51 can be seen.

Figure 23D:
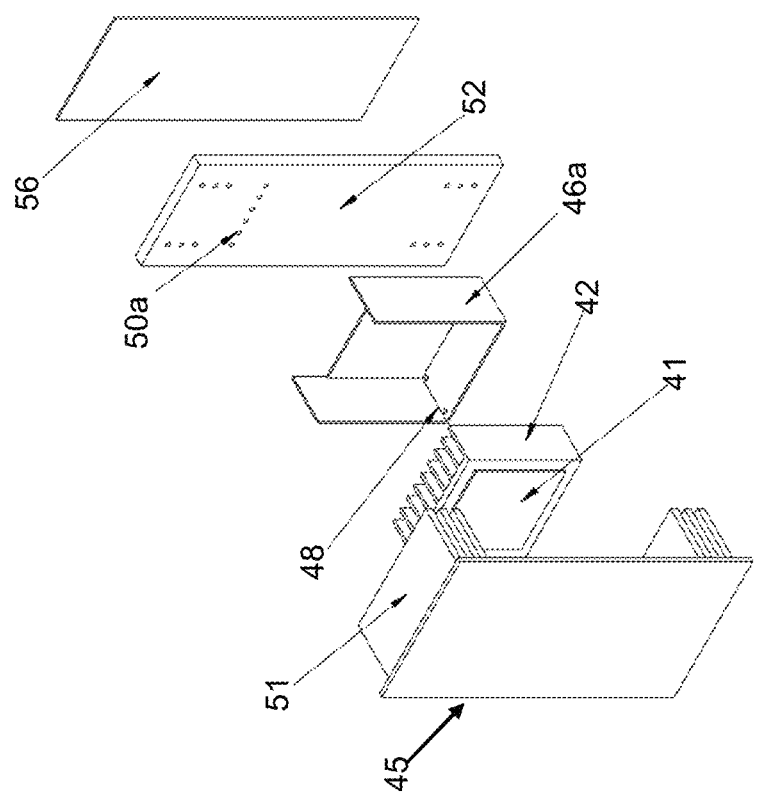
FIG. 23D shows an exploded back view of the embodiment of FIG. 23A.

Next, reference is made to: FIG. 23C, in which there is shown an assembled side view of the embodiment of FIG. 23A; FIG. 23D, showing an exploded back view of the embodiment of FIG. 23A; and FIG. 23E, which shows a cross-sectional assembled view of the embodiment of FIG. 23A. The channels 53 receive liquid coolant and distribute it via coolant delivery holes 50a. These pour or squirt a jet 55 of liquid coolant into the internal volume defined by the retaining wall 46a (and base part 42a) and onto other components on the board, such as RAM 51. The coolant delivery holes 50a can be tuned and repositioned to alter the coolant delivery. The assembly of panel 52 and plate assembly 56 can also be applied separately to the motherboard or other components.

The panel 52 may be electrically conducting and in equilibrium with the electronic components to dissipate any charge generated in the coolant delivery holes 50a. An extra panel 52 could be added to the other side of the PCB to cool any components mounted on the back side of the PCB.

Figure 23F:
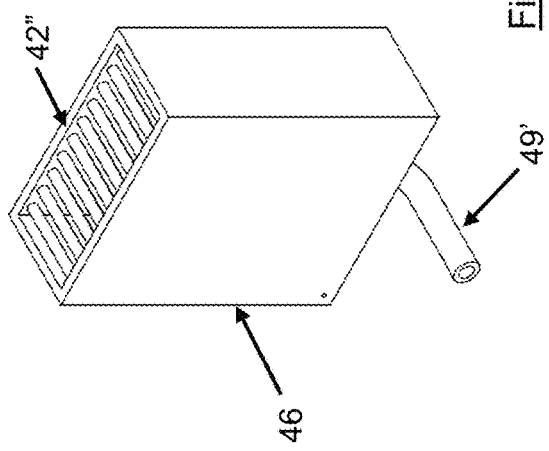
FIG. 23F shows an assembled perspective view of a first variant of the fifth embodiment.
Figure 23G:
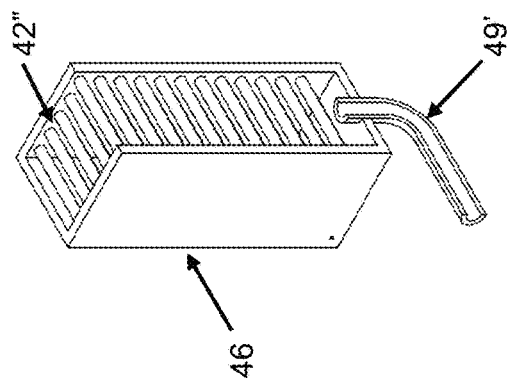
FIG. 23G shows a sectional view of the first variant of FIG. 23F.
Figure 23H:
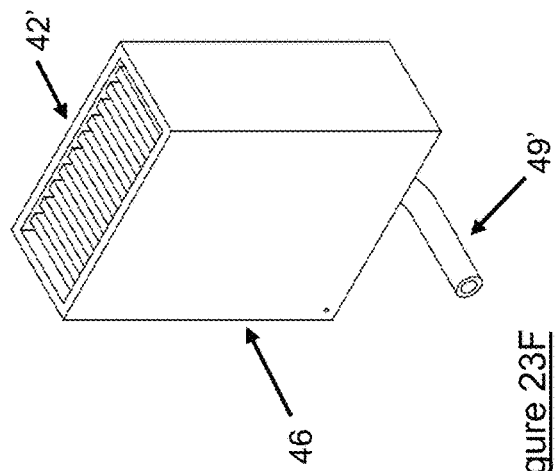
FIG. 23H shows an assembled perspective view of a second variant of the fifth embodiment.
Figure 23I:
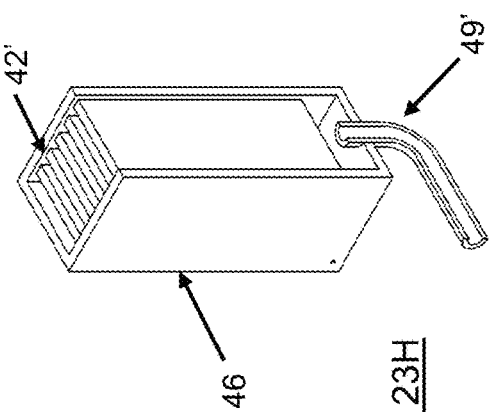
FIG. 23I shows a sectional view of the first variant of FIG. 23H.

With reference to FIG. 23F, there is shown an assembled perspective view of a first variant of the fifth embodiment. Visible in this drawing is retaining wall 46, which is similar or the same as shown in previously described embodiments. Heat sink projections part 42' comprises vertical fin projections. Pipe 49' is coupled directly to an opening within a lower base of the retaining wall 46. This is more visible with reference to FIG. 23G, in which there is shown a sectional view of the first variant of FIG. 23F. Pipe 49' may thereby provide coolant directly within the volume defined by the retaining wall 46. This is analogous to the design shown in FIG. 8A for instance. With reference to FIG. 23H, there is shown an assembled perspective view of a second variant of the fifth embodiment, which is similar to the design of FIG. 23F, but with pin projections forming heat sink projections part 42". In FIG. 23I, there is shown a sectional view of the first variant of FIG. 23H, in which the pipe 49' can be seen more clearly. In a further variant (not shown) to either of the two variants described now, the pipe 49' may be directly coupled to an opening or aperture in a side of the retaining wall 46.

In the general terms discussed above, it may be considered that the at least one channel is oriented in a direction perpendicular to the floor of the container. Additionally or alternatively, the piping system may comprises first and second panels, one or both of the first and second panels being shaped to form the at least one channel and the first and second panels being attached to each other to allow liquid coolant to flow through the at least one channel. One or more holes may be provided in the first or second panels (specifically in the at least one channel) to allow liquid coolant to flow from the at least one channel to the internal volume). An opening in the retaining wall (for example in along an edge of a part perpendicular to the floor of the container) may allow liquid coolant to enter the internal volume from one or more of the holes.

Figure 24:
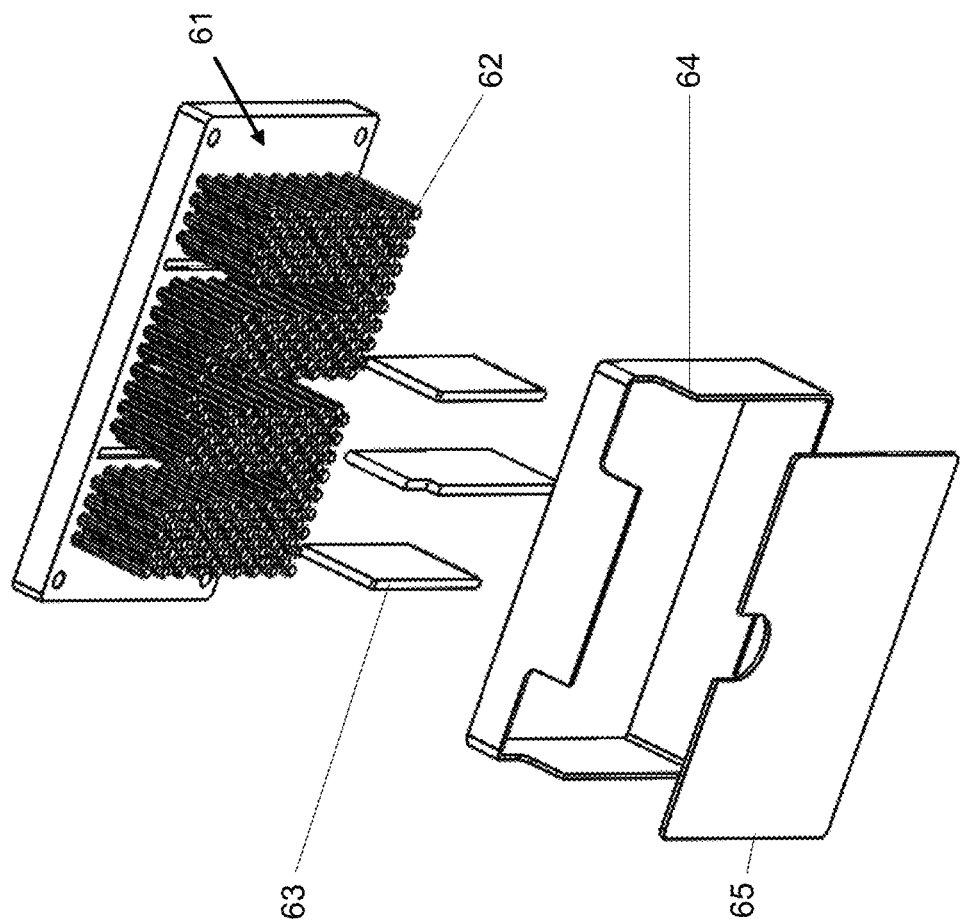
FIG. 24 shows an exploded front view of a sixth embodiment of a heat sink arrangement in accordance with the disclosure.

Referring now to FIG. 24, there is shown an exploded front view of a sixth embodiment of a heat sink arrangement in accordance with the disclosure. For this embodiment, only the components making up the heat sink are shown. It will be understood from the fourth and fifth embodiments described herein how the heat sink is fitted and/or coupled to the electronic device and any other components within the coolant module (for example, with reference to the use of a thermal interface material). The heat sink arrangement comprises: a mounting surface part 61; projections (in the form of pins) 62; baffles 63; retaining walls 64 and cover part 65.

The pattern of pins 62 and baffles 63 on the mounting surface part 61 create two symmetrical channels for the flow of liquid coolant. The retaining walls 64 and cover part 65, together with the mounting surface part 61 define an internal volume for the heat sink. The liquid coolant is provided to the internal volume using the nozzle arrangement of the fourth and/or fifth embodiment (as described above) or an alternative. In this way, liquid coolant flows into the internal volume either in parallel or perpendicularly to the vertically orientated PCB. The liquid coolant is delivered to the internal volume towards its top and centre. In this way, the liquid coolant is caused to flow to both channels. This forces the liquid coolant down to the bottom of the pins 62 before coming back up and exiting the internal volume from the top side part (corner). Beneficially, this ensures that the liquid coolant touches a larger (and potentially the largest possible) surface area of the electronic device and/or surface mounted on or thermally coupled to the electronic device (such as the mounting surface part 61) and also forces the liquid coolant to flow past and cool the entire surface of the electronic device.

This can be combined with the other embodiments disclosed herein or variants thereof. For example, the way in which the liquid coolant is provided to the internal volume can be implemented in accordance with the fourth embodiment, fifth embodiment or a combination thereof.

Figure 25A:
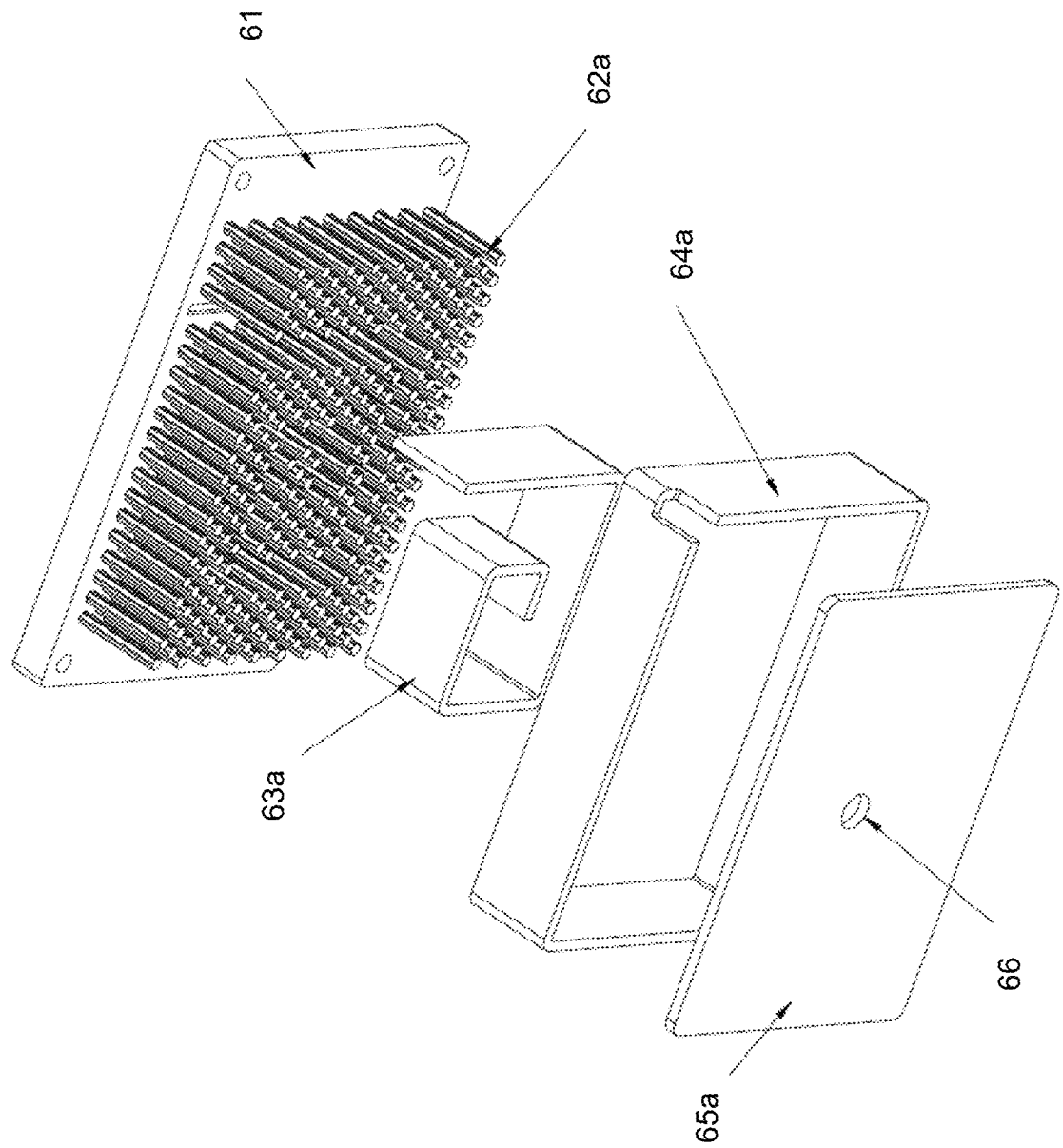
FIG. 25A shows an exploded front view of a first variant of the embodiment of FIG. 24.

Referring next to FIG. 25A, there is shown an exploded front view of a first variant of the embodiment of FIG. 24. Like the embodiment of FIG. 24, the heat sink arrangement comprises: a mounting surface part 61; projections (in the form of pins) 62a; baffle 63a; retaining wall 64a; and cover part 65a. Apart from the mounting surface part 61, the configuration and/or structure of the other components varies from that shown in FIG. 24. In particular, a single spiral-shaped baffle 63a is shown in FIG. 25A. Adaptations are made to pins 62a and retaining wall 64a to accommodate the design of the baffle 63a. The mounting surface part 61, retaining wall 64a and cover part 65a cooperate to define an internal volume. Moreover, the cover part 65a includes a hole 66, which can act as an inlet or nozzle for receiving liquid coolant and/or directing liquid coolant into the internal volume. The liquid coolant is directed into the internal volume from a central portion of the cover part 65a (in terms the width and/or height dimensions of the cover part 65a).

Figure 25B:
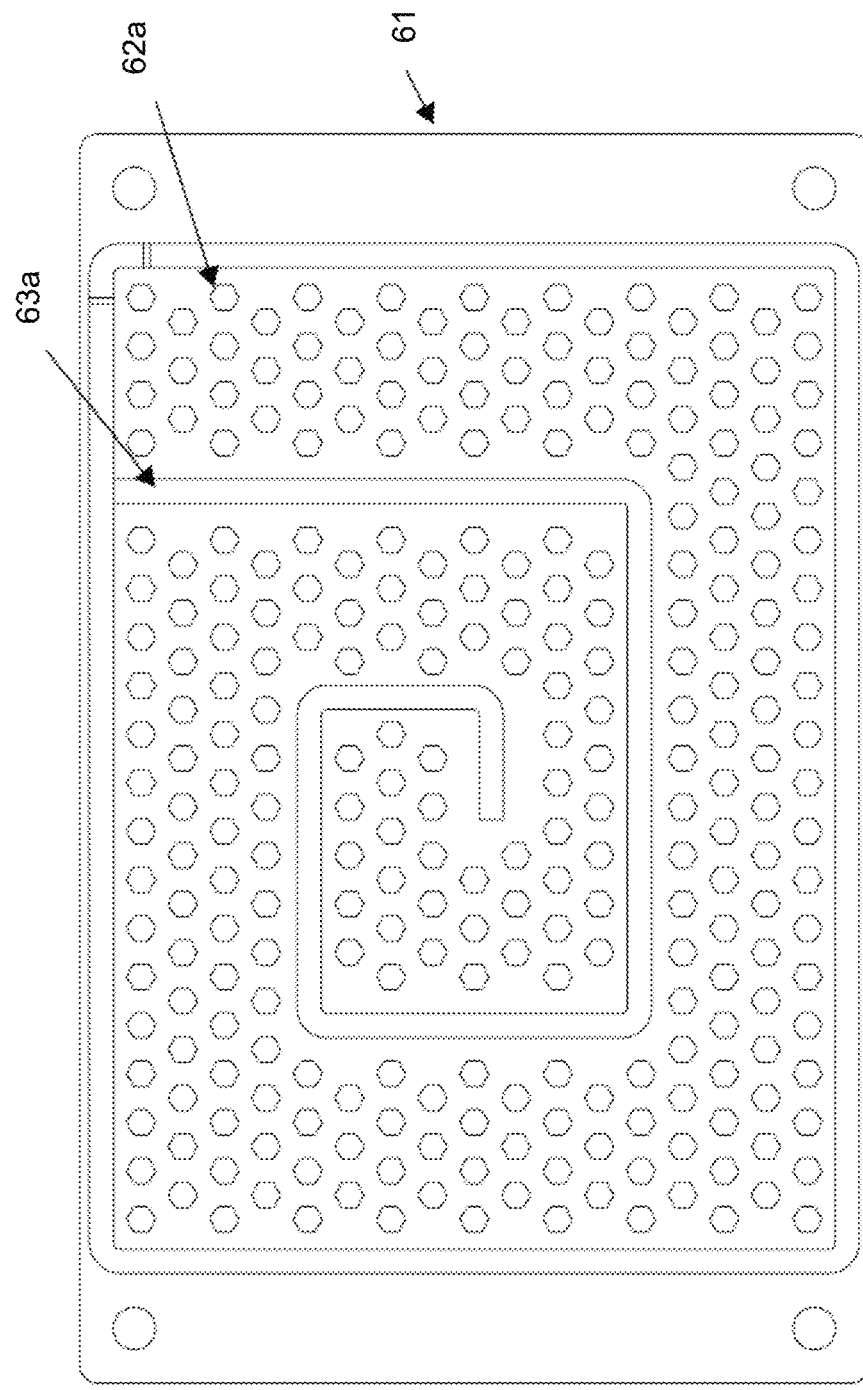
FIG. 25B depicts a front view of a portion of the embodiment of FIG. 25A in assembled form.

With reference to FIG. 25B, there is depicted a front view of a portion of the embodiment of FIG. 25A in assembled form. The liquid coolant enters the internal volume perpendicular to a central portion of the area of the mounting surface part 61 within the internal volume. It can therefore be seen how the liquid coolant is caused to travel around the spiral path formed by the baffle 63a and therefore pass through all of the internal volume, before leaving the internal volume.

Figure 26A:
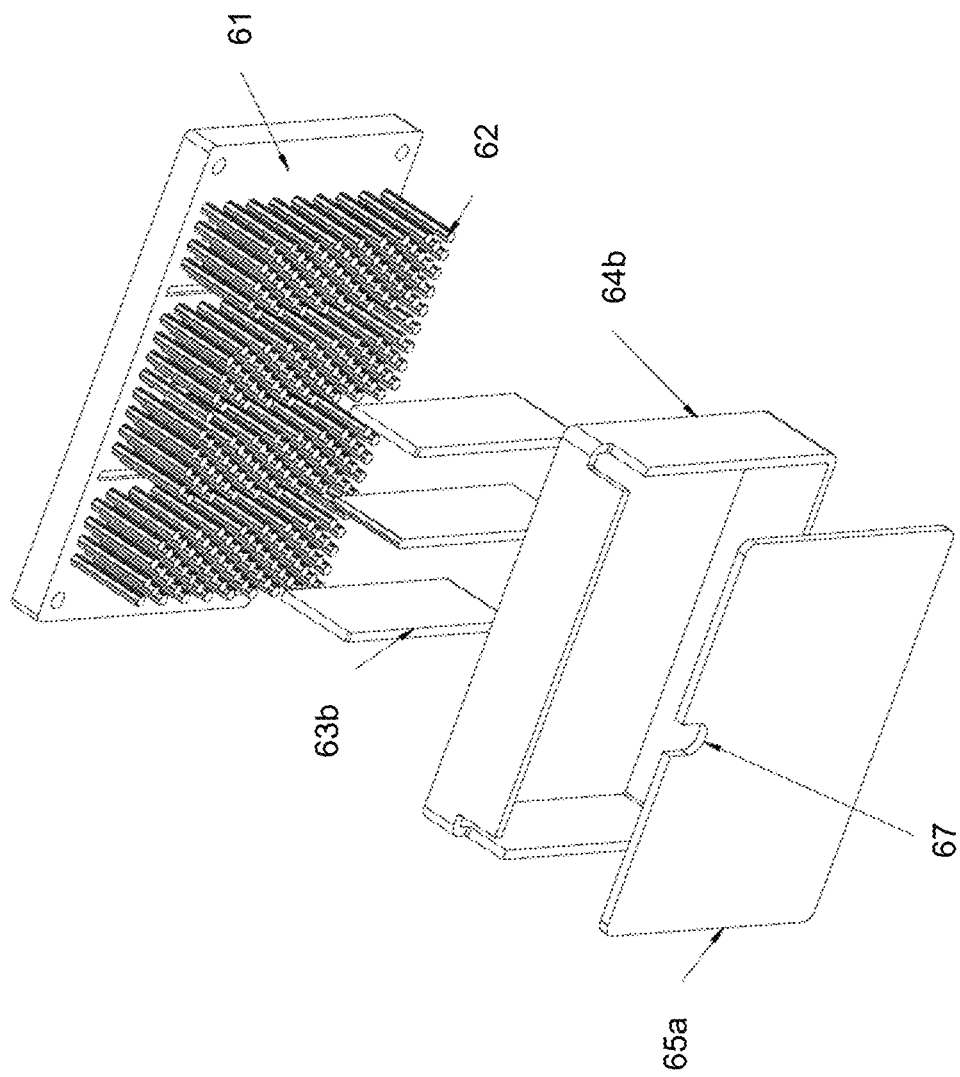
FIG. 26A shows an exploded front view of a second variant of the embodiment of FIG. 24.

Next, reference is made to FIG. 26A, in which there is shown an exploded front view of a second variant of the embodiment of FIG. 24. As for the embodiment of FIG. 24, the heat sink arrangement comprises: a mounting surface part 61; projections (in the form of pins) 62; baffles 63b; retaining wall 64b; and cover part 65b. Apart from the mounting surface part 61 and pins 62, the configuration and/or structure of the other components varies from that shown in FIGS. 24, 25A and 25B. The baffles 63b are similar to the baffles 62 shown in FIG. 24, however.

The main changes are to the retaining wall 64b; and cover part 65b. In particular, the cover part 65b includes an opening 67, which can act as an inlet or nozzle for receiving liquid coolant and/or directing liquid coolant into the internal volume. The liquid coolant is directed into the internal volume from a top, central portion of the cover part 65a (top in terms its height and central in terms of its width).

Figure 26B:
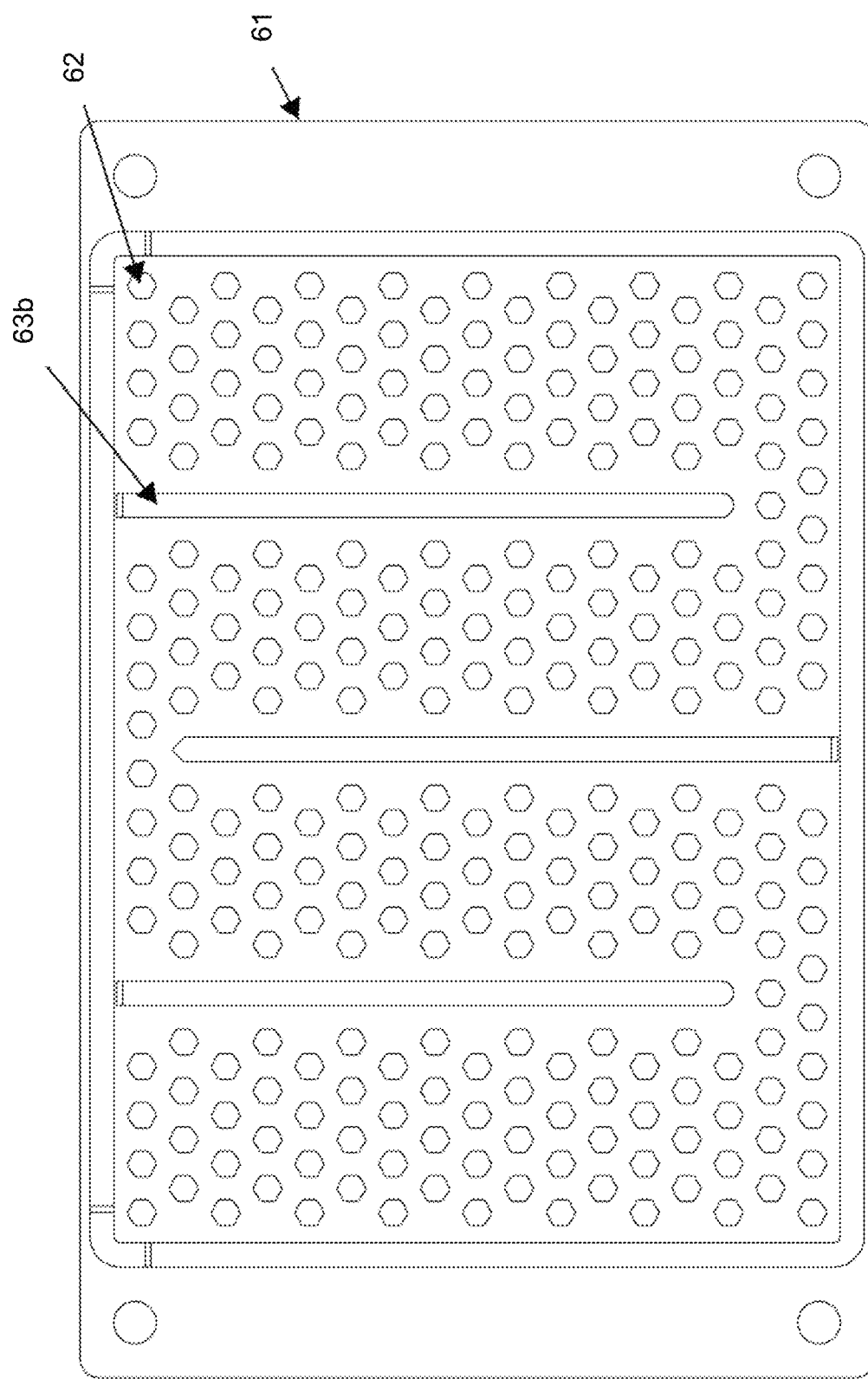
FIG. 26B depicts a front view of a portion of the embodiment of FIG. 26A in assembled form.

Now referring to FIG. 26B, there is depicted a front view of a portion of the embodiment of FIG. 26A in assembled form. This configuration is similar (or the same) as the corresponding configuration for the embodiment of FIG. 24 (with the baffles forming two channels for the flow of liquid coolant within the internal volume). In the design of FIG. 24, liquid coolant is directed into the internal volume downwards; that is, in a direction substantially perpendicular to the floor of the container. In contrast, the embodiment of FIG. 26A directs liquid coolant into the internal volume sideways; that is, in a direction substantially parallel to the floor of the container. In both embodiments, liquid coolant is directed into the internal volume from a top of the internal volume (distal the floor of the container). In particular, the coolant is directed into a central part of the internal volume, in terms of its width (the dimension parallel to the floor of the container).

In the general terms previously discussed, the retaining wall may be considered to comprise a sidewall part (which may include the base part), extending substantially parallel to the floor of the container. The retaining wall may then further comprise a cover part, oriented substantially perpendicular to the floor of the container and arranged to fit with the side wall part so as to define the internal volume. The sidewall part and the cover part may be separable. Such certain embodiments may be combined with the mounting surface part, as described above.

In embodiments, the projections comprise one or more baffles, configured to direct the flow of liquid coolant within the internal volume. For example, the one or more baffles may be configured to cause the liquid coolant to flow (for instance, under gravity) to a first part of the internal volume proximate the floor of the container and subsequently to flow to a second part of the internal volume distal the floor of the container. This may allow for circulation of the liquid coolant around the internal volume, in particular making use of gravity to promote movement of the liquid coolant. Additionally or alternatively, the one or more baffles are advantageously configured to cause the liquid coolant to flow from a more central part of the internal volume to a more outer part of the internal volume, in particular before leaving the internal volume. In some designs, the one or more baffles are configured to cause the liquid coolant to flow in a channel of serpentine and/or spiral shape.

In certain embodiments, the one or more baffles are configured such that liquid coolant received into the internal volume of the heat sink from the nozzle arrangement flows through two distinct flow paths. Especially when liquid coolant is directed into the internal volume from its top (distal the floor of the container), this may allow coolant to reach all parts of the internal volume, particularly the surface area adjacent the electronic device within the internal volume. Each of the two distinct flow paths may be generally symmetrical or asymmetrical, depending on the electronic device and other configuration aspects.

The position of the nozzle may be at the top of the internal volume or in a central part of a surface area of the internal volume (particularly along a dimension perpendicular to the floor of the container). Preferably, the nozzle is positioned to direct liquid coolant to a central part of the internal volume along a dimension of the internal volume parallel the floor of the container (particularly the longer such dimension). The nozzle position optionally allows liquid coolant to be directed to the hottest part of the internal volume in operation.

It will be understood that the heat sink arrangements of the disclosure are mounted in a tank. Details of possible tank (container or cooling module) configurations may be found as discussed above with reference to FIGS. 1 to 21, as well as in International Patent Publication Numbers WO2018/096362 and WO2018/096360. The tank (sometimes termed a "blade") is typically a generally cuboid-shaped container defining a volume inside for holding one or more electronic devices, at least one of which is vertically mounted, as well liquid coolant. Such a tank configuration typically includes one or more: pumps; heat exchangers, for transferring heat from the liquid coolant as a primary coolant to a secondary coolant external the tank; and piping systems for transferring liquid coolant within the container volume. The container is normally sealed to prevent leakage of liquid coolant from within. The quantity of liquid coolant within the container is typically not sufficient to cover the electronic device when the liquid coolant is not being pumped and settles within the container (and this condition may also apply to some, most or preferably all electronic devices mounted horizontally within the container, nearer the container floor than any vertically-mounted electronic devices). This is referred to as immersion liquid cooling and contrasts with submersion cooling, in which the level of coolant is sufficient to cover the electronic device when the liquid coolant is not being pumped and settles within the container. The use of a heat sink arrangement in accordance with the disclosure creates multiple levels of liquid coolant in operation, thereby directing liquid coolant for improved heat transfer efficiency.

A number of benefits are realised by such immersion cooling. Firstly, since less dielectric coolant is being used and this coolant can be expensive, costs can be significantly reduced. Dielectric liquid coolants are typically very heavy. By using less liquid coolant, the tank can be more straightforward to install and/or lift. Also, installing the tank can require less infrastructure. In addition, the tank may be easier to handle than similar devices or systems using significantly more primary liquid coolant. The level of the primary liquid coolant within the majority of the container is not close to the top of the container. As a result, spillages during maintenance or exchange of components are less likely. The risk of leakage is also reduced.

Figure 27A:
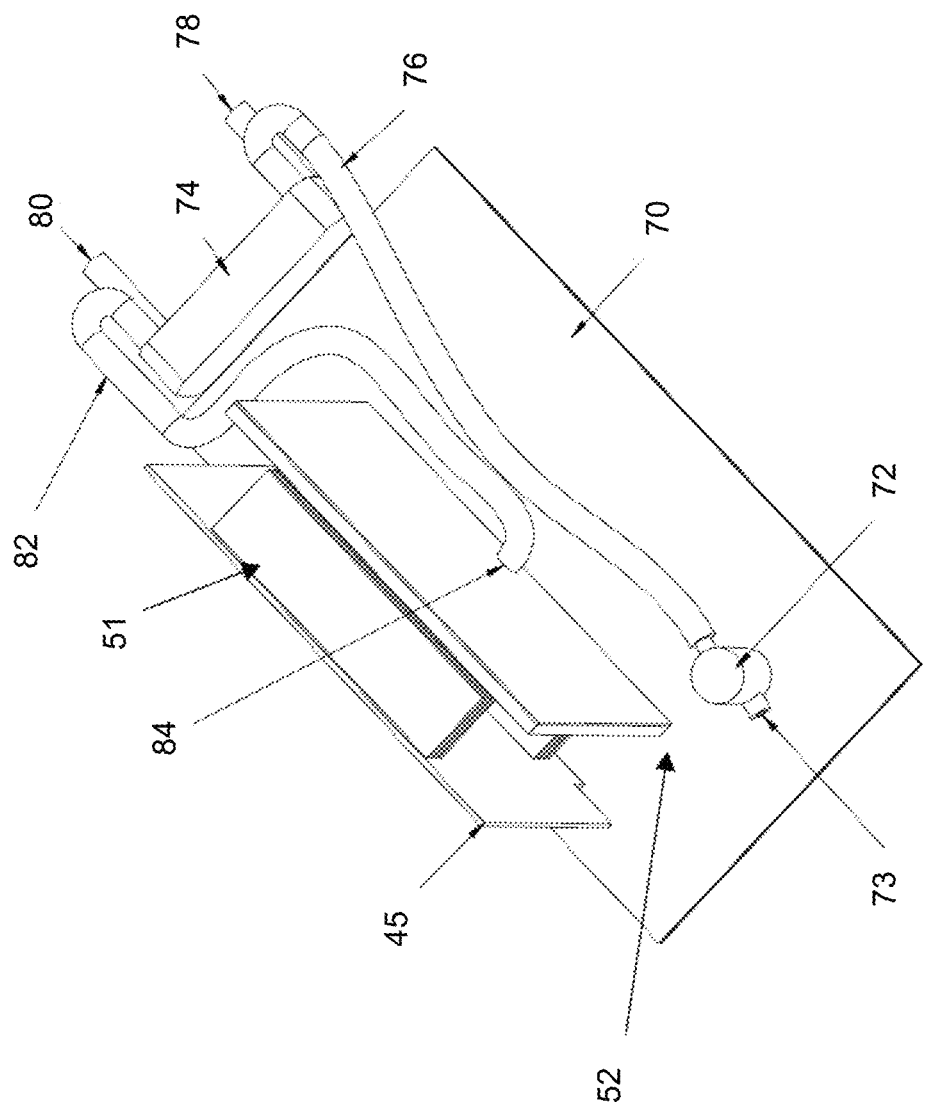
FIG. 27A illustrates a heat sink arrangement assembled with further parts to show flow of liquid coolant.

Reference next is made to FIG. 27A, in which is illustrated a heat sink arrangement assembled with further parts to show flow of liquid coolant. In the heat sink arrangement, there are shown a vertical PCB 45, RAM devices 51 and panel 52 for directing liquid coolant to the internal volume of the heat sink arrangement and/or the RAM devices 51. Thus, the heat sink arrangement may be in accordance with that shown in FIGS. 23A, 23B, 23C, 23D and 23E. The heat sink arrangement and other parts are mounted on a substrate 70, which in some embodiments is a motherboard, base board or carrier board. The vertical PCB 45 slots into the substrate 70. Multiple such vertical PCBs may optionally be provided. In some embodiments, the substrate 70 may be omitted.

The other parts include: pump 72; and heat exchanger 74. Liquid coolant (for within the container, referred to as "primary" coolant) is received at pump 72 via a primary coolant inlet 73 and the pump directs the liquid coolant to the heat exchanger via first pipe 76. The primary liquid coolant is cooled at the heat exchanger and the cooled primary liquid coolant is transported through second pipe 82, to a panel inlet 84 of the panel 52, where it is directed into the internal volume of the heat sink arrangement and/or onto the RAM devices 51.

The heat exchanger 74 includes a secondary coolant inlet 78, for receiving secondary coolant (which is normally a liquid, for example water that may come from a main supply of the building) and a secondary coolant outlet 80. The secondary liquid coolant receives heat from the primary liquid coolant through the heat exchanger 74 and cools the primary liquid coolant thereby. The secondary coolant carrying the heat leaves the heat exchanger (and optionally the container) through the secondary coolant outlet 80.

Figure 27B:
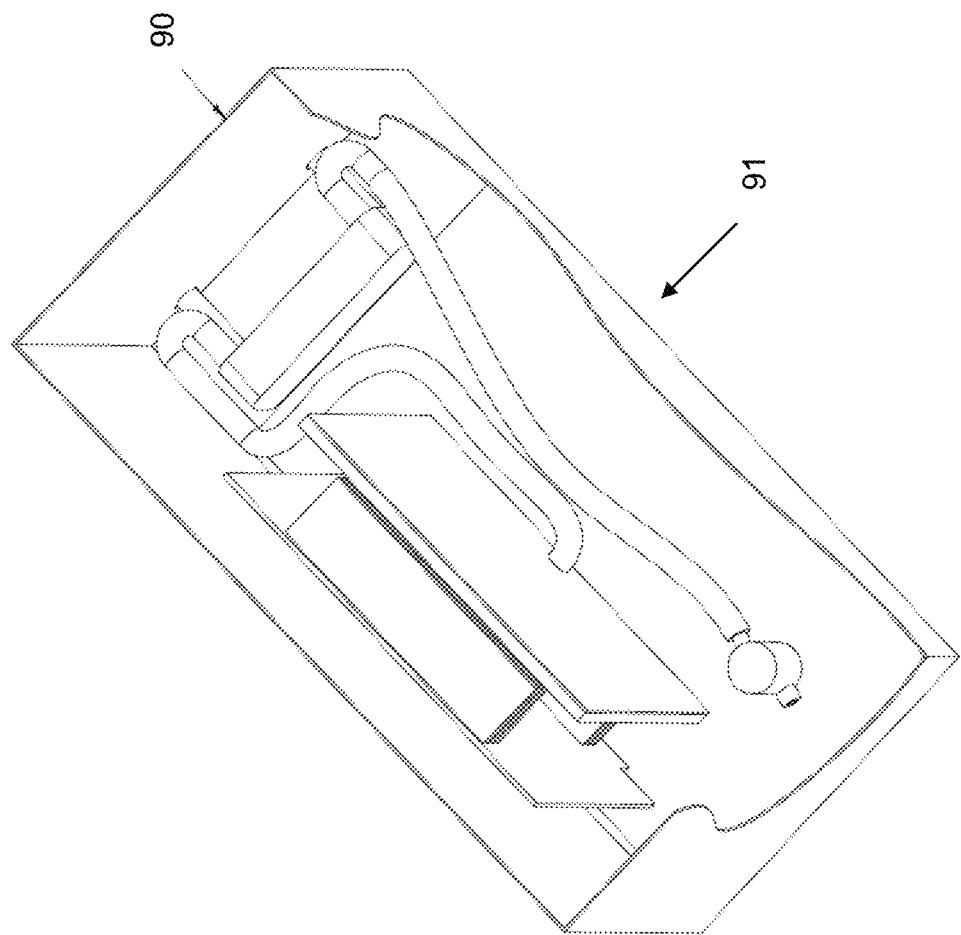
FIG. 27B shows a cutaway view of the embodiment of FIG. 27A within a container.

Referring to FIG. 27B, there is shown a cutaway view of the embodiment of FIG. 27A within a container. The sidewall 90 and floor 91 of the container can be seen. In some designs, a substrate 70 may be omitted and the PCB 45 (or equivalent) may be mounted on the floor 91 or on the sidewall 90.

Figure 28A:
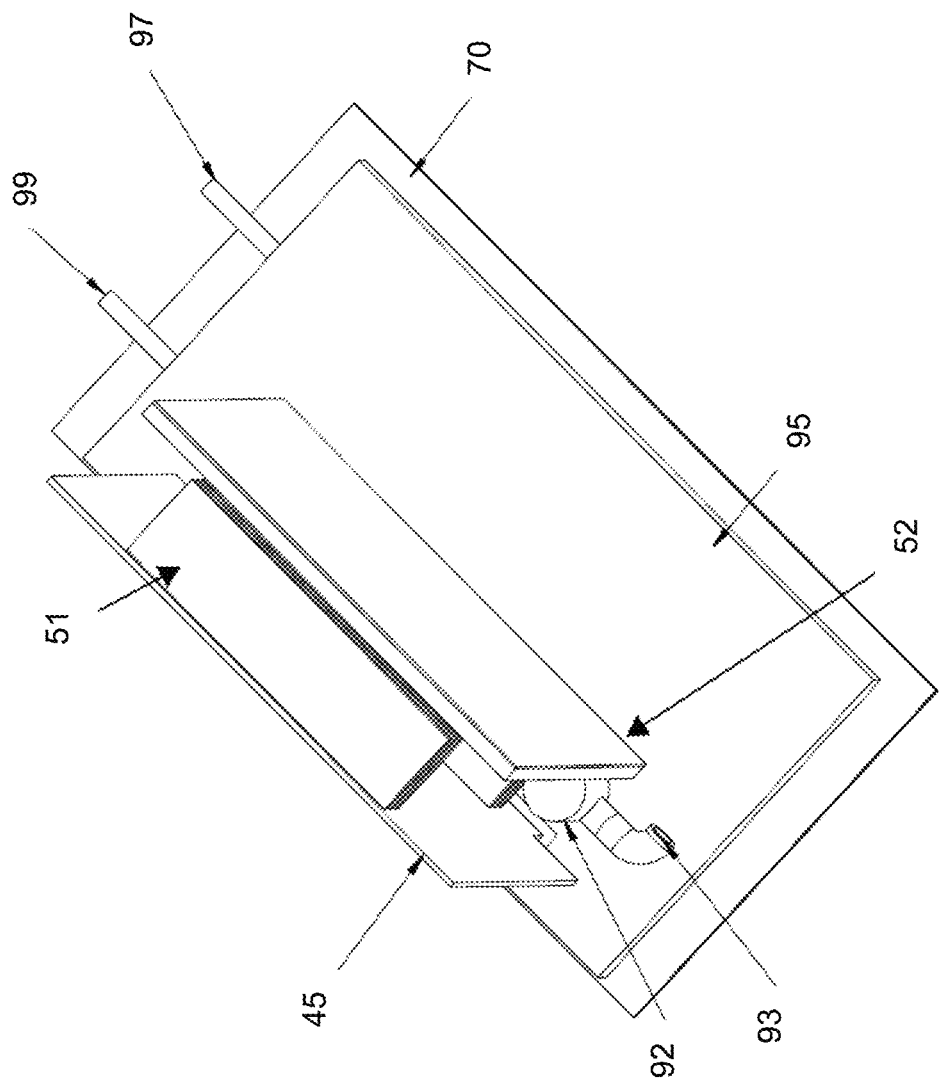
FIG. 28A illustrates a heat sink arrangement assembled with further parts in a variant on FIG. 27A.

Next referring to FIG. 28A, there is illustrated a heat sink arrangement assembled with further parts in a variant on FIG. 27A. There are some similarities with the design shown in FIG. 27A, particularly that the heat sink arrangement comprises a vertical PCB 45, RAM devices 51 and panel 52 for directing liquid coolant to the internal volume of the heat sink arrangement and/or the RAM devices 51 (in accordance with that shown in FIGS. 23A, 23B, 23C, 23D and 23E). Also, the heat sink arrangement and other parts are mounted on a substrate 70, which may be a motherboard, base board or carrier board. A hole through the cold plate 95 enables the vertical PCB 45 to mount to the substrate 70. Multiple such PCBs may optionally be provided.

A pump 92 with a primary coolant inlet 93 for receiving primary liquid coolant is also provided. The pump directs the liquid coolant to the panel 52, where it is directed into the internal volume of the heat sink arrangement and/or onto the RAM devices 51.

A major difference is in the form of the heat exchanger, which is provided as a cold plate 95. The major surface (conduction surface) of the cold plate 95 acts as a thermal conductor to transfer heat from the primary liquid coolant in contact with the surface to a secondary coolant (which is advantageously a liquid, such as water, for example from a main supply of the building). The cold plate 95 includes a secondary coolant inlet 97 and a secondary coolant outlet 99, for receiving secondary coolant (which is normally a liquid, for example water that may come from). The secondary liquid coolant receives heat from the primary liquid coolant through the cold plate 90 and cools the primary liquid coolant by transferring the heat to the secondary coolant (which may pass in pipes or channels adjacent the conduction surface of the cold plate 90. The secondary coolant carrying the heat leaves the cold plate (and optionally the container) through the secondary coolant outlet 99.

Figure 28B:
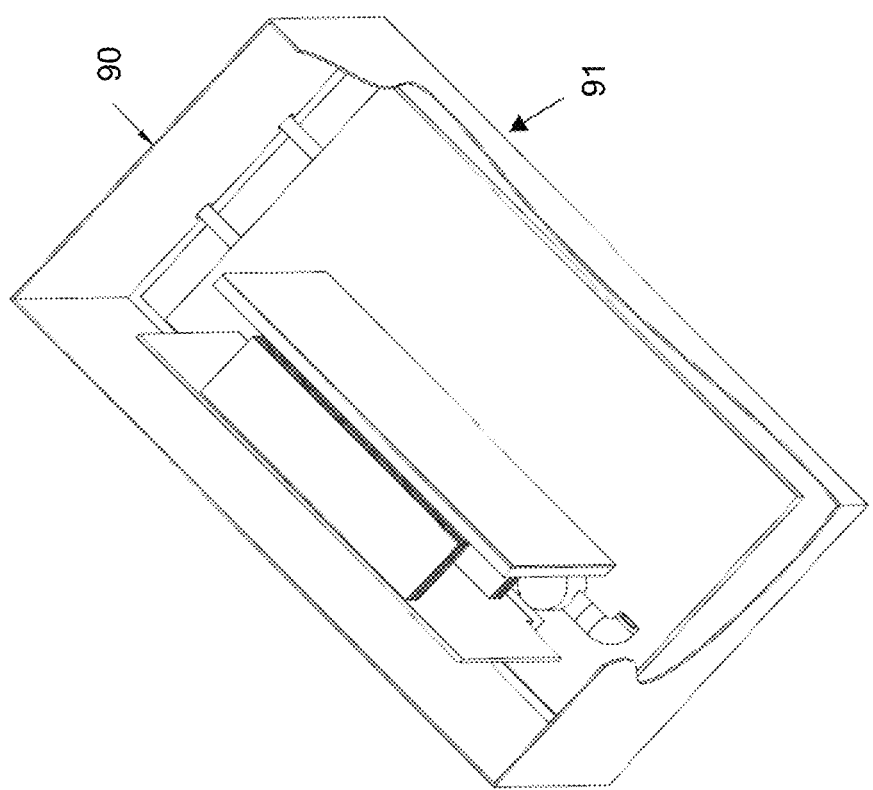
FIG. 28B shows a cutaway view of the embodiment of FIG. 28A within a container.

Now referring to FIG. 28B, there is shown a cutaway view of the embodiment of FIG. 28A within a container. Again, the positioning of the arrangement with reference to the sidewall 90 and floor 91 of the container can be seen. In alternative embodiments, a substrate 70 may be omitted and the cold plate 95 may be mounted on the floor 91 or on the sidewall 90. The hole in the cold plate 95 may then not be needed.

In general terms, there may therefore be considered a cooling module for an electronic device, comprising: a container, having an internal surface defining the floor and defining a volume for housing the electronic component in an orientation that is substantially perpendicular to the floor; and a heat sink arrangement as herein disclosed, mounted within the volume of the container. The cooling mode may also include the electronic device mounted within the volume of the container. The electronic device may be mounted on a printed circuit board, oriented substantially perpendicular to the floor of the container. The printed circuit board is optionally a daughter board, which may be coupled to a motherboard oriented (and preferably mounted within the container) substantially parallel to the floor of the container.

In preferred embodiments, the nozzle arrangement is arranged to receive flowing liquid coolant and direct it to the internal volume of the heat sink arrangement. For example, the nozzle arrangement may be arranged to direct the flowing liquid coolant to a part of the internal volume of the heat sink arrangement adjacent the hottest part of the electronic device. In some embodiments, the nozzle arrangement comprises a plurality of nozzles, each nozzle being configured to direct the flowing liquid coolant to a respective part of the internal volume of the heat sink arrangement adjacent a part of the electronic device having a temperature above a threshold level.

The cooling module may further comprise a pump configured to cause the liquid coolant to flow within the container. At least one pipe may be arranged to transport liquid coolant from the pump to the nozzle arrangement.

Although specific embodiments have now been described, the skilled person will appreciate that various modifications and alternations are possible. For example, the nozzle arrangement can be varied in terms of the number, type, shape and/or style of the nozzles provided. Multiple nozzles may be used to direct liquid coolant to particularly hot parts of the internal volume in operation. Liquid coolant may be transported to multiple nozzle arrangements, each for a respective separate heat sink arrangement. This may be done in parallel. Alternatively, the nozzle arrangements for separate heat sink arrangements may be coupled in series, in a so-called 'daisy chain' configuration. A pipe delivering coolant to the first heat sink arrangement may then continue on to a second heat sink arrangement accordingly.

The electronic device need not be mounted on a PCB within the container, but rather on another component or on a sidewall of the container. The PCB could be a motherboard (that is, it need not necessarily be a daughter board). There may be one or more further PCBs within the container. These further PCBs may be oriented substantially parallel to the floor of the container or substantially perpendicular to the floor of the container. Whilst the surface mounted on the electronic device may be a separate component attached to the electronic device, the skilled person may recognise that the surface mounted on the electronic device may be integrated with or a part of the electronic device. Then, the retaining wall may be attached directly to the electronic device.

Different patterns of projection within the internal volume of the heat sink arrangement may be employed. Linear, non-linear and random patterns of projections can be used. The positioning and shape of baffles can be varied from those shown. Alternative baffle designs to cause liquid coolant to flow within all parts of the internal volume may be conceived, using one, two or more channels for liquid coolant flow within the internal volume. A porous, open-cell metallic foam could be used together with or as an alternative to projections to improve performance. This may be coined to increase density in specific areas of the volume.

In the embodiments described above, a mounting surface part has been used to define the internal volume. However, it may be possible for other components to define the internal volume (in cooperation with the retaining wall). For example, the PCB (that is, the surface on which the electronic device is mounted or is to be mounted) may cooperate with the retaining wall 6 to define the internal volume thereby. In that case, the electronic device 3, optionally the thermal interface material 1 and the heat sink projections part 2 would all be providing within the internal volume thereby.

In general terms, a variant of the most general aspect may be considered, as a heat sink arrangement for an electronic device to be mounted on a surface in a container and in an orientation that is substantially perpendicular to a floor of the container. The heat sink arrangement comprises: a retaining wall configured to enclose the electronic device at least partially, so as to define an internal volume. The retaining wall cooperates (or is configured to cooperate) with a surface on which the electronic device is mounted or is to be mounted (such as a plate or a housing or wall of the container or another surface, which may be planar or otherwise shaped) so that liquid coolant directed into the internal volume accumulates within the internal volume. The surface on which the electronic device is mounted or is to be mounted may be attached to the retaining wall. All other features as described herein, whether optional or otherwise, may be employed with this variant.

Any of the thermally conductive parts of the design disclosed herein may be formed using any thermally conductive material, such as copper or aluminium or combinations thereof. Different plantings or coatings could be used to improve thermal performance such a gold plating. Different material constructions could be used such as laser sintered, honey cone or foams to increase the surface area.

With reference to the heat sink arrangement, the structure may be different from that shown. For example, it may be mounted in a different way. The retaining wall or walls may be provided as a single (integral) wall or multiple walls. The shape and/or size of retaining wall or walls may also be adjusted.

The design of the heat sink may also be varied, with different shapes, sizes and/or implementations, including the use of a single integral component or separate components. It is typical for electronic devices or components to have at least one (or some or all) planar surfaces, especially the surface on or to which the heat sink projection part is mounted, placed or fixed (an attachment surface). However, the aspects of the disclosure can readily be adapted to be used with electronic devices and/or components that do not have planar surfaces. For example, the attachment surface can have bumps, be curved or comprise points (for example, shaped as a triangle or other polygonal shape).

Alternative electronic devices from those shown or described may be used, for example having different shapes, structures or applications. In some embodiments, there may be a different design of (or indeed, no) printed circuit board 45. The layout of circuit boards 45 and/or components may be varied significantly. For instance, the position of RAM 51 may be different from that shown, other components may be provided instead of or in addition to RAM 51 or indeed no other components need be provided. Other details of the heat sink arrangements may be also found with reference to other aspects, as described above.

Further combinations and variations relevant to all aspects will now be discussed. It is possible to couple heat sinks together for improved efficiency. For example, with reference to FIG. 29A, there is depicted a perspective view of a first design with multiple heat sinks coupled to receive liquid coolant in series. Four heat sinks 201 are shown, each of which is generally in accordance with that shown in FIG. 3 (although it will be recognised that any other heat sink design disclosed herein may be substituted). Pipe 202 supplies liquid coolant (from a pump, not shown) and each heat sink receives coolant in series from the pipe, via a respective nozzle 203. The aperture size within each nozzle 203 may be varied, to allow even coolant distribution to each heat sink 201. For example, the nozzle 203 nearer the pump outlet may have a smaller aperture size compared with a nozzle 203 more distant from the pump outlet.

The number of heat sinks 201 and nozzles 203 may be varied accordingly. Referring to FIG. 29B, there is illustrated a perspective view of a second design with multiple heat sinks coupled to receive liquid coolant in series, in which two heat sinks 201 are provided in series.

The liquid coolant may additionally or alternatively be supplied to the heat sinks 201 in parallel. With reference to FIG. 29C, there is depicted a perspective view of a first design with multiple heat sinks coupled to receive liquid coolant in parallel. From pipe 204 branches are provided to: first pipe section 205, which delivers coolant to a heat sink 201 via a nozzle 203; and second pipe section 206, which delivers coolant to a heat sink 201 via a nozzle 203. The aperture size of the nozzle may not need to be varied or not need to be varied as much as for the series-coupled heat sinks described above.

Figure 29E:
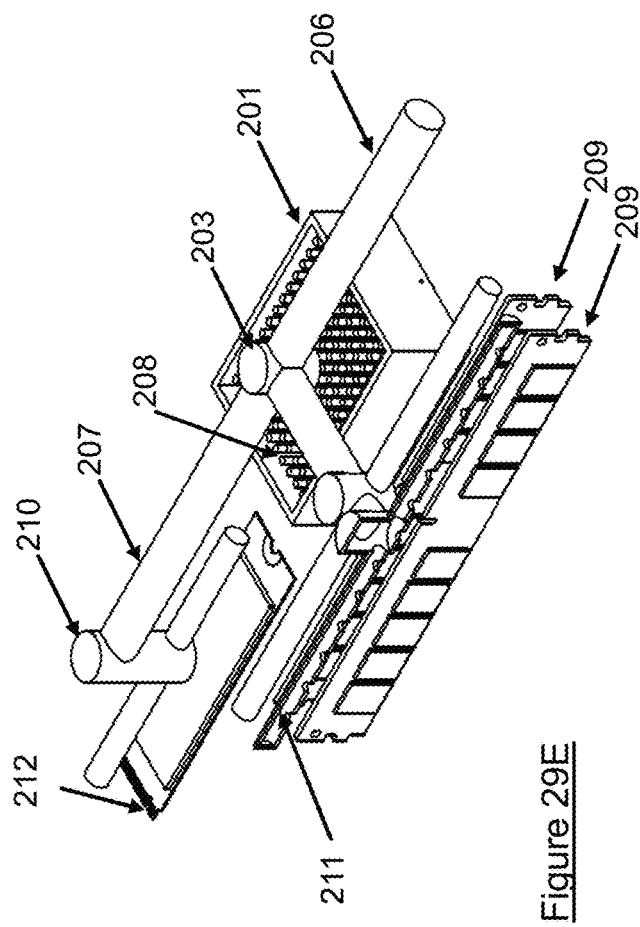
FIG. 29E shows a partial section view of the design of FIG. 29D.
Figure 29D:
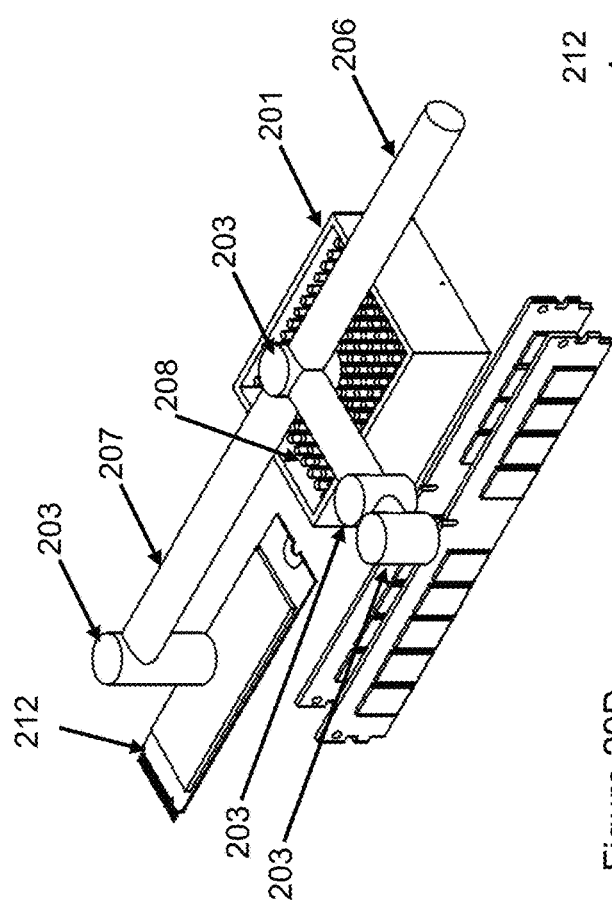
FIG. 29D depicts a perspective view of a second design with multiple heat sinks coupled to receive liquid coolant in parallel.

Referring next to FIG. 29D, there is depicted a perspective view of a second design with multiple heat sinks coupled to receive liquid coolant in parallel. A pipe 206 supplies coolant to a heat sink 201 via a nozzle 203 and from here, branches into: a first pipe section 207, which supplies coolant to a further component 212 via a nozzle 212; a second pipe section 208, which supplies coolant to vertical boards 209 (vertical DIMMs), via respective nozzles 203. With reference to FIG. 29E, there is shown a partial section view of the modification of the design of FIG. 29D, in which the further component 212 receives coolant via a modified nozzle 210 and the vertical boards 209 receive coolant via modified nozzle 211. The modified nozzle 210 and modified nozzle 211 are similar in design to the nozzle of FIGS. 8E and 8F, for instance.

Next, reference is made to FIG. 30A, in which there is illustrated a perspective view of a design showing transfer of coolant from a first type of heat sink to a second type of heat sink. Specifically liquid coolant passes from a first heat sink 201, generally in accordance with that shown in FIG. 3 (and typically for cooling a relatively hotter component), to a second heat sink 230, generally in accordance with FIG. 16 (and cooling a device 235, which generally operates at a relatively cooler temperature). The first heat sink 201 is arranged on a first substrate 221 at a first level and the second heat sink 230 is arranged on a second substrate 222 at a second level, lower that the first level (thereby directing the flow of coolant due to gravity). A pipe 225 is arranged to carry the coolant. An inlet 231 is provided in the heat sink 230 to allow coolant to enter the internal volume of the second heat sink 230. Referring to FIG. 30B, there is shown a section view of the design of FIG. 30A, from which an outlet 223 in the first heat sink 201 can be seen, providing access from the internal volume of the first heat sink 201 to the pipe 225. Pipe 225 could be replaced by a hose, channel or other suitable device for conveying the liquid coolant.

Figure 31B:
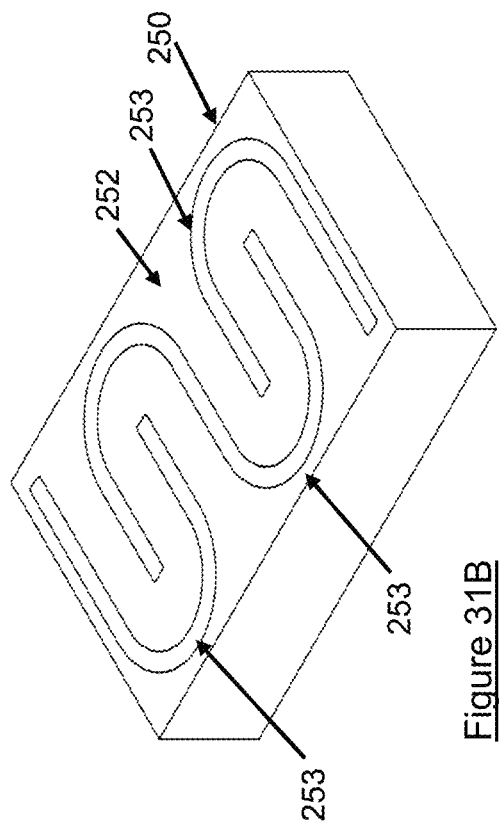
FIG. 31B depicts a bottom perspective view of the heat sink of FIG. 31A.
Figure 31A:
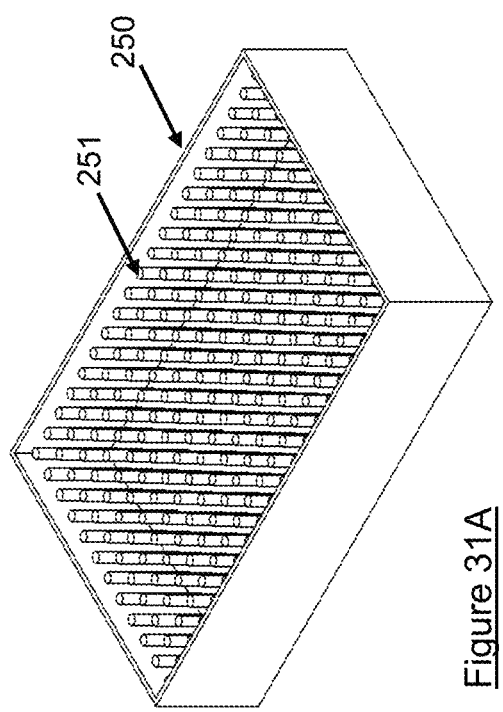
FIG. 31A illustrates a top perspective view of a heat sink with a further adaptation.

In a further adaptation, especially relevant to the heat sink of FIG. 3 and its variations (although applicable to other heat sinks disclosed herein), a heat pipe or equivalent, such as a vapour pipe, vapour chamber or Peltier element, may be provided to facilitate transfer of heat. Referring to FIG. 31A, there is illustrated a top perspective view of a heat sink with such a further adaptation. The heat sink is based on that shown in FIG. 3 and has a retaining wall 250 and projections 251. The heat sink also has a base 252, not visible in this drawing, but visible with reference to FIG. 31B, which depicts a bottom perspective view of the heat sink of FIG. 31A.

Figure 31C:
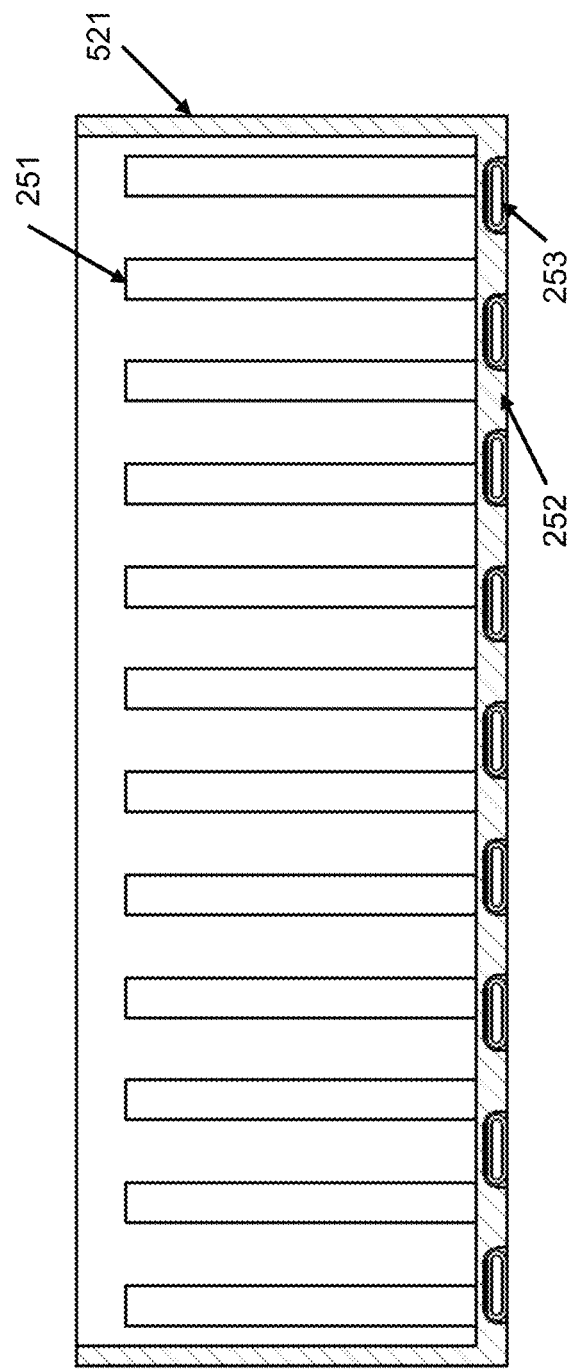
FIG. 31C shows a side cross-section view of the heat sink of FIG. 31A.

Provided on or in the base 252 are heat pipes 253. These have a similar layout to those provided on existing air cooled heat sinks. The heat pipes 252 may enable better transfer of heat across the heat sink and therefore may spread the heat better. This may enable more efficient use of the heat sink surface area or enable the use of bigger heat sinks with more surface area than would otherwise have been possible. The features can also be seen more clear with reference to FIG. 31C, in which there is shown a side cross-section view of the heat sink of FIG. 31A.

Figures 31D, 31E:
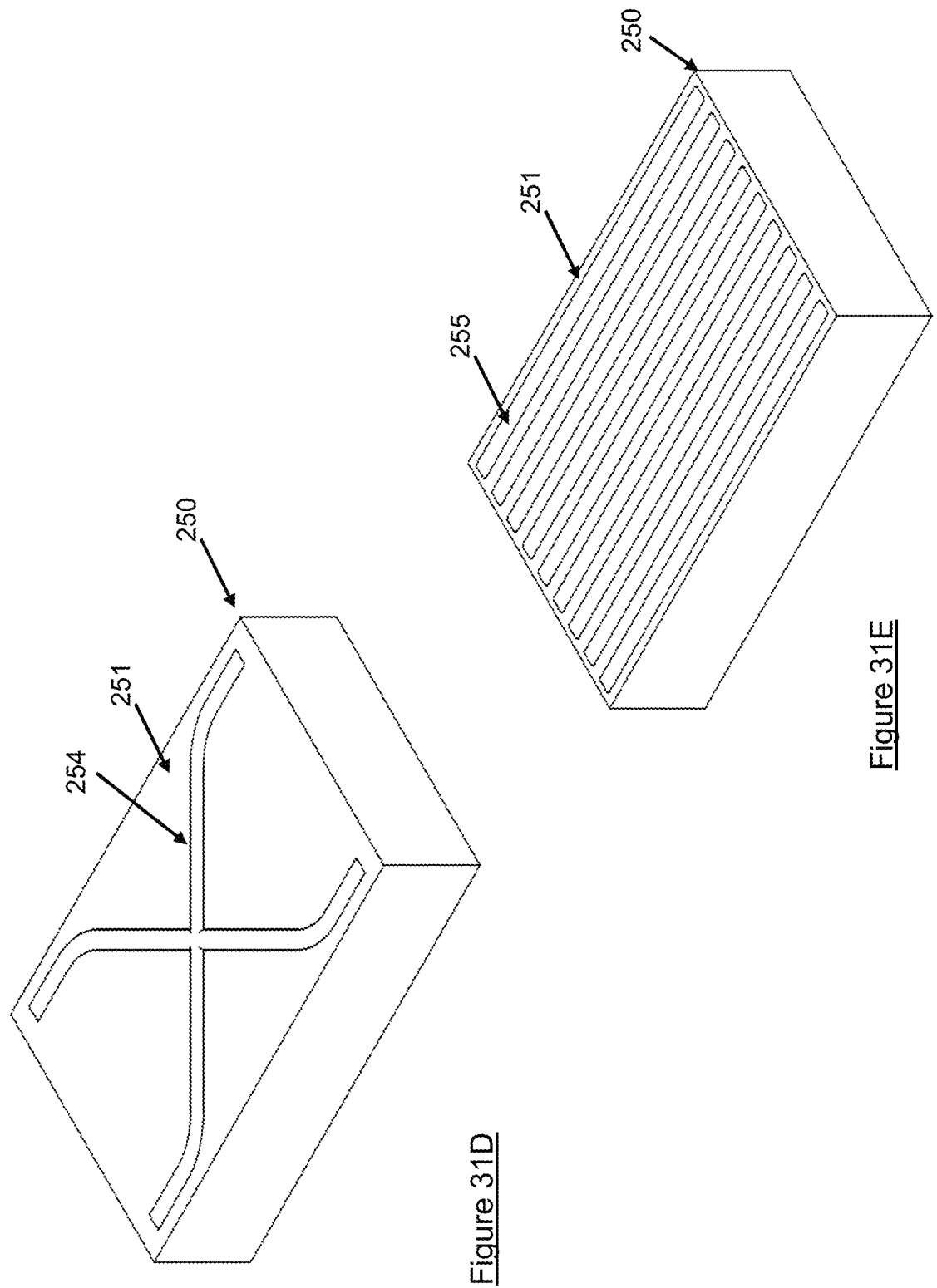
FIG. 31D depicts a bottom perspective view of a first variant of the heat sink of FIG. 31A.
FIG. 31E depicts a bottom perspective view of a second variant of the heat sink of FIG. 31A.

The layout of the heat pipes may be varied significantly. As an example, reference is made to FIG. 31D, in which there is depicted a bottom perspective view of a first variant. The retaining wall 250 and base 251 are visible, with heat pipe 254 in a 'X' shape. Referring now to FIG. 31E, there is depicted a bottom perspective view of a second variant, with heat pipes 255 formed as parallel lines.

The panel nozzle arrangement shown, for example, with reference to FIGS. 23A to 23E may be applied to other heat sink arrangements. An example is shown with reference to FIG. 32A, in which there is illustrated a top perspective view of a heat sink with such a variant nozzle arrangement. The heat sink 301 is generally in accordance with FIG. 3 although it may be replaced by any such variations or alternative heat sinks disclosed herein. A pipe 302 provides coolant to a panel nozzle arrangement 303, which is configured to direct coolant to the internal volume of the heat sink 301.

Referring now to FIG. 32B, there is shown a top sectional view of the heat sink of FIG. 32A, in which more details of the panel nozzle arrangement 303 can be seen. Coolant from the pipe 302 is directed along a plurality of channels 304. In the base of each channel 304 are formed nozzle holes 305, which cause coolant to pass out of the nozzle arrangement 303 and into the heat sink 301. Reference is also made to FIG. 32C, in which there is shown a side sectional view of the heat sink of FIG. 32A, where nozzle holes 305 can be seen. One or more of the size, position and pitch of each nozzle hole 305 may be varied. Additionally or alternatively, one or more of the number, position and diameter of the channels 304 can change. Variations of these parameters for the channel 304 and/or nozzle holes 305 across a single panel 303 are also possible, including changing the size of the channel 304 by tapering, for example. These may allow control and/or balancing of coolant provision, for instance to allow even coolant distribution. It will be recognised that a wide variety of different ways of providing coolant to the heat sink, including different types of nozzle design may be employed.

The introduction of coolant from a base of a heat sink has been discussed above, for example with reference to FIGS. 8A, 8B and 32F to 32I. A further variant on such embodiments is now detailed, with reference to FIG. 33A, in which there is illustrated a perspective view of a heat sink with coolant introduction via its base. The heat sink has a retaining wall 320 (which in this depiction is in general accordance with the design shown in FIG. 3, although this could be varied in line with any alternative shown or discussed herein) with a base 321. Holes 322 are formed in the base and coolant is provided into the internal volume formed by the retaining wall 320 and base 321. The coolant arrives via pipe 325. Although no projections (pins and/or fins) are shown, this is for reasons of clarity only and such projections may be provided, for instance as disclosed in respect of other embodiments herein.

Referring to FIG. 33B, there is shown a side sectional view of the heat sink of FIG. 33A, in which the holes 323 are visible. Coolant arriving from the pipe 325 is provided to a channel 322 formed between the base 321 and a lower base 326. The coolant then passes through the holes 323 and into the internal volume. One or more of the size, position and pitch of each hole 323 may be varied, within a single heat sink and/or between multiple heat sinks. Additionally or alternatively, the size and/or shape of the channel 323 can change. Variations of parameters in respect of the holes 322 and/or channel 323 across a single heat sink may allow control and/or balancing of coolant provision, for instance to allow even coolant distribution. This may include changing the size of the channel 304 by tapering, for example.

A benefit of the design shown with reference to FIGS. 33A and 33B is that the coolant is delivered at the base 321. For horizontal heat sinks (for instance, as shown with reference to FIG. 3), the base is typically the hottest part of the heat sink in operation. Such systems may be especially useful when the depth of the heat sink internal volume is large, in which a high cooling capacity may be possible, for instance.

Figure 34B:
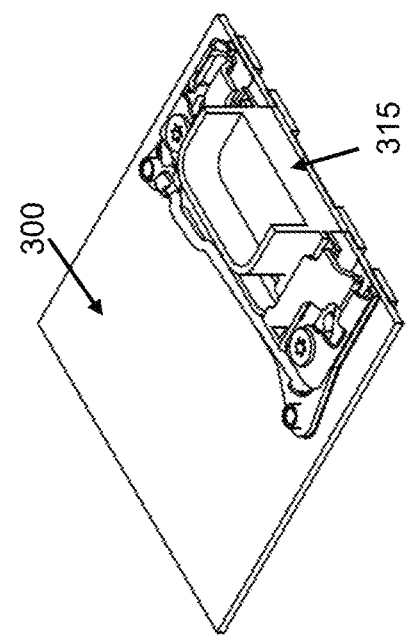
FIG. 34B depicts a side sectional view of the heat sink of FIG. 34A.
Figure 34A:
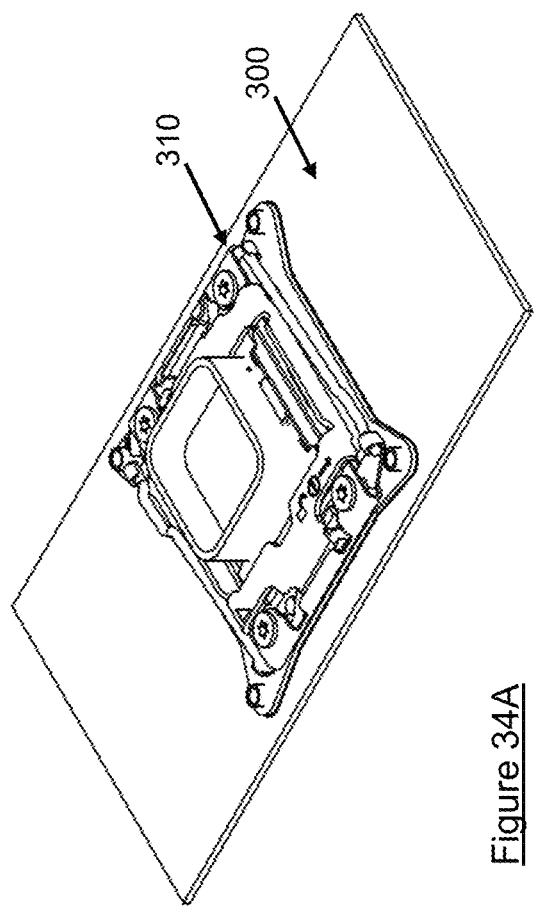
FIG. 34A shows a perspective view of a first design of a heat-generating device integrated with a heat sink.
Figure 34C:
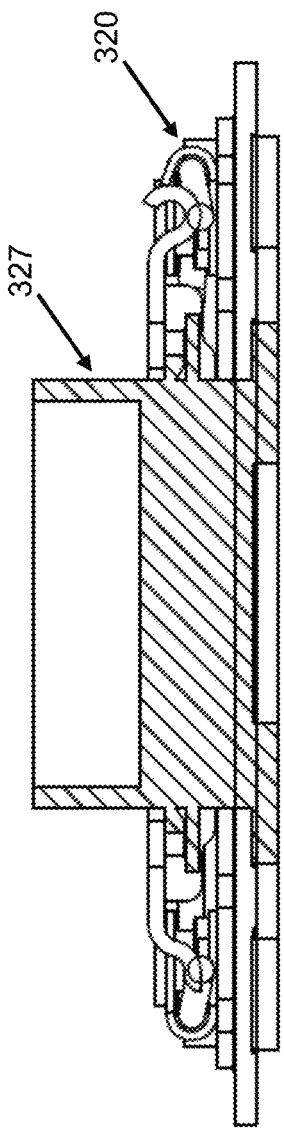
FIG. 34C illustrates a side cross-section view of the heat sink of FIG. 34A.

Integration of the heat sink with the component may be a further benefit. Referring to FIG. 34A, there is shown a perspective view of a first design of a heat-generating device integrated with a heat sink and referring to FIG. 34B, there is depicted a side sectional view of the heat sink of FIG. 34A. The component and heat sink arrangement 310 is mounted on a substrate 300 (for example, a circuit board). The heat sink and component are in an integrated form 315, such that the retaining wall is formed integrally with the component housing. In this design, the component is a processor, but this design may be suitable for any type of heat-generating component or device. With reference to FIG. 34C, there is illustrated a side cross-section view of the heat sink of FIG. 34A, in which the integration can be more clearly seen.

Figure 34E:
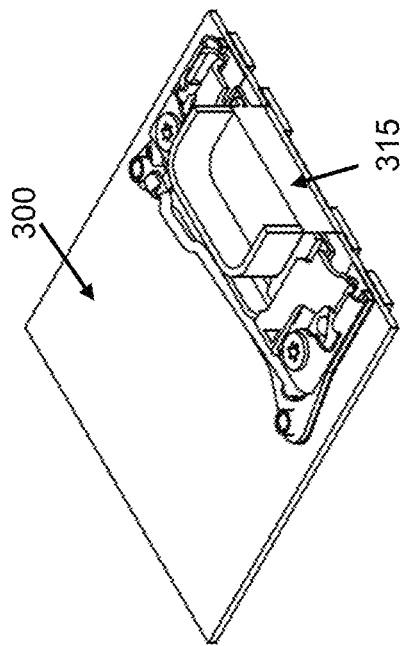
FIG. 34E depicts a side sectional view of the heat sink of FIG. 34D.
Figure 34D:
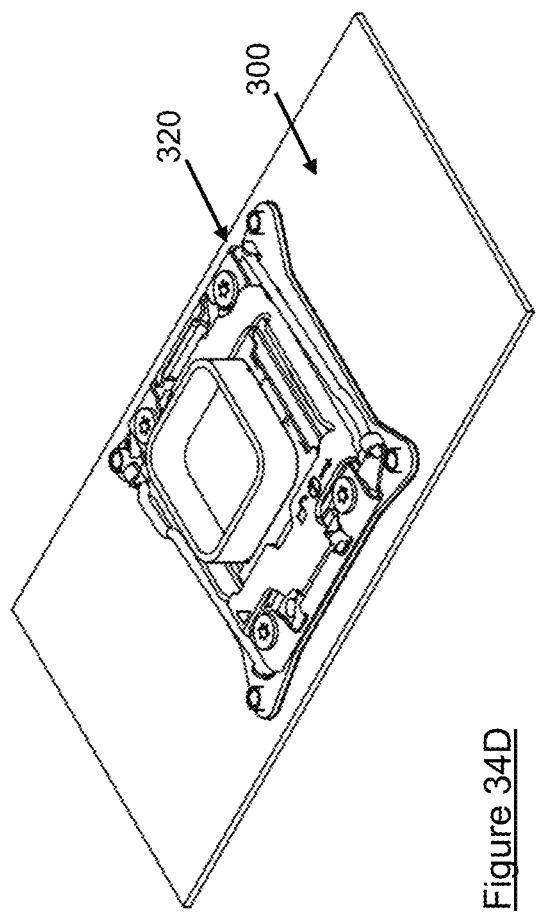
FIG. 34D shows a perspective view of a heat-generating device with a separable heat sink.
Figure 34F:
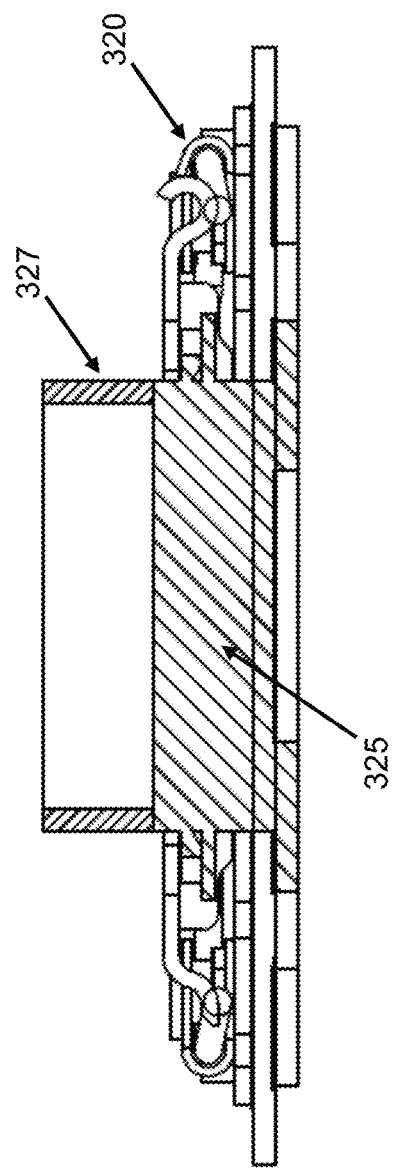
FIG. 34F illustrates a side cross-section view of the heat sink of FIG. 34D.
Figure 34H:
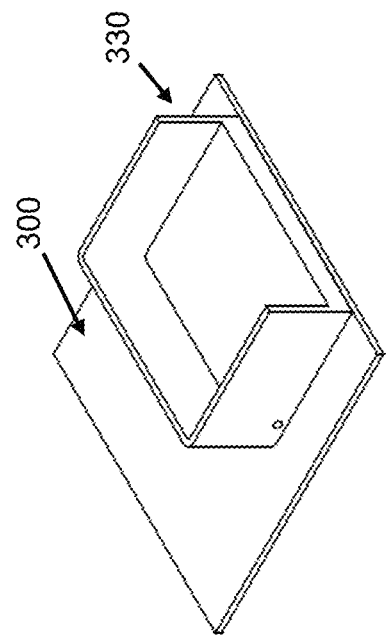
FIG. 34H depicts a side sectional view of the heat sink of FIG. 34E.
Figure 34G:
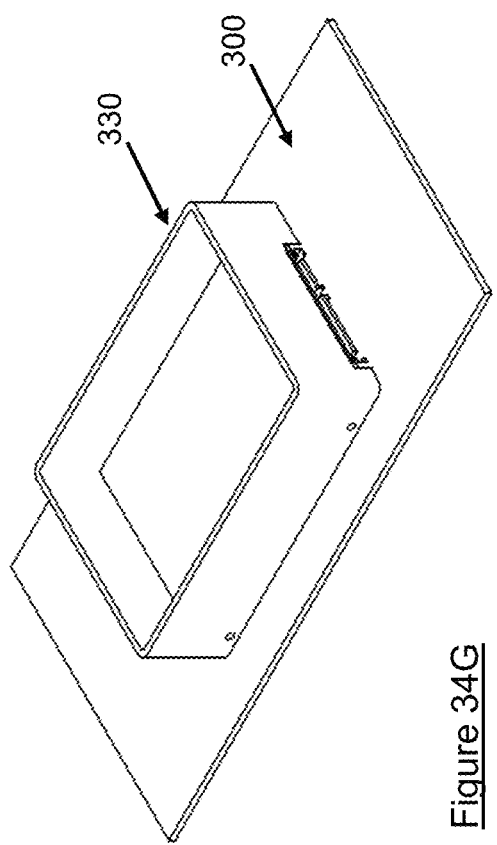
FIG. 34G shows a perspective view of a second design of a heat-generating device integrated with a heat sink.

Referring next to FIG. 34D, there is shown a perspective view of a heat-generating device with a separable heat sink and referring to FIG. 34E, there is depicted a side sectional view of the heat sink of FIG. 34D. In this design, the heat sink and component arrangement 320 has a separable form, such that the retaining wall 327 is attached (for example by glue or similar) with the component housing 325. In this design, the component is a processor, but this design may be suitable for any type of heat-generating component or device. With reference to FIG. 34F, there is illustrated a side cross-section view of the heat sink of FIG. 34D, in which the separation between the retaining wall 327 and the component housing 325 can be more clearly seen. With reference to FIG. 34G, there is shown a perspective view of a second design of a heat-generating device integrated with a heat sink. The integrated component and heat sink 330 is mounted on a substrate. Referring to FIG. 34H, there is depicted a side sectional view of the heat sink of FIG. 34G. This design is in the form of a solid state drive (SSD) memory.

Figure 34I:
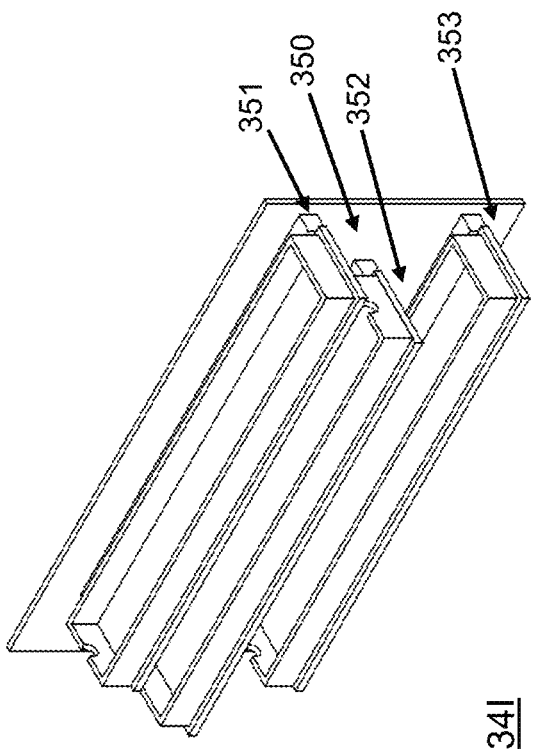
FIG. 34I shows a perspective view of multiple volume vertical heat sink design.

Referring to FIG. 34I, there is shown a perspective view of multiple volume vertical heat sink design. A vertical substrate 350 (which may be a side of the cooling module housing or a vertically mounted circuit board, for example) is provided with multiple heat sinks 351, 352, 353 mounted thereupon. The first heat sink 351 is at a top and the second heat sink 352 is mounted below and slightly laterally offset from the first heat sink 351, so that coolant overflows the first heat sink 351 and is directed to the second heat sink 352. Similarly, the third heat sink 353 is mounted below and slightly laterally offset from the second heat sink 352, so that coolant overflows the second heat sink 352 and is directed to the third heat sink 353. This may be termed a cascade arrangement. Slots (not shown) may be provided in the substrate 350 to direct the overflow from each of the upper heat sinks to the correct place in the respective lower heat sink.

A single heat sink can be used to cool multiple components or devices. A number of examples will be discussed, for the purposes of explaining this. In all these examples, the heat sink is generally in accordance with FIG. 3, but the skilled person will recognise that it may be replaced by any variations or alternative heat sinks disclosed herein.

Referring next to FIG. 35A, there is illustrated a perspective view of a first design of a heat sink arrangement for cooling multiple devices. A heat sink 401 is mounted on a substrate 400. With reference to FIG. 35B, there is depicted an exploded view of the design of FIG. 35A. Beneath the single heat sink 401 are provided a large component 402 (such as a processor) and multiple smaller components 403, all of which are cooled by the single heat sink 401. Such an arrangement is typical of a (GPU), for example.

The arrangement shown in FIGS. 35A and 35B may be scaled up. Referring to FIG. 35C, there is illustrated a perspective view of a second design of a heat sink arrangement for cooling multiple devices. A heat sink 410 is mounted on a substrate 400. With reference to FIG. 35D, there is depicted an exploded view of the design of FIG. 35C. Beneath the single heat sink 410 are provided a multiple large components 412 (each of which may be a processor) and multiple smaller components 413, all of which are cooled by the single heat sink 410.

FIG. 35E illustrates a perspective, exploded view of a third design of a heat sink arrangement for cooling multiple devices. This is similar to the second design (shown in FIGS. 35C and 35D). Beneath a single heat sink 410 are provided a multiple large components 412, each of which is typically a processor. Such an arrangement is typical of an exascale computer, in which processors may be mounted in batches of four to improve performance.

All of the features disclosed herein may be combined in any combination, except combinations where at least some of such features and/or steps are mutually exclusive. In particular, the preferred features of each aspect of the disclosure are generally applicable to all aspects of the disclosure and the features of all of the aspects may be used in any combination. Likewise, features described in non-essential combinations may be used separately (not in combination).

A method of manufacturing and/or operating any of the devices disclosed herein is also provided. The method may comprise steps of providing each of features disclosed and/or configuring the respective feature for its stated function.

The invention claimed is:

1. A liquid submersion cooled electronic device, comprising:
a device housing defining an interior space and a maximum dielectric cooling liquid level;
heat generating electronic components disposed within the interior space of the device housing;
a dielectric cooling liquid in the interior space, the dielectric cooling liquid submerging and in direct contact with the heat generating electronic components;
a dielectric cooling liquid inlet in the device housing through which dielectric cooling liquid enters the interior space; and
a dielectric cooling liquid outlet weir in the device housing from which dielectric cooling liquid exits the interior space, the dielectric cooling liquid outlet weir is disposed at the maximum dielectric cooling liquid level of the device housing;
wherein the cooling liquid outlet weir establishes the level of the dielectric cooling liquid within the interior space and establishes a volumetric rate of flow of the dielectric cooling liquid within the interior space that is needed for the cooling of the heat generating electronic components.

2. The liquid submersion cooled electronic device of claim 1, wherein the device housing includes a first side and a second side opposite the first side; the dielectric cooling liquid inlet is in the first side and the dielectric cooling liquid outlet weir is in the second side.

3. The liquid submersion cooled electronic device of claim 1, wherein the dielectric cooling liquid outlet weir is located on the device housing at a vertical level that is higher than the location of the dielectric cooling liquid inlet.

4. The liquid submersion cooled electronic device of claim 1, wherein the heat generating electronic components include at least one of a power supply, a processor, and a switch.

* * * * *